US012593539B2

(12) United States Patent
Park et al.

(10) Patent No.: US 12,593,539 B2
(45) Date of Patent: Mar. 31, 2026

(54) DISPLAY DEVICE HAVING MULTI-WIDTH CONNECTION ELECTRODE

(71) Applicant: Samsung Display Co., LTD., Yongin-si (KR)

(72) Inventors: Do Yeong Park, Hwaseong-si (KR); Kyung Bae Kim, Seongnam-si (KR); Won Jun Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 597 days.

(21) Appl. No.: 17/978,882

(22) Filed: Nov. 1, 2022

(65) Prior Publication Data

US 2023/0261142 A1    Aug. 17, 2023

(30) Foreign Application Priority Data

Feb. 11, 2022    (KR) ........................ 10-2022-0018223

(51) Int. Cl.
H10H 20/831    (2025.01)
H01L 25/16    (2023.01)
(52) U.S. Cl.
CPC ......... H10H 20/831 (2025.01); H01L 25/167 (2013.01)
(58) Field of Classification Search
CPC .. H10H 20/831; H10H 20/857; H10H 20/852; H10H 29/142; H01L 25/167; H01L 25/0753; G09F 9/33; H10D 86/451; H10K 59/122
USPC ........................................................ 257/91
See application file for complete search history.

(56) References Cited

U.S. PATENT DOCUMENTS

| | | | | |
|---|---|---|---|---|
| 9,054,060 B2 * | 6/2015 | Kang | ................... | H10K 59/131 |
| 9,997,576 B2 * | 6/2018 | Jinbo | ................... | H10K 50/844 |
| 11,387,223 B2 | 7/2022 | Woo et al. | | |
| 12,015,047 B2 | 6/2024 | Park et al. | | |
| 12,374,672 B2 | 7/2025 | Woo et al. | | |
| 2016/0195788 A1 * | 7/2016 | Bae | ..................... | G02F 1/13624 |
| | | | | 257/72 |
| 2017/0358563 A1 * | 12/2017 | Cho | ..................... | H01L 25/167 |

(Continued)

FOREIGN PATENT DOCUMENTS

| | | |
|---|---|---|
| KR | 10-2017-0141305 A | 12/2017 |
| KR | 10-2018-0009014 A | 1/2018 |

(Continued)

*Primary Examiner* — Duy T Nguyen
(74) *Attorney, Agent, or Firm* — Womble Bond Dickinson (US) LLP

(57)    ABSTRACT

A display device includes: a first insulating layer on electrodes; a plurality of light emitting elements on the electrodes in an emission area; a second insulating layer on the first insulating layer and the light emitting elements and having a plurality of openings partially overlapping the electrodes and the light emitting elements; and a plurality of connection electrodes on at least some of the electrodes, contacting the light emitting elements, and partially overlapping the openings. A first opening has a first side portion and a second side portion opposite to the first side portion with a greater width than the first side portion, and a first connection electrode overlapping the first opening has a first portion overlapping the first opening and a second portion having a greater width than the first portion and that does not partially overlap the first opening.

14 Claims, 34 Drawing Sheets

(56)                          References Cited

U.S. PATENT DOCUMENTS

| 2018/0175106 | A1* | 6/2018 | Kim | ......................... | H10H 20/84 |
| 2019/0006626 | A1* | 1/2019 | Kim | ..................... | H10K 59/873 |
| 2020/0402453 | A1* | 12/2020 | Cho | ...................... | G06F 3/0421 |
| 2021/0257349 | A1* | 8/2021 | Yang | ................... | H01L 25/0753 |
| 2022/0005975 | A1* | 1/2022 | Yang | ................... | H10H 20/831 |
| 2022/0115470 | A1* | 4/2022 | Kim | ........................ | H10K 71/00 |
| 2022/0406759 | A1* | 12/2022 | Kim | ................... | H10H 20/8312 |
| 2023/0207610 | A1 | 6/2023 | Park et al. | | |

FOREIGN PATENT DOCUMENTS

| KR | 10-2018-0011404 | A | 2/2018 |
| KR | 10-2021-0098313 | A | 8/2021 |
| KR | 10-2021-0102560 | A | 8/2021 |
| KR | 10-2022-0014390 | A | 2/2022 |
| KR | 10-2023-0102036 | A | 7/2023 |

* cited by examiner

RME: RME1, RME2, RME3, RME4
CNE: CNE1, CNE2, CNE3, CNE4, CNE5
ED: ED1, ED2, ED3, ED4

RME: RME1, RME2, RME3, RME4
ED: ED1, ED2, ED3, ED4

RME: RME1, RME2, RME3, RME4
ED: ED1, ED2, ED3, ED4

DR1

DR2

RME: RME1, RME2, RME3, RME4
ED: ED1, ED2, ED3, ED4

RME: RME1, RME2, RME3, RME4
ED: ED1, ED2, ED3, ED4

RME: RME1, RME2, RME3, RME4
ED: ED1, ED2, ED3, ED4

RME: RME1, RME2, RME3, RME4
CNE: CNE1, CNE2, CNE3, CNE4
ED: ED1, ED2

RME: RME1, RME2, RME3, RME4
CNE: CNE1, CNE2, CNE3, CNE4

RME: RME1, RME2, RME3, RME4
CNE: CNE1, CNE2, CNE3, CNE4, CNE5
ED: ED1, ED2, ED3, ED4

RME: RME1, RME2, RME3, RME4
CNE: CNE1, CNE2, CNE3, CNE4, CNE5
ED: ED1, ED2, ED3, ED4

RME: RME1, RME2
RME2: RM_S, RM_B

DR1

DR2

RME: RME1, RME2
RME2: RM_S, RM_B

RME: RME1, RME2

RME: RME1, RME2
RME2: RM_S, RM_B

CNE: CNE1, CNE2, CNE3
ED: ED1, ED2

RME: RME1, RME2
CNE: CNE1, CNE2, CNE3
ED: ED1, ED2

RME: RME1, RME2
CNE: CNE1, CNE2, CNE3
ED: ED1, ED2

RME: RME1, RME2
CNE: CNE1, CNE2, CNE3
ED: ED1, ED2

RME: RME1, RME2
CNE: CNE1, CNE2, CNE3
ED: ED1, ED2

DISPLAY DEVICE HAVING MULTI-WIDTH CONNECTION ELECTRODE

CROSS-REFERENCE TO RELATED APPLICATION

This application claims priority to and the benefit of Korean Patent Application No. 10-2022-0018223, filed on Feb. 11, 2022, in the Korean Intellectual Property Office, the entire contents of which are incorporated herein by reference.

BACKGROUND

1. Field

Aspects of embodiments of the disclosure relate to a display device.

2. Description of the Related Art

The importance of display devices has increased with the development of multimedia. Accordingly, various types of display devices, such as an organic light emitting diode (OLED) display and a liquid crystal display (LCD) have been developed.

Some display devices are self-light emitting display devices including a light emitting element for displaying an image. The self-light emitting display device includes a light emitting element, and the self-light emitting display device includes an organic light emitting display device using an organic material as a light emitting material, an inorganic light emitting display device using an inorganic material as a light emitting material, or the like.

SUMMARY

Embodiments of the disclosure provide a display device exhibiting reduced or no disconnection defects of light emitting elements and connection electrodes connecting the light emitting elements and electrodes to each other.

However, aspects and features of the disclosure are not limited to those set forth herein. The above and other aspects and features of the disclosure will become more apparent to one of ordinary skill in the art to which the disclosure pertains by referencing the detailed description of the disclosure given below.

According to an embodiment of the disclosure, a display device includes: a plurality of electrodes extending in a first direction and spaced apart from each other in a second direction; a first insulating layer on the electrodes; a plurality of light emitting elements on the electrodes in an emission area; a bank layer extending around a periphery of the emission area; a second insulating layer on the first insulating layer and the light emitting elements and having a plurality of openings partially overlapping the electrodes and the light emitting elements in the emission area; and a plurality of connection electrodes on at least some of the electrodes, contacting the light emitting elements, and partially overlapping the openings. A first opening from among the openings extends in the first direction and has a first side portion in the first direction and a second side portion on an opposite side to the first side portion, the second side portion having a greater width than the first side portion, and a first connection electrode overlapping the first opening from among the connection electrodes has a first portion overlapping the first opening and a second portion having a greater width than the first portion and that does not partially overlap the first opening.

The second portion of the first connection electrode may partially overlap the first side portion of the first opening.

One sides of the first side portion and the second side portion of the first opening in the second direction may be parallel to each other, and the other sides of the first side portion and the second side portion opposite to the one sides may not be parallel to each other.

The first side portion of the first opening may be nearer to the bank layer than the second side portion is, and the second portion of the first connection electrode may be partially on the bank layer.

A second opening from among the openings extends in the first direction and has a first side portion in the first direction and a second side portion on an opposite side to the first side portion that may have a smaller width than the first side portion, and a second connection electrode overlapping the second opening from among the connection electrodes has a first portion overlapping the second opening and a second portion that may have a greater width than the first portion and may not partially overlap the second opening.

The first side portion of the second opening may be nearer to the bank layer than the second side portion is, and the second portion of the second connection electrode may not be partially on the bank layer.

The display device may further include a third insulating layer on the second insulating layer and some of the connection electrodes, and the third insulating layer may have the first opening and may extend over the second opening.

A third opening from among the openings may overlap the first electrode and the light emitting elements and may be spaced apart from the first opening in the second direction, a fourth opening from among the openings may overlap the first electrode and may be spaced apart from the first opening in the second direction, and the fourth opening may not overlap the light emitting elements.

The electrodes may include a first electrode, a second electrode spaced apart from the first electrode in the second direction, a third electrode between the first electrode and the second electrode, and a fourth electrode spaced apart from the second electrode in the second direction. The first opening may partially overlap each of the second electrode and the third electrode.

The light emitting elements may include first light emitting elements on the first electrode and the third electrode and second light emitting elements on the second electrode and the fourth electrode, and the first opening may overlap one end of the second light emitting elements.

The first connection electrode may contact the second light emitting elements.

A second connection electrode from among the connection electrodes may be on the second electrode, a third connection electrode from among the connection electrodes may be on the third electrode, a fourth connection electrode from among the connection electrodes may be on the fourth electrode, and a fifth connection electrode from among the connection electrodes may extend across the third electrode and the fourth electrode. The second connection electrode may have the first portion and the second portion and may overlap the first opening.

The first connection electrode may have a main part contacting the light emitting elements, a first bypass part spaced apart from the main part in the second direction, and a first bridge part connecting the main part and the first bypass part to each other.

Each of the first bypass part and the first bridge part may be on the bank layer.

According to another embodiment of the disclosure, a display device includes: a first electrode extending in a first direction; a plurality of second electrodes spaced apart from each other in a second direction with the first electrode therebetween; a plurality of light emitting elements in an emission area and on the first electrode and any one of the second electrodes; a bank layer extending around a periphery of the emission area and partially overlapping the first electrode and the second electrodes; and a first connection electrode on the first electrode, a second connection electrode on any one of the second electrodes, and a third connection electrode comprising a first extension part on another of the second electrodes, a second extension part on the first electrode and spaced apart from the first connection electrode, and a first connection part connecting the first extension part and the second extension part to each other. A portion of each of the first connection electrode, the second connection electrode, and the third connection electrode is on the bank layer, and each of the first connection electrode and the second extension part of the third connection electrode has a first portion and a second portion having a greater width than the first portion.

A portion of the second portion of the first connection electrode may be on the bank layer at an upper side of the emission area in a plan view, and a portion of the second portion of the second extension part of the third connection electrode may be on the bank layer at a lower side of the emission area in the plan view.

The first connection electrode and the second extension part of the third connection electrode may extend in the first direction and may have a shape in which sides thereof facing each other are bent at the second portion.

The first connection electrode and the second extension part of the third connection electrode may have widths that gradually vary along the first direction.

The second connection electrode may include a first bypass part spaced apart from a main part contacting the light emitting elements in the second direction and a first bridge part connecting the main part and the first bypass part to each other, the third connection electrode may include: a second bypass part spaced apart from the first extension part in the second direction and a second bridge part connecting the first extension part and the second bypass part to each other, and each of the first bypass part and the second bypass part may be on the bank layer.

The light emitting elements may include: first light emitting elements on the first electrode and the one of the second electrodes and contacting the first connection electrode and the first extension part of the third connection electrode; and second light emitting elements on the first electrode and another one of the second electrodes and contacting the second connection electrode and the second extension part of the third connection electrode.

In a display device according to an embodiment, connection electrodes and openings in one or more insulating layers between the connection electrodes may have a shape in which widths thereof are varied (or changed) according to their positions. Accordingly, in the display device, disconnection defects of light emitting elements and the connection electrodes connecting the light emitting elements and electrodes to each other may be reduced or prevented and corresponding dark spot defects of pixels may be reduced or prevented.

The aspects and features of the disclosure are not limited to the aforementioned aspects and features, and various other aspects and features are included in the specification or will be understood by those of ordinary skill in the art.

BRIEF DESCRIPTION OF THE DRAWINGS

The above and other aspects and features of the disclosure will become more apparent by describing, in detail, embodiments thereof with reference to the attached drawings, in which.

DETAILED DESCRIPTION

Figure 1:
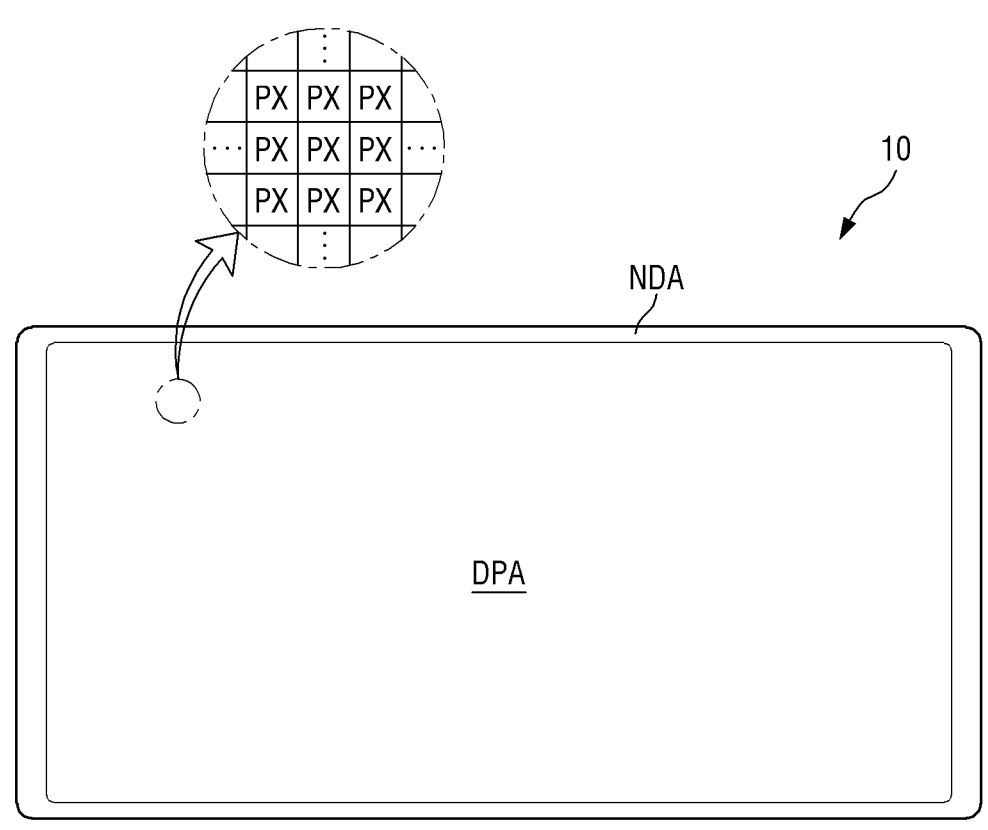
FIG. 1 is a schematic plan view of a display device according to an embodiment.
Figure 1:
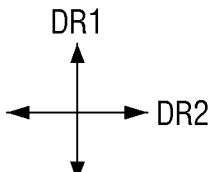

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete and will fully convey the scope of the disclosure to those skilled in the art.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments. In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the disclosure relates to "one or more embodiments of the disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the disclosure and is not intended to be limiting of the disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Hereinafter, embodiments of the disclosure will be described with reference to the accompanying drawings.

FIG. 1 is a schematic plan view of a display device according to an embodiment.

Referring to FIG. 1, a display device 10 is configured to display a moving image and/or a still image. The display device 10 may refer to all (or any) electronic devices that provide (or include) display screens. For example, the display device 10 may represent televisions, laptop computers, monitors, billboards, an Internet of Things (IoT) device, mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras, camcorders, and the like that provide display screens.

The display device 10 includes a display panel providing the display screen. Examples of the display panel may include an inorganic light emitting diode display panel, an organic light emitting display panel, a quantum dot light emitting display panel, a plasma display panel, a field emission display panel, and the like. Hereinafter, the display device 10 is described as an embodiment including an inorganic light emitting diode display panel, but the disclosure is not limited thereto and the same technical spirit may be applied to other suitable display panels.

A shape of the display device 10 may be variously modified. For example, the display device 10 may have a rectangular shape with a width greater than a length, a rectangular shape with a length greater than a width, a square shape, a rectangular shape with rounded corners (e.g., vertices), other polygonal shapes, or a circular shape. A shape of a display area DPA of the display device 10 may be similar to an overall shape of the display device 10. In FIG. 1, the display device 10 has a rectangular shape with a greater length in a second direction DR2 as an example.

The display device 10 may have the display area DPA and non-display areas NDA. The display area DPA is an area in which a screen (or image) may be displayed, and the non-display area NDA is an area in which the screen (or image) is not displayed. The display area DPA may also be referred to as an active area, and the non-display area NDA may also be referred to as a non-active area. The display area DPA may occupy substantially the center of the display device 10.

The display area DPA may include a plurality of pixels PX. The plurality of pixels PX may be arranged in a matrix arrangement. Each of the pixels PX may have a rectangular shape or a square shape in a plan view, but they are not limited thereto and may have a rhombic shape of which each side is inclined with respect to one direction. The respective pixels PX may be alternately arranged in a stripe type or an island type. In addition, each of the pixels PX may include one or more light emitting elements emitting light of a specific wavelength band to display a specific color.

The non-display areas NDA may be disposed around the display area DPA.

The non-display areas NDA may entirely or partially surround the display area DPA in a plan view (e.g., the non-display areas NDA may entirely or partially extend around a periphery of the display area DPA). The display area DPA may have a rectangular shape, and the non-display areas NDA may be disposed adjacent to the four sides of the rectangular display area DPA. The non-display areas NDA may form a bezel of the display device 10. Lines or circuit drivers included in the display device 10 may be disposed, or external devices may be mounted, in each of the non-display areas NDA.

Figure 2:
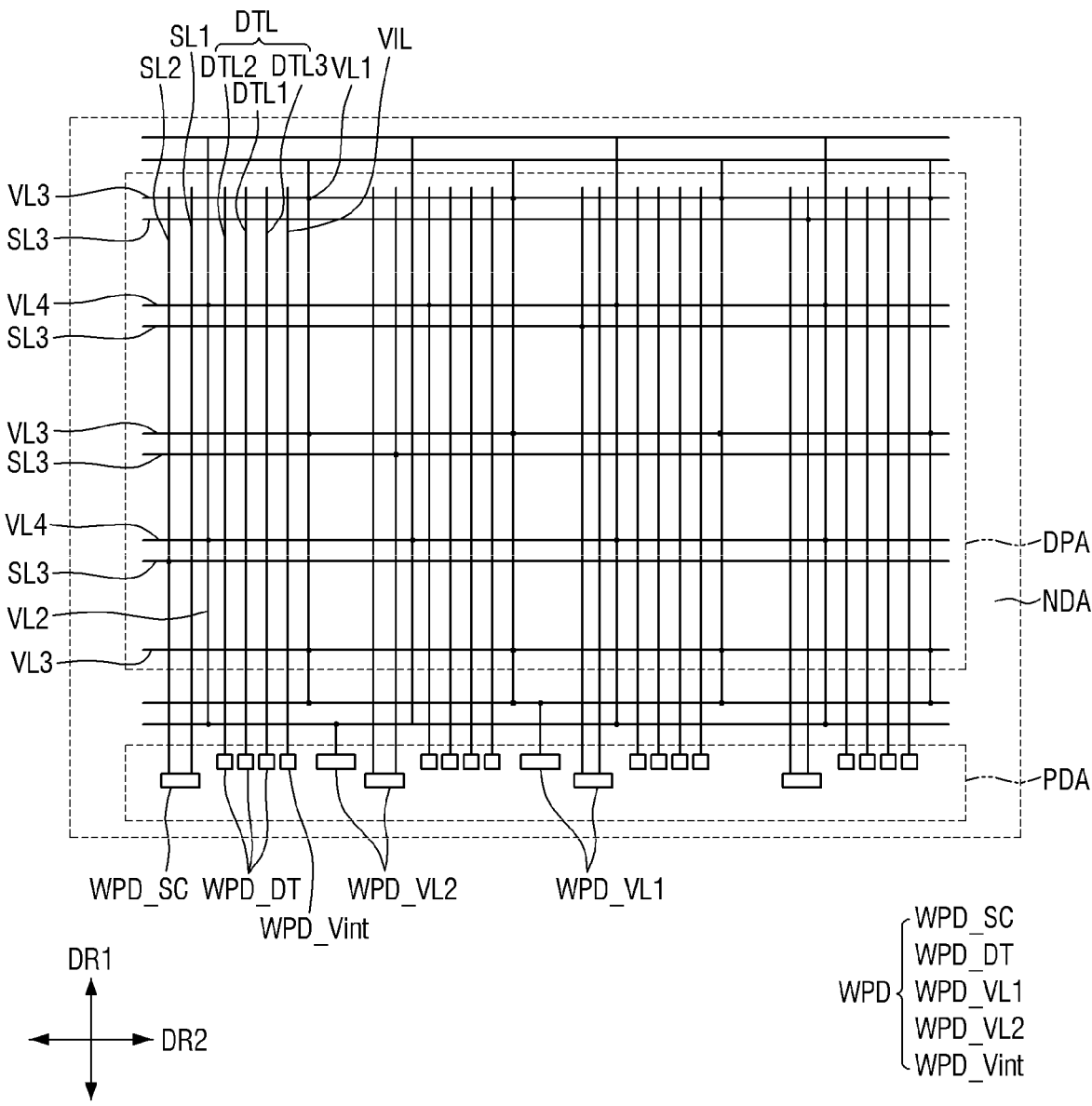
FIG. 2 is a plan view illustrating a layout of a plurality of lines included in the display device according to an embodiment.

FIG. 2 is a plan view illustrating a layout of a plurality of lines included in the display device according to an embodiment.

Referring to FIG. 2, the display device 10 may include a plurality of lines. The display device 10 may include a plurality of scan lines SL (e.g., SL1, SL2, and SL3), a plurality of data lines DTL (e.g., DTL1, DTL2, and DTL3), initialization voltage lines VIL, and a plurality of voltage lines VL (e.g., VL1, VL2, VL3, and VL4). Other lines may be further disposed in the display device 10. The plurality of lines may include lines formed of a first conductive layer and extending in a first direction DR1 and lines formed of a third conductive layer and extending in the second direction DR2. However, extension directions of the respective lines are not limited thereto.

First scan lines SL1 and second scan lines SL2 may be disposed to extend in the first direction DR1. The first scan line SL1 and the second scan line SL2 may be disposed to be adjacent to each other and may be disposed to be spaced apart from the other first scan lines SL1 and second scan lines SL2 in the second direction DR2. The first scan lines SL1 and the second scan lines SL2 may be connected to scan wiring pads WPD_SC connected to a scan driver. The first scan lines SL1 and the second scan lines SL2 may be disposed to extend from a pad area PDA disposed in the non-display area NDA to the display area DPA.

A third scan line SL3 may be disposed to extend in the second direction DR2 and may be disposed to be spaced apart from the other third scan lines SL3 in the first direction DR1. One third scan line SL3 may be connected to one or more first scan lines SL1 or one or more second scan lines SL2. The plurality of scan lines SL may have (or may form) a mesh structure in (or over) the entirety of the display area DPA but are not limited thereto.

The data lines DTL may be disposed to extend in the first direction DR1. The data lines DTL may include first data lines DTL1, second data lines DTL2, and third data lines DTL3, and one first to third data lines DTL1, DTL2, and DTL3 form one group (e.g., one data line group) and are disposed adjacent to each other. Each of the data lines DTL1, DTL2, and DTL3 may be disposed to extend from the pad area PDA disposed in the non-display area NDA to the display area DPA. However, the disclosure is not limited thereto, and the plurality of data lines DTL may also be disposed to be spaced apart from each other at equal or substantially equal intervals between a first voltage line VL1 and a second voltage line VL2, to be described later.

The initialization voltage lines VIL may be disposed to extend in the first direction DR1. The initialization voltage line VIL may be disposed between the data lines DTL and the first voltage line VL1. The initialization voltage lines VIL may be disposed to extend from the pad area PDA disposed in the non-display area NDA to the display area DPA.

First voltage lines VL1 and second voltage lines VL2 are disposed to extend in the first direction DR1, and third voltage lines VL3 and fourth voltage lines VL4 are disposed to extend in the second direction DR2. The first voltage lines VL1 and the second voltage lines VL2 may be alternately disposed in the second direction DR2, and the third voltage lines VL3 and the fourth voltage lines VL4 may be alternately disposed in the first direction DR1. The first voltage lines VL1 and the second voltage lines VL2 may be disposed to extend in the first direction DR1 to cross the display area DPA, and some of each of the third voltage lines VL3 and the fourth voltage lines VL4 may be disposed in the display area DPA and the others of each of the third voltage lines VL3 and the fourth voltage lines VL4 may be disposed in the non-display areas NDA positioned on both sides of the display area DPA in the first direction DR1. The plurality of voltage lines VL may have (or may form) a mesh structure in (or over) the entirety of the display area DPA. However, the disclosure is not limited thereto.

The first scan line SL1, the second scan line SL2, the data line DTL, the initialization voltage line VIL, the first voltage line VL1, and the second voltage line VL2 may be electrically connected to at least one wiring pad WPD. Each wiring pad WPD may be disposed in the non-display area NDA. In an embodiment, each of the wiring pads WPD may be disposed in the pad area PDA positioned on the lower side of the display area DPA, which is the other side (e.g., the opposite side) of the display area DPA in the first direction DR1. The first scan line SL1 and the second scan line SL2 are connected to a scan wiring pad WPD_SC disposed in the pad area PDA, and the plurality of data lines DTL are connected to different data wiring pads WPD_DT, respectively. The initialization voltage line VIL is connected to an initialization line pad WPD_Vint, the first voltage line VL1 is connected to a first voltage line pad WPD_VL1, and the second voltage line VL2 is connected to a second voltage line pad WPD_VL2. An external device may be mounted on the wiring pad WPD. The external device may be mounted on the wiring pad WPD through an anisotropic conductive film, ultrasonic bonding, or the like. In the embodiment illustrated in FIG. 2, each of the wiring pads WPD is disposed in the pad area PDA disposed on the lower side of the display area DPA, but the disclosure is not limited thereto. Some of a plurality of wiring pads WPD may also be disposed on the upper side of the display area DPA or on any one of the left side and the right side.

Each pixel PX or sub-pixel SPXn (n being an integer of 1 to 3) of the display device 10 includes a pixel driving circuit. The above-described lines may apply driving signals to the respective pixel driving circuits while passing through the respective pixels PX or around the respective pixels PX.

The pixel driving circuit may include a transistor and a capacitor. The numbers of transistors and capacitors in each pixel driving circuit may be variously modified. According to an embodiment, each sub-pixel SPXn of the display device 10 may have a 3T1C structure in which the pixel driving circuit includes three transistors and one capacitor. Hereinafter, the pixel driving circuit will be described using the 3T1C structure as an example, but the disclosure is not limited thereto and various other modified structures, such as a 2T1C structure, a 7T1C structure, and a 6T1C structure, may be applied.

Figure 3:
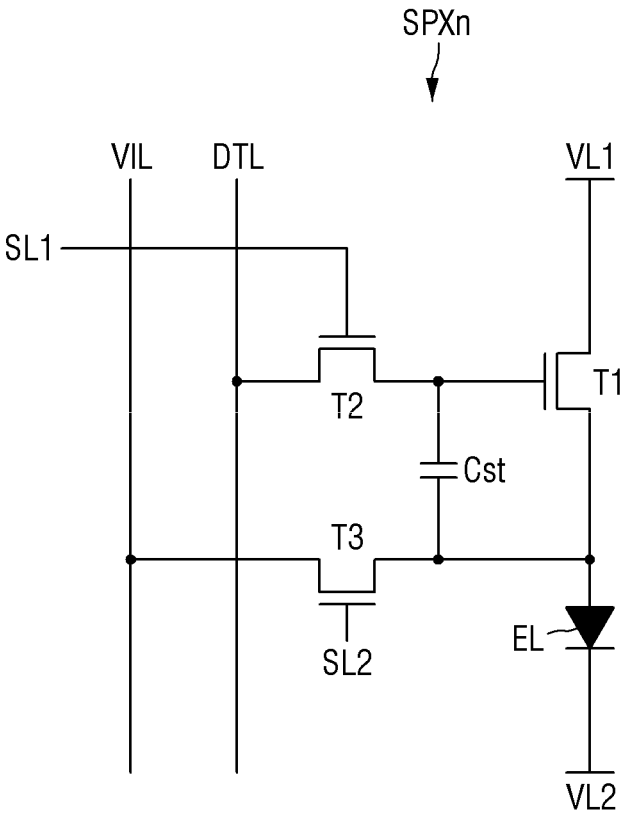
FIGS. 3 and 4 are equivalent circuit diagrams of one sub-pixel of the display device according to embodiments.
Figure 4:
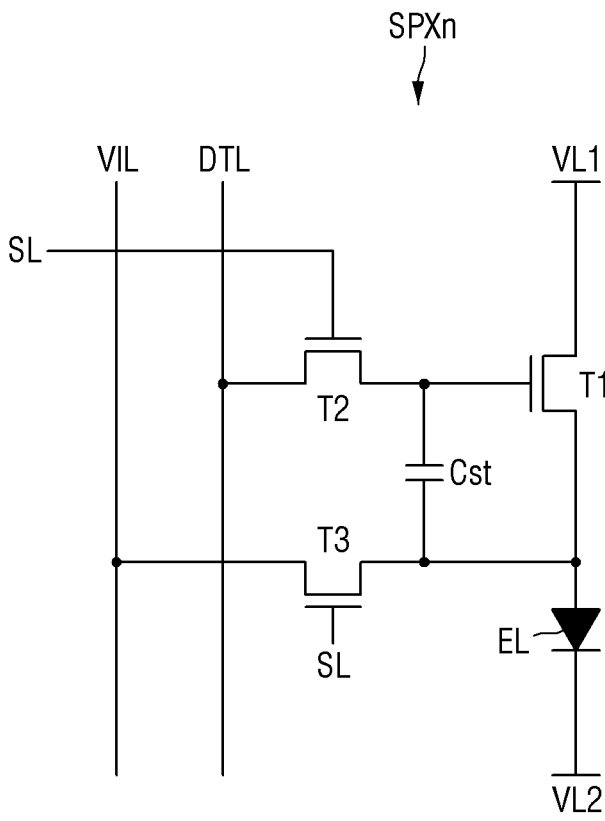

FIGS. 3 and 4 are equivalent circuit diagrams of one sub-pixel of the display device according to embodiments.

Referring to FIG. 3, each sub-pixel SPXn of the display device 10 according to an embodiment includes three transistors T1, T2, and T3, one storage capacitor Cst, and a light emitting diode EL.

The light emitting diode EL emits light according to a current supplied through the first transistor T1. The light emitting diode EL includes a first electrode, a second electrode, and at least one light emitting element disposed between the first electrode and the second electrode. The light emitting element may emit light of a specific wavelength band by (or according to) electrical signals transferred from the first electrode and the second electrode.

One end of the light emitting diode EL may be connected to a source electrode of the first transistor T1, and the other end of the light emitting diode EL may be connected to the second voltage line VL2 to which a low potential voltage (hereinafter, referred to as a second source voltage) lower than a high potential voltage (hereinafter, referred to as a first source voltage) of the first voltage line VL1 is supplied.

The first transistor T1 adjusts a current flowing from the first voltage line VL1 to which the first source voltage is supplied to the light emitting diode EL according to a voltage difference between a gate electrode and the source electrode thereof. As an example, the first transistor T1 may be a driving transistor for driving the light emitting diode EL. The gate electrode of the first transistor T1 may be connected to a source electrode of the second transistor T2, the source electrode of the first transistor T1 may be connected to the first electrode of the light emitting diode EL, and a drain electrode of the first transistor T1 may be connected to the first voltage line VL1 to which the first source voltage is applied.

The second transistor T2 is turned on by a scan signal of the first scan line SL1 to connect the data line DTL to the gate electrode of the first transistor T1. A gate electrode of the second transistor T2 may be connected to the first scan line SL1, the source electrode of the second transistor T2 may be connected to the gate electrode of the first transistor T1, and a drain electrode of the second transistor T2 may be connected to the data line DTL.

The third transistor T3 is turned on by a scan signal of the second scan line SL2 to connect the initialization voltage line VIL to one end of the light emitting diode EL. A gate electrode of the third transistor T3 may be connected to the second scan line SL2, a drain electrode of the third transistor T3 may be connected to the initialization voltage line VIL, and a source electrode of the third transistor T3 may be connected to one end of the light emitting diode EL or the source electrode of the first transistor T1.

In an embodiment, the source electrode and the drain electrode of each of the transistors T1, T2, and T3 are not limited to those described above, and vice versa. Each of the transistors T1, T2, and T3 may be formed as a thin film transistor. In FIG. 3, each of the transistors T1, T2, and T3 is described as being an N-channel metal oxide semiconductor field effect transistor (MOSFET), but the disclosure is not limited thereto. For example, each of the transistors T1, T2, and T3 may be formed as a P-channel MOSFET, or some of the transistors T1, T2, and T3 may be formed as an N-channel MOSFET and the others of the transistors T1, T2, and T3 may be formed as a P-channel MOSFET.

The storage capacitor Cst is formed between the gate electrode and the source electrode of the first transistor T1. The storage capacitor Cst stores a voltage difference between a gate voltage and a source voltage of the first transistor T1.

In the embodiment illustrated in FIG. 3, the gate electrode of the second transistor T2 may be connected to the first scan line SL1, and the gate electrode of the third transistor T3 may be connected to the second scan line SL2. The first scan line SL1 and the second scan line SL2 may be different scan lines, and the second transistor T2 and the third transistor T3 may be turned on by scan signals applied from different scan lines. However, the disclosure is not limited thereto.

Referring to FIG. 4, the gate electrodes of the second transistor T2 and the third transistor T3 may be connected to the same scan line SL. The second transistor T2 and the third transistor T3 may be concurrently (or simultaneously) turned on by a scan signal applied from the same scan line.

Hereinafter, a structure of one pixel PX of the display device 10 according to an embodiment will be described in detail with reference to other drawings.

Figure 5:
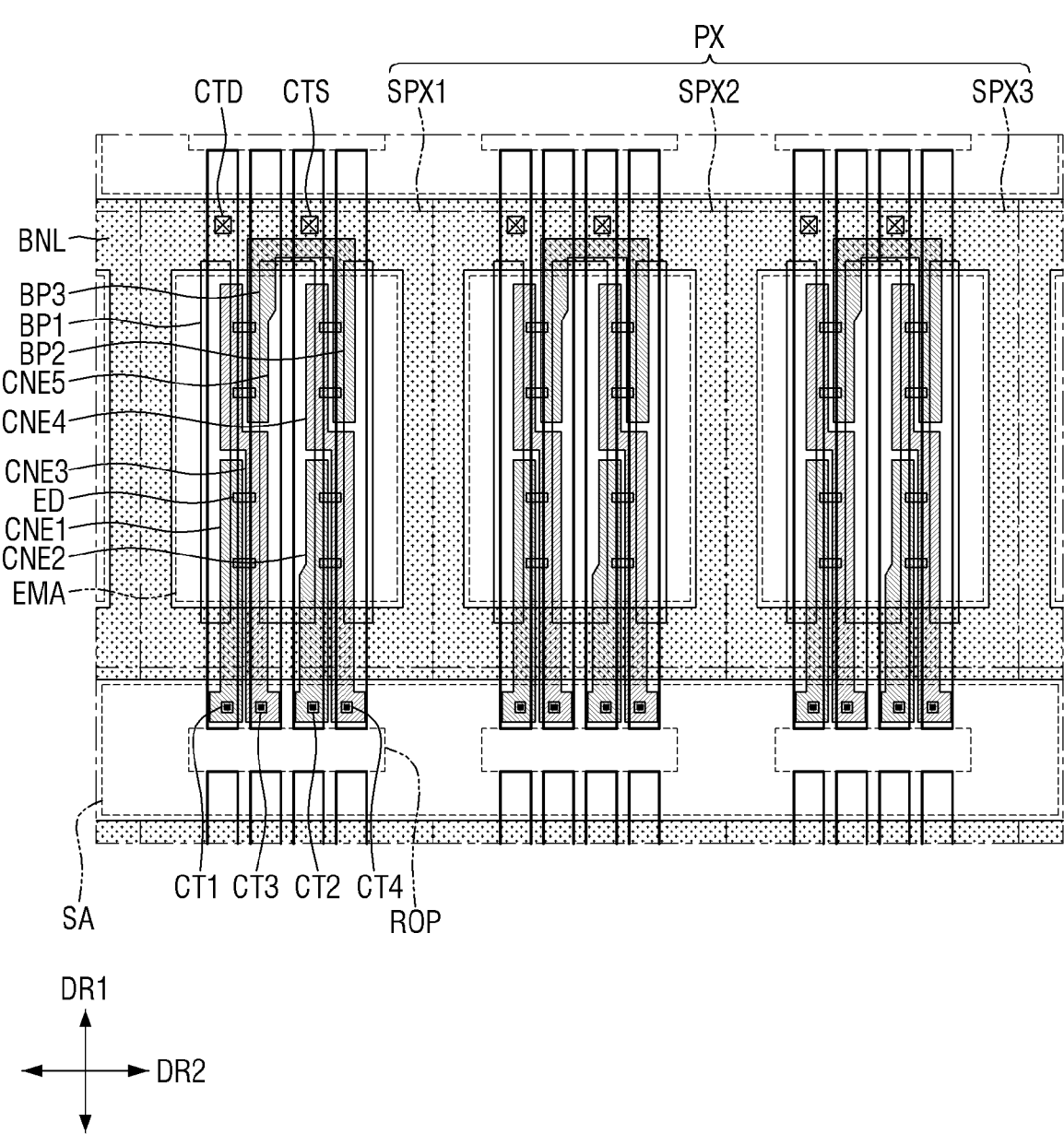
FIG. 5 is a plan view of one pixel of the display device according to an embodiment.
Figure 6:
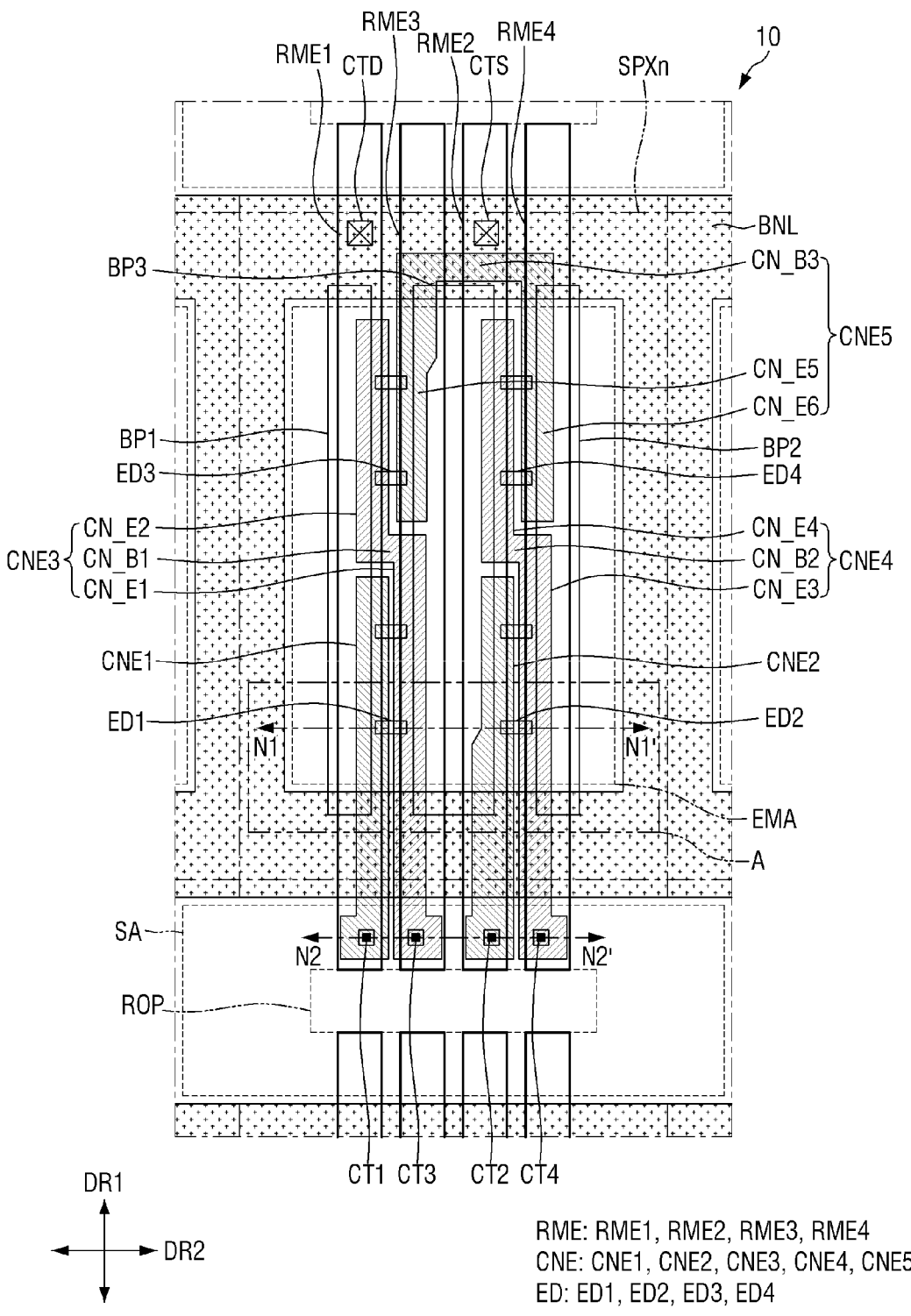
FIG. 6 is a plan view of a first sub-pixel shown in FIG. 5.

FIG. 5 is a plan view of one pixel of the display device according to an embodiment, and FIG. 6 is a plan view of a first sub-pixel shown in FIG. 5.

FIGS. 5 and 6 illustrate a layout, in a plan view, of electrodes RME (e.g., RME1, RME2, RME3, and RME4), partition walls BP1, BP2, and BP3, a bank layer BNL, a plurality of light emitting elements ED (e.g., ED1, ED2, ED3, and ED4), and connection electrodes CNE (e.g., CNE1, CNE2, CNE3, CNE4, and CNE5) disposed in one pixel PX of the display device 10. FIG. 6 illustrates a layout of the electrodes RME, the light emitting elements ED, and the connection electrodes CNE disposed in a first sub-pixel SPX1 shown in FIG. 5.

Referring to FIGS. 5 and 6, each of the pixels PX of the display device 10 may include a plurality of sub-pixels SPXn. For example, one pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. As an example, the first color may be blue, the second color may be green, and the third color may be red. However, the disclosure is not limited thereto, and the respective sub-pixels SPXn may also emit light of the same color. In such an embodiment, the respective sub-pixels SPXn may each emit blue light. In FIG. 5, one pixel PX includes three sub-pixels SPXn, but the disclosure is not limited thereto and the pixel PX may include a greater number of sub-pixels SPXn.

Each of the sub-pixels SPXn of the display device 10 may have an emission area EMA and a non-emission area. The emission area EMA may be an area in which the light emitting elements ED are disposed to emit light of a specific wavelength band. The non-emission area may be an area in which the light emitting elements ED are not disposed and light emitted from the light emitting elements ED does not arrive, and thus, the light is not emitted therefrom.

The emission area EMA may include an area in which the light emitting elements ED are disposed and an area which is adjacent to the light emitting elements ED and in which the light emitted from the light emitting elements ED is emitted. For example, the emission area EMA may also include an area in which the light emitted from the light emitting elements ED is reflected or refracted by other members and then emitted. The plurality of light emitting elements ED may be disposed in each sub-pixel SPXn, and an emission area including an area in which the plurality of light emitting elements ED are disposed and an area adjacent to the plurality of light emitting elements ED may be formed.

In FIG. 5, the emission areas EMA of the respective sub-pixels SPXn have a uniform area, but the disclosure is not limited thereto. In some embodiments, the respective emission areas EMA of the respective sub-pixels SPXn may have different areas (e.g., different sizes) depending on colors or wavelength bands of light emitted from the light emitting elements ED disposed in the corresponding sub-pixels.

The pixel PX may further have a sub-area SA disposed in the non-emission area. The sub-area SA may be disposed to be spaced apart from the emission area EMA in the first direction DR1. The emission areas EMA and the sub-areas SA may be alternately arranged along the first direction DR1, and the sub-area SA may be disposed between the emission areas EMA of different (e.g., adjacent) sub-pixels SPXn spaced apart from each other in the first direction DR1. For example, the emission areas EMA and the sub-areas SA may be alternately arranged in the first direction DR1, the emission areas EMA may be repeatedly arranged in the second direction DR2, and the sub-areas SA may extend in the second direction DR2. However, the disclosure is not limited thereto, and the emission areas EMA and the sub-areas SA of the plurality of pixels PX may have an arrangement different from that shown in FIG. 5.

The emission area EMA may be disposed for each sub-pixel SPXn, and the sub-area SA may be disposed across the plurality of sub-pixels SPXn. As described later, the emission area EMA and the sub-area SA may be divided by the bank layer BNL, the bank layer BNL may be disposed to surround, in a plan view, (e.g., to extend around a periphery of) the emission area EMA for each sub-pixel SPXn, and the sub-area SA may be disposed so as not to be divided between (e.g., to be continuous between) different sub-pixels SPXn.

Light is not emitted in the sub-areas SA because the light emitting elements ED are not disposed in the sub-areas SA, but portions of electrodes RME disposed in each of the sub-pixels SPXn may be disposed in the sub-areas SA. The electrodes RME disposed in different sub-pixels SPXn may be disposed to be separated from each other at a separation part (or separation area) ROP of the sub-area SA.

The display device 10 may include a plurality of electrodes RME, the partition walls BP1, BP2, and BP3, the bank layer BNL, the light emitting elements ED, and the connection electrodes CNE.

A plurality of partition walls BP1, BP2, and BP3 may be disposed in the emission area EMA of each sub-pixel SPXn. The partition walls BP1, BP2, and BP3 may substantially extend in the first direction DR1 and may be disposed to be spaced apart from each other in the second direction DR2.

For example, the partition walls BP1, BP2, and BP3 may include a first partition wall BP1 and a second partition wall BP2 spaced apart from each other in the second direction DR2 in the emission area EMA of each sub-pixel SPXn and a third partition wall BP3 disposed between the first partition wall BP1 and the second partition wall BP2. The first partition wall BP1 may be disposed on the left side of the emission area EMA, which is one side of the center of the emission area EMA in the second direction DR2, and the second partition walls BP2 may be spaced apart from the first partition wall BP1 and be disposed on the right side of the emission area EMA, which is the other side of the center of the emission area EMA in the second direction DR2. The third partition wall BP3 may be disposed at the center of the emission area EMA between the first partition wall BP1 and the second partition wall BP2. The first partition walls BP1, the third partition walls BP3, and the second partition walls BP2 may be alternately disposed along the second direction DR2 and may be disposed in an island-shaped pattern in the display area DPA. The plurality of light emitting elements ED may be disposed between the first partition wall BP1 and the third partition wall BP3 and between the third partition wall BP3 and the second partition wall BP2.

A width of the third partition wall BP3 measured in the second direction DR2 may be greater than that of the first partition wall BP1 and the second partition wall BP2. As described later, the third partition wall BP3 overlaps a greater number of electrodes RME as compared with the other partition walls BP1 and BP2 and, thus, may have a greater width in the second direction DR2 than the other partition patterns BP1 and BP2. However, the disclosure is not limited thereto, and widths of the partition walls BP1, BP2, and BP3 may be the same as each other.

In FIGS. 5 and 6, each of the first partition wall BP1 and the second partition wall BP2 is disposed to correspond to the emission area EMA of the corresponding sub-pixel SPXn. However, the disclosure is not limited thereto, and each of the first partition wall BP1 and the second partition wall BP2 may be disposed across the emission areas EMA of the sub-pixels SPXn adjacent to each other in the second direction DR2. In such an embodiment, the first partition wall BP1 and the second partition wall BP2 may overlap portions of a bank layer BNL, to be described later, extending in the first direction DR1.

Lengths of the partition walls BP1, BP2, and BP3 in the first direction DR1 may be the same as each other and may be greater than a length, in the first direction DR1, of the emission area EMA surrounded, in a plan view, by the bank layer BNL. The partition walls BP1, BP2, and BP3 may overlap portions of the bank layer BNL extending in the second direction DR2. However, the disclosure is not limited thereto, and the partition walls BP1, BP2, and BP3 may also be integrated with the bank layer BNL or may be spaced apart from portions of the bank layer BNL extending in the second direction DR2. In such embodiments, lengths of the partition walls BP1, BP2, and BP3 in the first direction DR1 may be the same as or smaller than the length, in the first direction DR1, of the emission area EMA surrounded, in a plan view, by (or defined by) the bank layer BNL.

In FIGS. 5 and 6, three partition walls BP1, BP2, and BP3 are disposed for each sub-pixel SPXn, but the disclosure is not limited thereto. The number and shape of the partition walls BP1, BP2, and BP3 may be changed (or varied) depending on the number or an arrangement structure of electrodes RME.

The electrodes RME have a shape in which they extend in one direction and are disposed for each sub-pixel SPXn. The electrodes RME may extend in the first direction DR1 to be disposed in the emission area EMA and the sub-area SA of the sub-pixel SPXn and may be disposed to be spaced apart from each other in the first direction DR1 and the second direction DR2. The electrodes RME may be electrically connected to light emitting elements ED, to be described later. However, the disclosure is not limited thereto, and the electrodes RME may not be electrically connected to the light emitting element ED.

The display device 10 may include a first electrode RME1, a second electrode RME2, a third electrode RME3, and a fourth electrode RME4 disposed for each sub-pixel SPXn.

The first electrode RME1 may be disposed on the left side of the sub-pixel SPXn, which is the other side of the center of the sub-pixel SPXn in the second direction DR2. The first electrode RME1 may be disposed to partially overlap the first partition wall BP1. For example, a portion of the first electrode RME1 may be directly disposed on the first partition wall BP1. The second electrode RME2 may be spaced apart from the first electrode RME1 in the second direction DR2 and may be disposed at the center of the sub-pixel SPXn. A portion of the second electrode RME2 may overlap the third partition wall BP3. For example, a portion of the second electrode RME2 may be directly disposed on the third partition wall BP3.

The third electrode RME3 may be disposed between the first electrode RME1 and the second electrode RME2. The third electrode RME3 may be spaced apart from the second electrode RME2 in the second direction DR2 and may partially overlap the third partition wall BP3. For example, the third electrode RME3 may be spaced apart from the second electrode RME2, and a portion of the third electrode RME3 may be directly disposed on the third partition wall BP3.

The fourth electrode RME4 may be spaced apart from the second electrode RME2 in the second direction DR2 and may be disposed on the right side of the sub-pixel SPXn, which is one side of the center of the sub-pixel SPXn in the second direction DR2. The fourth electrode RME4 may overlap the second partition wall BP2. For example, a portion of the fourth electrode RME4 may be directly disposed on the second partition wall BP2.

Each of the first electrode RME1, the second electrode RME2, the third electrode RME3, and the fourth electrode RME4 may be disposed in the emission area EMA and the sub-area SA. The electrodes RME of different sub-pixels SPXn adjacent to each other in the first direction DR1 may be spaced apart or separated from each other in the separation part ROP disposed in the sub-area SA, respectively.

An interval (or a space or distance) between the electrodes RME spaced apart from each other in the second direction DR2 may be smaller than an interval between the partition walls BP1, BP2, and BP3 spaced apart from each other in the second direction DR2. For example, an interval between the first electrode RME1 and the third electrode RME3 may be smaller than an interval between the first partition wall BP1 and the third partition wall BP3. The respective electrodes RME may be disposed on the partition walls BP1, BP2, and BP3, but portions of the respective electrodes RME may be disposed so as not to overlap (e.g., so as to be offset from) the partition walls BP1, BP2, and BP3.

In FIGS. 5 and 6, the four electrodes RME have a shape in which they extend in the first direction DR1 for each sub-pixel SPXn, but the disclosure is not limited thereto. For example, in the display device 10, a greater number of electrodes RME may be disposed in one sub-pixel SPXn or the electrodes RME may have a shape in which they are partially bent and may have different widths according to their positions.

The bank layer BNL may be disposed to surround, in a plan view, the plurality of sub-pixels SPXn, the emission areas EMA, and the sub-areas SA. The bank layer BNL may be disposed between the sub-pixels SPXn that are adjacent to each other in the first direction DR1 and the second direction DR2 and may also be disposed between the emission areas EMA and the sub-areas SA. The sub-pixels SPXn, the emission areas EMA, and the sub-areas SA of the display device 10 may be areas divided by an arrangement of the bank layer BNL. Intervals (or spacing or distance) between the plurality of sub-pixels SPXn, the emission areas EMA, and the sub-areas SA may be changed according to a width of the bank layer BNL.

The light emitting elements ED may be disposed in the emission area EMA. The light emitting elements ED may be disposed between the partition walls BP1, BP2, and BP3 and may be disposed to be spaced apart from each other in the first direction DR1 and/or the second direction DR2. In an embodiment, the plurality of light emitting elements ED may have a shape in which they extend in one direction and with both ends (e.g., opposite ends) disposed on different electrodes RME. The light emitting elements ED may have a length greater than the interval between the electrodes RME spaced apart from each other in the second direction DR2. The light emitting elements ED may be arranged so that an extension direction thereof is substantially perpendicular to the first direction DR1, in which the electrodes RME extend. However, the disclosure is not limited thereto, and the light emitting elements ED may be disposed so that the extension direction thereof is the second direction DR2 or a direction obliquely inclined with respect to the second direction DR2.

According to an embodiment, the light emitting elements ED may be disposed on the electrodes RME spaced apart from each other in the second direction DR2 between the partition walls BP1, BP2, and BP3 and may be divided into light emitting elements (e.g., light emitting element groups) ED1, ED2, ED3, and ED4 disposed on different electrodes RME. Some of the light emitting elements ED may be disposed between the first partition wall BP1 and the third partition wall BP3, and the others of the light emitting elements ED may be disposed between the third partition wall BP3 and the second partition wall BP2. According to an embodiment, the light emitting elements ED may include first light emitting elements ED1 and third light emitting elements ED3 disposed between the first partition wall BP1 and the third partition wall BP3 and second light emitting elements ED2 and fourth light emitting elements ED4 disposed between the third partition wall BP3 and the second partition wall BP2.

The first light emitting elements ED1 and the third light emitting elements ED3 may be disposed on the first electrode RME1 and the third electrode RME3, and the second light emitting elements ED2 and the fourth light emitting elements ED4 may be disposed on the second electrode RME2 and the fourth electrode RME4.

However, the respective light emitting elements ED may not be divided (or grouped) according to positions at which they are disposed in the emission area EMA and may be divided according to connection relationships with connection electrodes CNE, to be described later. The respective light emitting elements ED may be in contact with different connection electrodes CNE at both ends thereof according to an arrangement structure of the connection electrodes CNE and may be divided into different light emitting elements ED according to types of connection electrodes CNE with which they are in contact.

The connection electrodes CNE (e.g., CNE1, CNE2, CNE3, CNE4, and CNE5) may be disposed on the plurality of electrodes RME and the partition walls BP1, BP2, and BP3. A plurality of connection electrodes CNE may each have a shape in which they extend in one direction and may be disposed to be spaced apart from each other. Each of the connection electrodes CNE may be in contact with the light emitting elements ED and may be electrically connected to lower conductive layers.

The connection electrodes CNE may include a first connection electrode CNE1, a second connection electrode CNE2, a third connection electrode CNE3, a fourth connection electrode CNE4, and a fifth connection electrode CNE5 disposed in each sub-pixel SPXn.

The first connection electrode CNE1 may have a shape in which it extends in the first direction DR1 and may be disposed on the first electrode RME1. The first connection electrode RME1 may partially overlap the first electrode RME1 and the first partition wall BP1 and may be disposed across the emission area EMA and the sub-area SA. The second connection electrode CNE2 may have a shape in which it extends in the first direction DR1 and may be disposed on the second electrode RME2. The second connection electrode RME2 may partially overlap the second electrode RME2 and the third partition wall BP3 and may be disposed across the emission area EMA and the sub-area SA. A length of each of the first connection electrode CNE1 and the second connection electrode CNE2 extending in the first direction DR1 may be smaller than that of the other connection electrodes CNE. The first connection electrode CNE1 and the second connection electrode CNE2 may be disposed on the lower side of the emission area EMA of the sub-pixel SPXn.

The third connection electrode CNE3 may include a first extension part CN_E1 disposed on the third electrode RME3, a second extension part CN_E2 disposed on the first electrode RME1, and a first connection part CN_B1 connecting (or extending between) the first extension part CN_E1 and the second extension part CN_E2. The first extension part CN_E1 may be spaced apart from and face the first connection electrode CNE1 in the second direction DR2, and the second extension part CN_E2 may be spaced apart from the first connection electrode CNE1 in the first direction DR1. The first extension part CN_E1 may be disposed on the lower side of the emission area EMA of the corresponding sub-pixel SPXn, and the second extension part CN_E2 may be disposed on the upper side of the emission area EMA of the corresponding sub-pixel SPXn. The first connection part CN_B1 may be disposed at a central portion of the emission area EMA. The third connection electrode CNE3 may be disposed across the third electrode RME3 and the first electrode RME1. The third connection electrode CNE3 may have a shape in which it substantially extends in the first direction DR1, but may have a shape in which it is bent in the second direction DR2 and then extends again in the first direction DR1.

The fourth connection electrode CNE4 may include a third extension part CN_E3 disposed on the fourth electrode RME4, a fourth extension part CN_E4 disposed on the second electrode RME2, and a second connection part CN_B2 connecting the third extension part CN_E3 and the fourth extension part CN_E4 to each other. The third extension part CN_E3 may be spaced apart from and face the second connection electrode CNE2 in the second direction DR2, and the fourth extension part CN_E4 may be spaced apart from the second connection electrode CNE2 in the first direction DR1. The third extension part CN_E3 may be disposed on the lower side of the emission area EMA of the corresponding sub-pixel SPXn, and the fourth extension part CN_E4 may be disposed on the upper side of the emission area EMA of the corresponding sub-pixel SPXn. The second connection part CN_B2 may be disposed at the central portion of the emission area EMA. The fourth connection electrode CNE4 may be disposed across the fourth electrode RME4 and the second electrode RME2. The fourth connection electrode CNE4 may have a shape in which it substantially extends in the first direction DR1 but may have a shape in which it is bent in the second direction DR2 and then extends again in the first direction DR1.

The fifth connection electrode CNE5 may include a fifth extension part CN_E5 disposed on the third electrode RME3, a sixth extension part CN_E6 disposed on the fourth electrode RME4, and a third connection part CN_B3 connecting (or extending between) the fifth extension part CN_E5 and the sixth extension part CN_E6. The fifth extension part CN_E5 may be spaced apart from and face the second extension part CN_E2 of the third connection electrode CNE3 in the second direction DR2, and the sixth extension part CN_E6 may be spaced apart from and face the fourth extension part CN_E4 of the fourth connection electrode CNE4 in the second direction DR2. Each of the fifth extension part CN_E5 and the sixth extension part CN_E6 may be disposed on the upper side of the emission area EMA, and the third connection part CN_B3 may be disposed to extend in the second direction DR2 on the bank layer BNL. The fifth connection electrode CNE5 may be disposed across the third electrode RME3 and the fourth electrode RME4 and may have a shape in which it surrounds the fourth extension part CN_E4 of the fourth connection electrode CNE4 in a plan view.

The third connection electrode CNE3 and the fourth connection electrode CNE4 may be connection electrodes having electrode extension parts extending in the first direction DR1 that are not parallel to each other in the second direction DR2, and the fifth connection electrode CNE5 may be a connection electrode having electrode extension parts extending in the first direction DR1 that are parallel to each other in the second direction DR2. The third connection electrode CNE3 and the fourth connection electrode CNE4 may have a shape in which they extend in the first direction DR1 but are bent, and the fifth connection electrode CNE5 may have a shape in which it surrounds, in a plan view, a portion of the other connection electrode.

The plurality of light emitting elements ED may be divided (or grouped) into different light emitting elements ED according to the connection electrodes CNE with which both ends thereof are in contact according to the arrangement structure of the connection electrodes CNE. The first light emitting elements ED1 and the second light emitting elements ED2 may have first ends in contact with first-type connection electrodes and second ends in contact with second-type connection electrodes. The first light emitting elements ED1 may be in contact with the first connection electrode CNE1 and the third connection electrode CNE3, and the second light emitting elements ED2 may be in contact with the second connection electrode CNE2 and the fourth connection electrode CNE4. The third light emitting elements ED3 and the fourth light emitting elements ED4 may have first ends in contact with the second-type connection electrodes and second ends in contact with a third-type connection electrode. The third light emitting elements ED3 may be in contact with the third connection electrode CNE3 and the fifth connection electrode CNE5, and the fourth light emitting elements ED4 may be in contact with the fourth connection electrode CNE4 and the fifth connection electrode CNE5.

As described later, the light emitting elements ED may have both ends in a direction in which the light emitting elements ED extends and may be connected to each other in series through the connection electrodes CNE with which the both ends are in contact. The display device 10 may include a greater number of light emitting elements ED for each sub-pixel SPXn, and the series connection between the light emitting elements may be configured such that an amount of light emitted per unit area may be increased.

According to an embodiment, the display device 10 may include a plurality of insulating layers disposed between the electrodes RME, and the light emitting elements ED and the connection electrodes CNE. The insulating layers may be disposed to partially cover the electrodes RME, the light emitting elements ED, and the connection electrodes CNE. The insulating layers may have openings partially exposing layers disposed therebelow, and the connection electrodes CNE disposed on the insulating layers may be in contact with the layers exposed through the openings and disposed below the insulating layers. Hereinafter, a cross-sectional structure of the display device 10 and arrangements of the insulating layers in a plan view will be described with further reference to other drawings.

Figure 7:
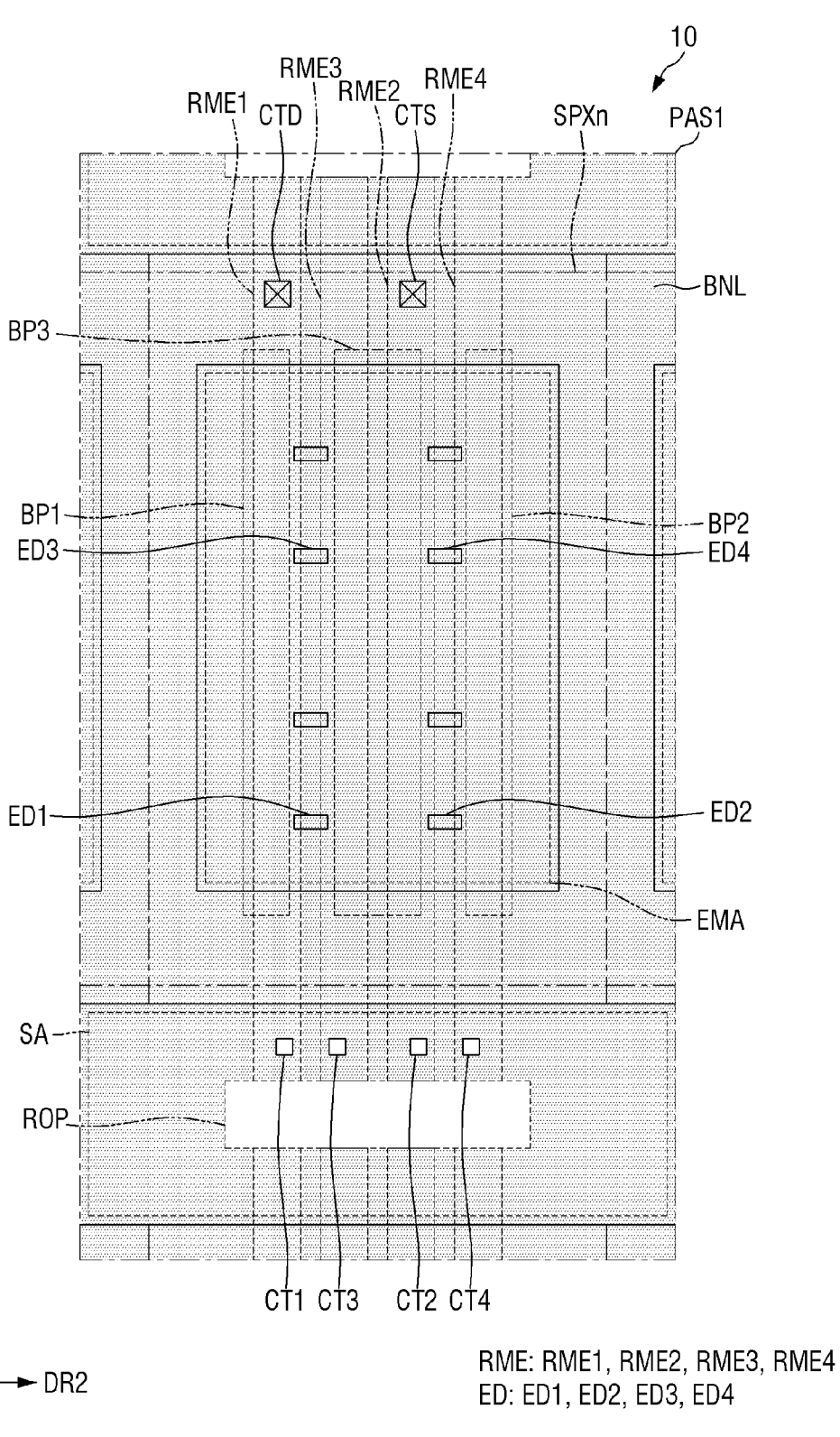
FIG. 7 is a plan view illustrating a first insulating layer disposed in the first sub-pixel shown in FIG. 6.
Figure 8:
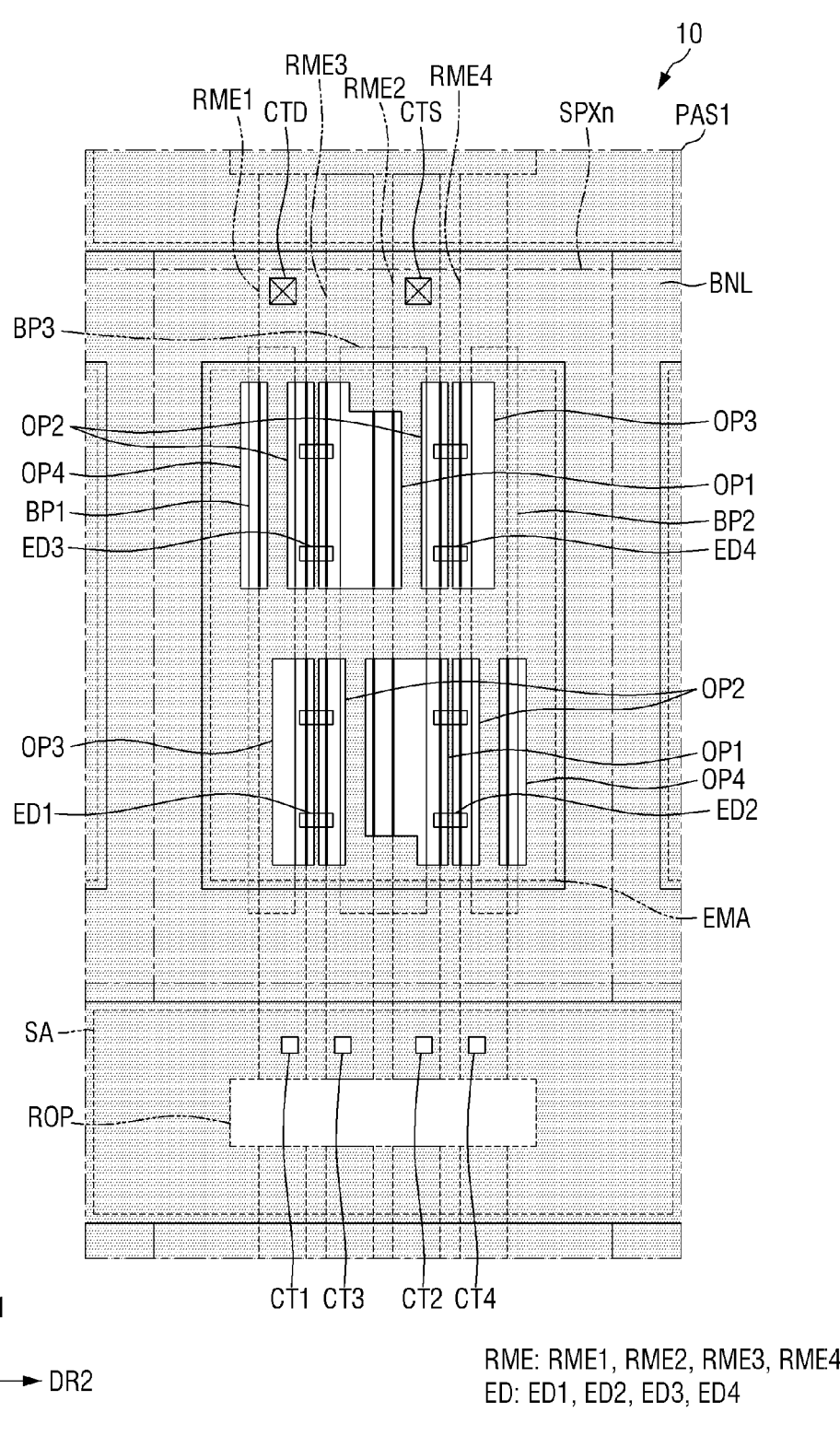
FIG. 8 is a plan view illustrating a second insulating layer disposed in the first sub-pixel shown in FIG. 6.
Figure 9:
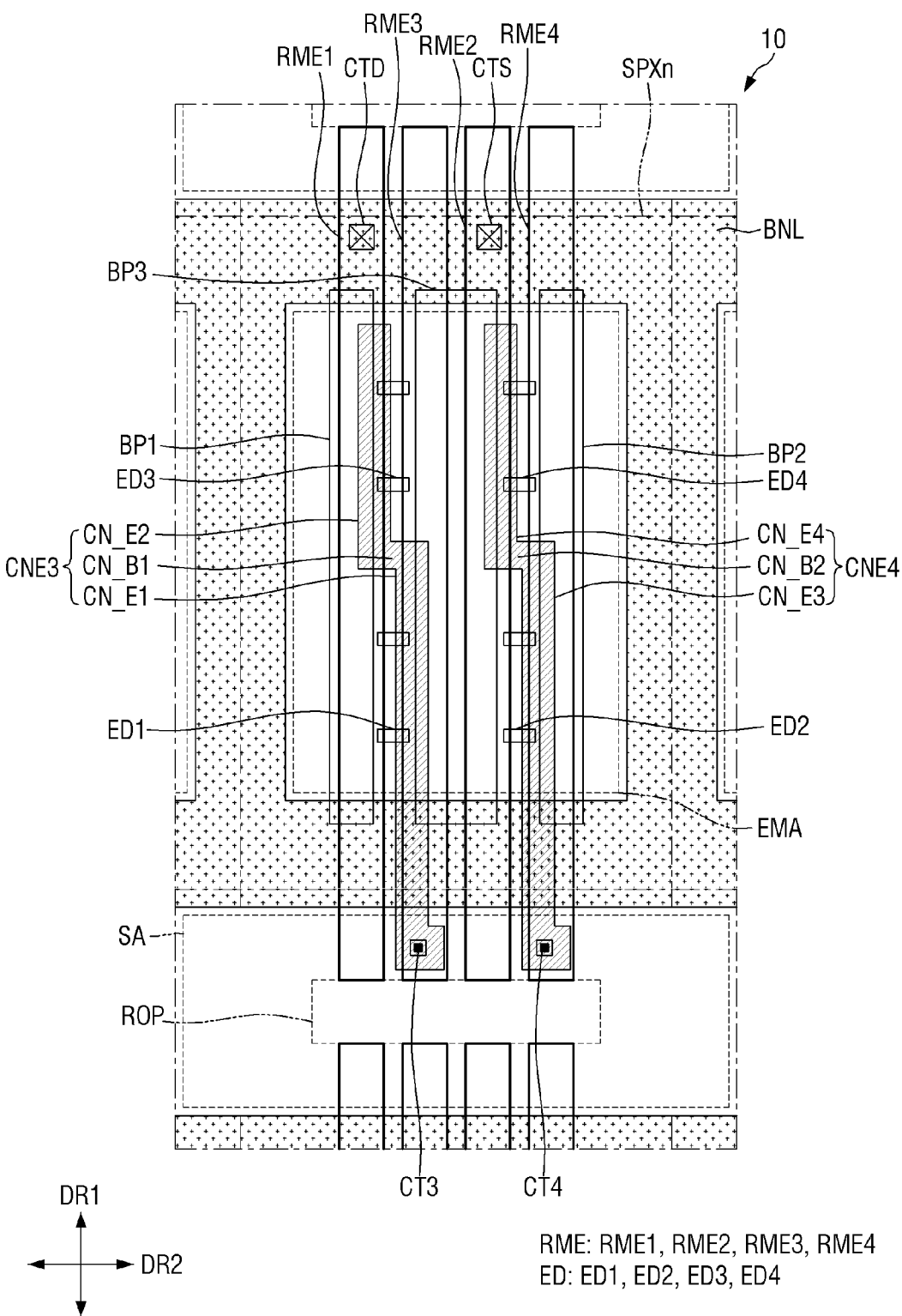
FIG. 9 is a plan view illustrating connection electrodes of a first connection electrode layer disposed in the first sub-pixel shown in FIG. 6.
Figure 10:
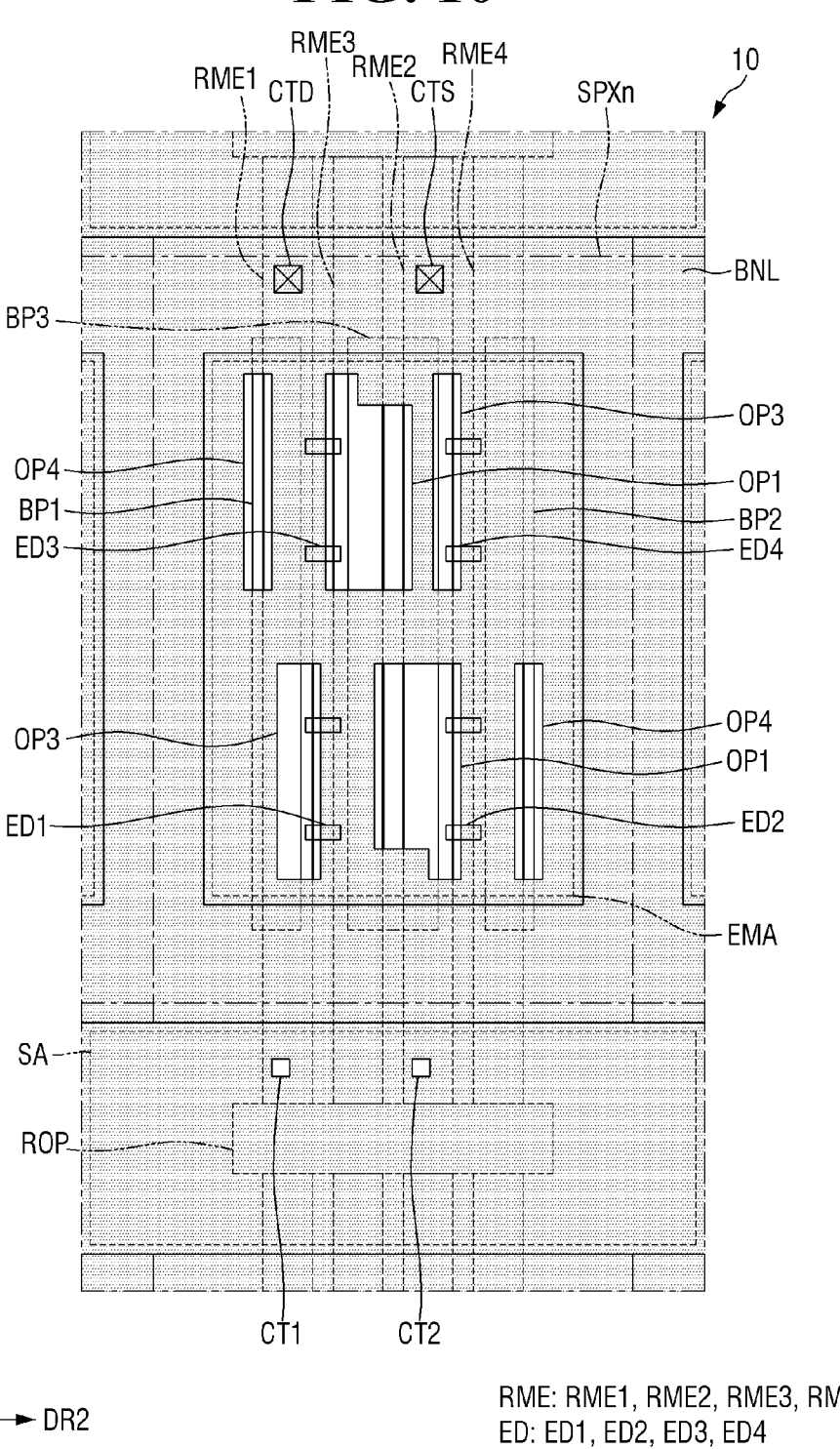
FIG. 10 is a plan view illustrating a third insulating layer disposed in the first sub-pixel shown in FIG. 6.
Figure 11:
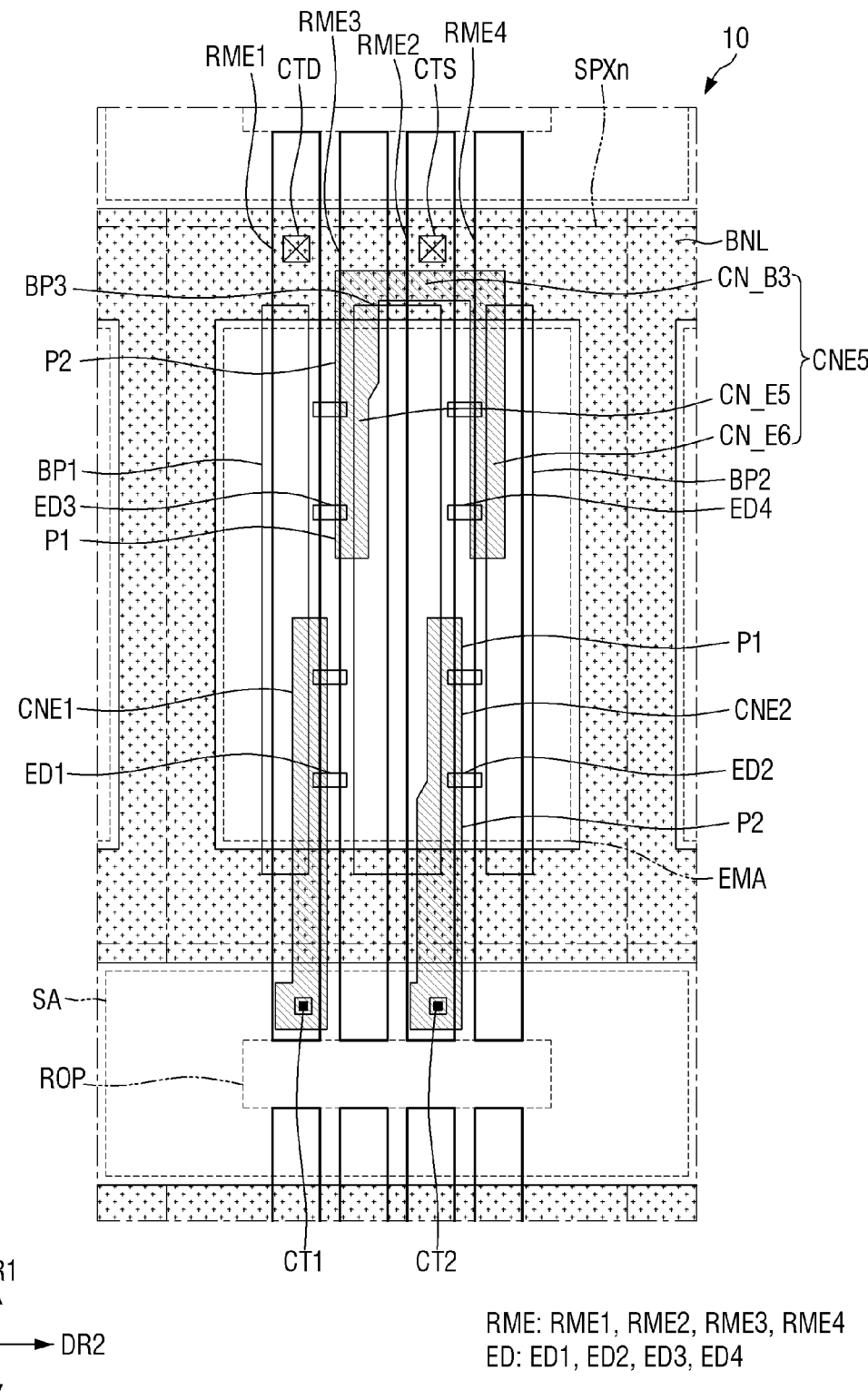
FIG. 11 is a plan view illustrating connection electrodes of a second connection electrode layer disposed in the first sub-pixel shown in FIG. 6.
Figure 12:
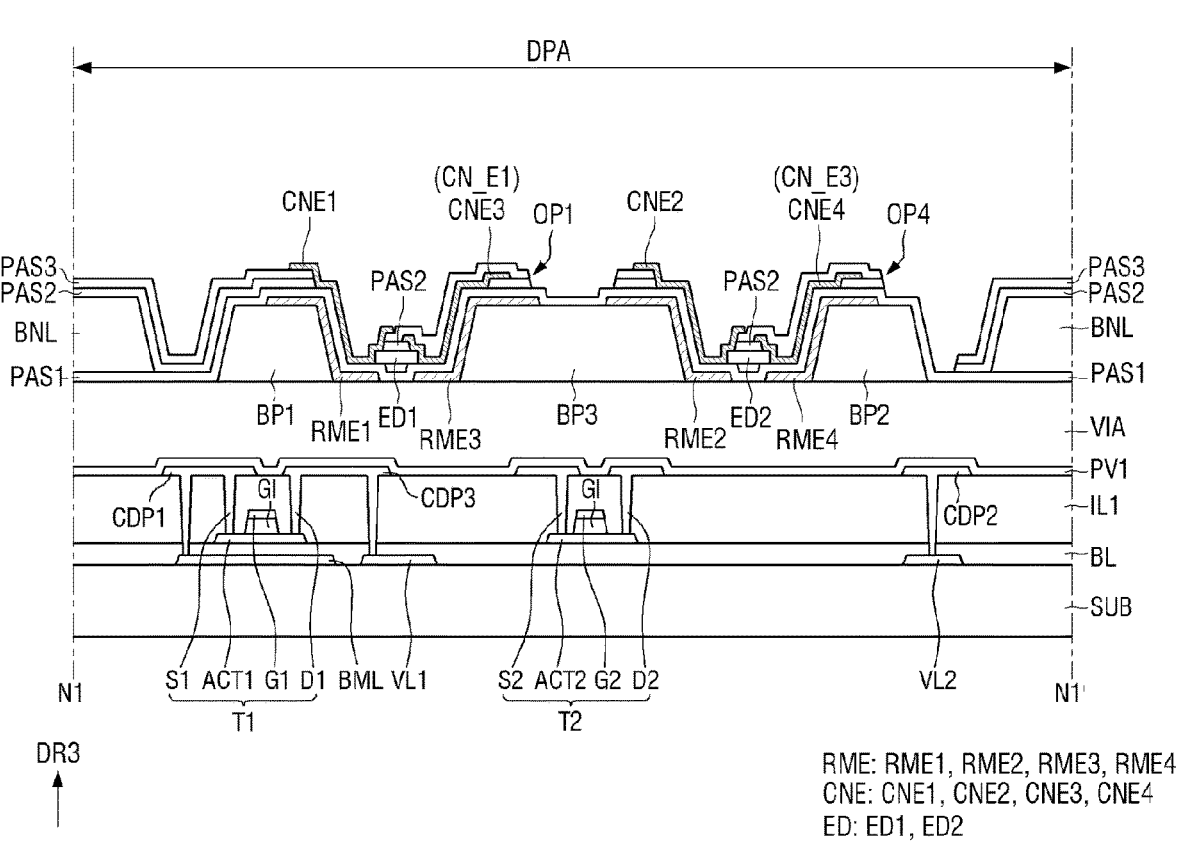
FIG. 12 is a cross-sectional view taken along the line N1-N1' of FIG. 6.
Figure 13:
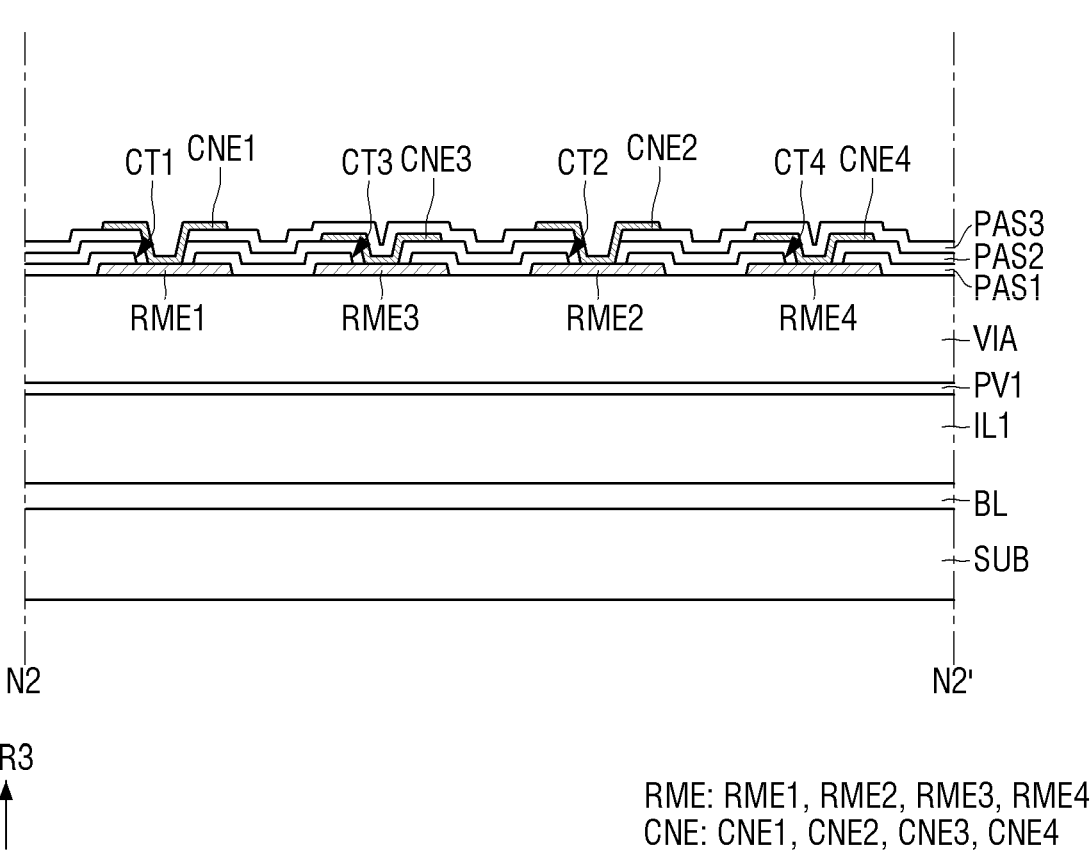
FIG. 13 is a cross-sectional view taken along the line N2-N2' of FIG. 6.

FIG. 7 is a plan view illustrating a first insulating layer disposed in the first sub-pixel shown in FIG. 6. FIG. 8 is a plan view illustrating a second insulating layer disposed in the first sub-pixel shown in FIG. 6. FIG. 9 is a plan view illustrating connection electrodes of a first connection electrode layer disposed in the first sub-pixel shown in FIG. 6. FIG. 10 is a plan view illustrating a third insulating layer disposed in the first sub-pixel shown in FIG. 6. FIG. 11 is a plan view illustrating connection electrodes of a second connection electrode layer disposed in the first sub-pixel shown in FIG. 6. FIG. 12 is a cross-sectional view taken along the line N1-N1' of FIG. 6. FIG. 13 is a cross-sectional view taken along the line N2-N2' of FIG. 6.

FIGS. 7 to 11 illustrate arrangements, in a plan view, of a plurality of insulating layers PAS1, PAS2, and PAS3 and connection electrodes CNE as different layers disposed in the first sub-pixel SPX1. FIG. 7 illustrates an arrangement, in a plan view, of a first insulating layer PAS1 disposed below the bank layer BNL, and FIGS. 8 and 10 illustrate arrangements, in a plan view, of a second insulating layer PAS2 and a third insulating layer PAS3 disposed above the bank layer BNL. FIG. 12 illustrates a cross section crossing both ends of the first light emitting element ED1 and the second light emitting element ED2 disposed in the first sub-pixel SPX1, and FIG. 13 illustrates a cross-section crossing a plurality of contact holes (e.g., contact openings) CT1, CT2, CT3, and CT4 disposed in the sub-area SA.

Referring to FIGS. 7 to 13, in addition to FIGS. 5 and 6, the display device 10 may include a first substrate SUB, and a semiconductor layer, a plurality of conductive layers, and a plurality of insulating layers disposed on the first substrate SUB. In addition, the display device 10 may include the plurality of electrodes RME, the light emitting elements ED, and the connection electrodes CNE.

The first substrate SUB may be an insulating substrate. The first substrate SUB may be made of an insulating material, such as glass, quartz, or a polymer resin. In addition, the first substrate SUB may be a rigid substrate but may be, in other embodiments, a flexible substrate that may be bent, folded, or rolled. The first substrate SUB may have a display area DPA and a non-display area NDA surrounding, in a plan view, the display area DPA, and the display area DPA may have an emission area EMA and a sub-area SA, which is a portion of a non-emission area.

A first conductive layer may include a lower metal layer BML, a first voltage line VL1, and a second voltage line VL2. The lower metal layer BML is disposed to overlap a first active layer ACT1 of a first transistor T1. The lower metal layer BML may prevent light from being incident on the first active layer ACT1 of the first transistor or may be electrically connected to the first active layer ACT1 to stabilize the electrical characteristics of the first transistor T1. However, the lower metal layer BML may be omitted in some embodiments.

A high potential voltage (or a first source voltage) transferred to the first electrode RME1 may be applied to the first voltage line VL1, and a low potential voltage (or a second source voltage) transferred to a second electrode RME2 may be applied to the second voltage line VL2. The first voltage line VL1 may be electrically connected to the first transistor T1 through a conductive pattern (e.g., a third conductive pattern CDP3) of a third conductive layer. The second voltage line VL2 may be electrically connected to the second electrode RME2 through a conductive pattern (e.g., a second conductive pattern CDP2) of a second conductive layer.

In FIG. 12, the first voltage line VL1 and the second voltage line VL2 are disposed at the first conductive layer, but the disclosure is not limited thereto. In some embodiments, the first voltage line VL1 and the second voltage line VL2 may be disposed at the third conductive layer and may be directly electrically connected to the first transistor T1 and the second electrode RME2, respectively.

A buffer layer BL may be disposed on the first conductive layer and the first substrate SUB. The buffer layer BL may be formed on the first substrate SUB to protect transistors of the pixel PX from moisture permeating through the first substrate SUB, which may be vulnerable to moisture permeation, and may planarize an underlying surface (e.g., may provide a planar upper surface).

The semiconductor layer is disposed on the buffer layer BL. The semiconductor layer may include the first active layer ACT1 of the first transistor T1 and a second active layer ACT2 of a second transistor T2. The first active layer ACT1 and the second active layer ACT2 may be disposed to partially overlap a first gate electrode G1 and a second gate electrode G2 of a second conductive layer, to be described later, respectively.

The semiconductor layer may include polycrystalline silicon, single crystal silicon, an oxide semiconductor, or the like. In an embodiment, the semiconductor layer may include polycrystalline silicon or an oxide semiconductor. The oxide semiconductor may include indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

In FIG. 12, one first transistor T1 and one second transistor T2 are disposed in the sub-pixel SPXn of the display device 10, but the disclosure is not limited thereto, and the display device 10 may include a greater number of transistors.

A first gate insulating layer GI is disposed on the semiconductor layer. The first gate insulating layer GI may be a gate insulating film for each of the transistors T1 and T2. In FIG. 12, the first gate insulating layer GI is patterned together with the gate electrodes G1 and G2 of the second conductive layer to be partially disposed between the second conductive layer and the active layers ACT1 and ACT2 of the semiconductor layer, but the disclosure is not limited thereto. In some embodiments, the first gate insulating layer GI may be entirely disposed on the buffer layer BL while covering the semiconductor layer.

The second conductive layer is disposed on the first gate insulating layer GI. The second conductive layer may include the first gate electrode G1 of the first transistor T1 and the second gate electrode G2 of the second transistor T2. The first gate electrode G1 may be disposed to overlap a channel region of the first active layer ACT1 in a third direction DR3, which is a thickness direction, and the second gate electrode G2 may be disposed to overlap a channel region of the second active layer ACT2 in the third direction DR3. The second conductive layer may further include one electrode of a storage capacitor.

A first interlayer insulating layer IL1 is disposed on the second conductive layer. The first interlayer insulating layer IL1 may be an insulating film between the second conductive layer and other layers disposed on the second conductive layer and may protect the second conductive layer.

The third conductive layer is disposed on the first interlayer insulating layer IL1. The third conductive layer may include a plurality of conductive patterns CDP1, CDP2, and CDP3 and source electrodes S1 and S2 and drain electrodes D1 and D2 of the respective transistors T1 and T2. Some of the conductive patterns CDP1, CDP2, and CDP3 may electrically connect conductive layers or semiconductor layers of different layers to each other and may be source/drain electrodes of the transistors T1 and T2.

A first conductive pattern CDP1 may be in contact with the first active layer ACT1 of the first transistor T1 through a contact hole (or contact opening) penetrating through the first interlayer insulating layer IL1. The first conductive pattern CDP1 may be in contact with the lower metal layer BML through a contact hole (or contact opening) penetrating through the first interlayer insulating layer IL1 and the buffer layer BL. The first conductive pattern CDP1 may be a first source electrode S1 of the first transistor T1. The first conductive pattern CDP1 may be electrically connected to the first electrode RME1 or the first connection electrode CNE1. The first transistor T1 may transfer the first source voltage applied from the first voltage line VL1 to the first electrode RME1 or the first connection electrode CNE1.

A second conductive pattern CDP2 may be in contact with the second voltage line VL2 through a contact hole (or contact opening) penetrating through the first interlayer insulating layer IL1 and the buffer layer BL. The second voltage line VL2 may transfer the second source voltage to the second connection electrode CNE2 through the second conductive pattern CDP2.

A third conductive pattern CDP3 may be in contact with the first voltage line VL1 through a contact hole (or contact opening) penetrating through the first interlayer insulating layer IL1 and the buffer layer BL. In addition, the third conductive pattern CDP3 may be in contact with the first active layer ACT1 of the first transistor T1 through a contact hole (or contact opening) penetrating through the first interlayer insulating layer IL1. The third conductive pattern CDP3 may electrically connect the first voltage line VL1 to the first transistor T1 and may be a first drain electrode D1 of the first transistor T1.

A second source electrode S2 and a second drain electrode D2 may be in contact with the second active layer ACT2 of the second transistor T2 through contact holes (or contact openings) penetrating through the first interlayer insulating layer IL1, respectively.

A first passivation layer PV1 is disposed on the third conductive layer. The first passivation layer PV1 may be an insulating film between the third conductive layer and other layers and may protect the third conductive layer.

Each of the buffer layer BL, the first gate insulating layer GI, the first interlayer insulating layer IL1, and the first passivation layer PV1 described above may be formed as a plurality of inorganic layers that are alternately stacked. For example, each of the buffer layer BL, the first gate insulating layer GI, the first interlayer insulating layer IL1, and the first passivation layer PV1 may be formed as a double layer in which inorganic layers including at least one of silicon oxide ($SiO_x$), silicon nitride ($SiN_x$), and silicon oxynitride ($SiO_xN_y$) are stacked or a multiple layer structure in which these layers are alternately stacked. However, the disclosure is not limited thereto, and each of the buffer layer BL, the first gate insulating layer GI, the first interlayer insulating layer IL1, and the first passivation layer PV1 may also be formed as one inorganic layer including the above-described insulating material. In addition, in some embodiments, the first interlayer insulating layer IL1 may also be made of an organic insulating material, such as polyimide (PI).

A via layer VIA is disposed on the third conductive layer in the display area DPA. The via layer VIA may include an organic insulating material, for example, an organic insulating material, such as polyimide (PI) to compensate for a step due to lower (or underlying) conductive layers and to provide a flat an upper surface. However, in some embodiments, the via layer VIA may be omitted.

The display device 10 may include, as a display element layer disposed on the via layer VIA, the partition walls BP1, BP2, and BP3, the plurality of electrodes RME, the bank layer BNL, the plurality of light emitting elements ED, and the plurality of connection electrodes CNE. In addition, the display device 10 may include the insulating layers PAS1, PAS2, and PAS3.

The partition walls BP1, BP2, and BP3 may be disposed on the via layer VIA. For example, the partition walls BP1, BP2, and BP3 may be directly disposed on the via layer VIA and may have a structure in which at least portions thereof protrude from an upper surface of the via layer VIA. As described above, the first partition wall BP1 and the second partition wall BP2 may be disposed to be spaced apart from each other, and the third partition wall BP3 may be disposed between the first partition wall BP1 and the second partition wall BP2. The protruding portions of the partition walls BP1, BP2, and BP3 may have side surfaces inclined (or bent or curved) with a curvature (e.g., a predetermined curvature), and light emitted from the light emitting elements ED may be reflected by the electrodes RME disposed on the partition walls BP1, BP2, and BP3 to be emitted in an upward direction from the via layer VIA. Different from the embodiment illustrated in FIG. 12, the partition walls BP1, BP2, and BP3 may have a shape of which outer surfaces are bent (or curved) with a curvature (e.g., a predetermined curvature) in a cross-sectional view; for example, the partition walls BP1, BP2, and BP3 may have a semi-circular or semi-elliptical cross-sectional shape. The partition walls BP1, BP2, and BP3 may include an organic insulating material, such as polyimide (PI), but are not limited thereto.

The plurality of electrodes RME may be disposed on the partition walls BP1, BP2, and BP3 and the via layer VIA. For example, the respective electrodes RME may be disposed on at least the inclined side surfaces of the partition walls BP1, BP2, and BP3. Widths of the electrodes RME measured in the second direction DR2 may be smaller than widths of the partition walls BP1, BP2, and BP3 measured in the second direction DR2, and an interval between the electrodes RME spaced apart from each other in the second direction DR2 may be smaller than an interval between the partition walls BP1, BP2, and BP3. The electrodes RME may be directly disposed on the via layer VIA at at least partial areas thereof and, thus, may be disposed on the same plane.

As described above, the first electrode RME1 may be disposed on the first partition wall BP1, the second electrode RME2 and the third electrode RME3 may be disposed on the third partition wall BP3, and the fourth electrode RME4 may be disposed on the second partition wall BP2. The interval between the electrodes RME may be smaller than the interval between the partition walls BP1, BP2, and BP3, and at least portions of the electrodes RME may be directly disposed on the via layer VIA.

The light emitting elements ED disposed between the partition walls BP1, BP2, and BP3 may emit light toward (or from) both ends thereof, and the emitted light may be directed to and incident on the electrodes RME disposed on the partition walls BP1, BP2, and BP3. The respective electrodes RME may have a structure in which portions thereof disposed on the partition walls BP1, BP2, and BP3 may reflect the light emitted from the light emitting elements ED. The electrodes RME may be disposed to cover at least one side surfaces of the partition walls BP1, BP2, and BP3 to reflect the light emitted from the light emitting elements ED.

The first electrode RME1 and the second electrode RME2 may be in direct contact with the third conductive layer through electrode contact holes (e.g., electrode contact openings) CTD and CTS disposed in portions thereof overlapping the bank layer BNL. For example, a first electrode contact hole CTD may be formed in a portion where the first electrode RME1 and the bank layer BNL overlap each other, and a second electrode contact hole CTS may be formed in a portion in which the second electrode RME2 and the bank layer BNL overlap each other. The first electrode RME1 may be in contact with the first conductive pattern CDP1 and may be electrically connected to the first transistor T1 through the first electrode contact hole CTD penetrating through the via layer VIA and the first passivation layer PV1. The second electrode RME2 may be in contact with the second conductive pattern CDP2 and may be electrically connected to the second voltage line VL2 through the second electrode contact hole CTS penetrating through the via layer VIA and the first passivation layer PV1.

The electrodes RME may include a conductive material having high reflectivity. For example, the electrodes RME may include a metal, such as silver (Ag), copper (Cu), or aluminum (Al), may include an alloy including aluminum (Al), nickel (Ni), lanthanum (La), or the like, or may have a structure in which a metal layer made of titanium (Ti), molybdenum (Mo), and niobium (Nb) and the alloy are stacked. In some embodiments, the electrodes RME may be formed as a double layer or as a multi-layer structure in which an alloy including aluminum (Al) and one or more metal layers made of titanium (Ti), molybdenum (Mo), and niobium (Nb) are stacked.

The disclosure is not limited thereto, and each of the electrodes RME may further include a transparent conductive material. For example, each of the electrodes RME may include a material such as ITO, IZO, or ITZO. In some embodiments, each of the electrodes RME may have a structure in which one or more layers made of a transparent conductive material and one or more layers made of a metal having high reflectivity are stacked or may be formed as one layer including the transparent conductive material and the metal having the high reflectivity. For example, each of the electrodes RME may have a stacked structure, such as ITO/Ag/ITO, ITO/Ag/IZO, or ITO/Ag/ITZO/IZO. The electrodes RME may reflect some of the light emitted from the light emitting elements ED in an upward direction of (or with respect to) the first substrate SUB while being electrically connected to the light emitting elements ED.

The first insulating layer PAS1 may be disposed in the entirety of the display area DPA and may be disposed on the via layer VIA and the plurality of electrodes RME. The first insulating layer PAS1 may insulate different electrodes RME from each other while protecting the plurality of electrodes RME. The first insulating layer PAS1 is disposed to cover the electrodes RME before the bank layer BNL is formed and, thus, may prevent the electrodes RME from being damaged in a process of forming the bank layer BNL. In addition, the first insulating layer PAS1 may prevent the light emitting elements ED disposed on the first insulating layer PAS1 from directly contacting and being damaged by other members (or components, etc.).

In an embodiment, the first insulating layer PAS1 may have a step formed so that a portion of an upper surface thereof is recessed between the electrodes RME that are spaced apart from each other in the second direction DR2. The light emitting elements ED may be disposed on the upper surface of the first insulating layer PAS1 at where the step is formed, and spaces may be formed between the light emitting elements ED and the first insulating layer PAS1.

According to an embodiment, the first insulating layer PAS1 may include a plurality of separation openings and a plurality of contact holes (e.g., contact openings) CT1, CT2, CT3, and CT4. The first insulating layer PAS1 may include the plurality of separation openings formed to correspond to the separation parts ROP of the sub-areas SA and the plurality of contacts holes CT1, CT2, CT3, and CT4 formed at portions where connection electrodes CNE, to be described later, and the electrodes RME are connected to each other. The first insulating layer PAS1 may be entirely disposed on the via layer VIA but may partially expose lower layers in portions where the separation openings and the contact holes CT1, CT2, CT3, and CT4 are formed.

The separation openings in first insulating layer PAS1 formed to correspond to the separation parts ROP of the sub-areas SA may expose the upper surface of the via layer VIA. The plurality of electrodes RME may be disposed to extend in the first direction DR1 and may be then etched in portions exposed by the separation openings formed to correspond to the separation parts ROP from among openings in the first insulating layer PAS1 to be separated into the plurality of electrodes RME.

The contact holes CT1, CT2, CT3, and CT4 formed in the first insulating layer PAS1 may be disposed to overlap different electrodes RME, respectively. For example, the contact holes CT1, CT2, CT3, and CT4 may be disposed in the sub-area SA and may include a first contact hole CT1 disposed to overlap the first electrode RME1, a second contact hole CT2 disposed to overlap the second electrode RME2, a third contact hole CT3 disposed to overlap the third electrode RME3, and a fourth contact hole CT4 disposed to overlap the fourth electrode RME4. The contact holes CT1, CT2, CT3, and CT4 may penetrate through the first insulating layer PAS1 to expose portions of upper surfaces of the electrodes RME disposed therebelow, respectively. The contact holes CT1, CT2, CT3, and CT4 may further penetrate through portions of the other insulating layers disposed on the first insulating layer PAS1. The electrodes RME exposed by the respective contact holes CT1, CT2, CT3, and CT4 may be in contact with the connection electrodes CNE.

The bank layer BNL may be disposed on the first insulating layer PAS1. The bank layer BNL may include portions extending in the first direction DR1 and the second direction DR2 and may surround, in a plan view, each of the sub-pixels SPXn. The bank layer BNL may divide (or separate) the emission area EMA and the sub-area SA of each sub-pixel SPXn while surrounding the emission area EMA and the sub-area SA of each sub-pixel SPXn in a plan view and may divide (or separate) the display area DPA and the non-display area NDA while surrounding the outermost portion of the display area DPA in a plan view.

The bank layer BNL may have a height (e.g., a predetermined height) similar to the partition walls BP1, BP2, and BP3. In some embodiments, a height (or location) of an upper surface of the bank layer BNL may be greater than (or higher than) that of the partition walls BP1, BP2, and BP3, and a thickness of the bank layer BNL may be the same as or greater than that of the partition walls BP1, BP2, and BP3. The bank layer BNL may prevent ink from overflowing into adjacent sub-pixels SPXn during an inkjet printing process during manufacturing the display device 10. The bank layer BNL may include an organic insulating material, such as polyimide like the partition walls BP1, BP2, and BP3. However, the disclosure is not limited thereto, and the bank layer BNL may include a material different from that of the partition walls BP1, BP2, and BP3.

The light emitting elements ED may be disposed in the emission area EMA. The light emitting element ED may be disposed on the first insulating layer PAS1 between the partition walls BP1, BP2, and BP3. The light emitting element ED may be disposed so that one direction in which it extends (e.g., its extension direction) is parallel to an upper surface of the first substrate SUB. As described later, the light emitting element ED may include a plurality of semiconductor layers disposed along the one direction in which it extends (e.g., along its extension direction), and the plurality of semiconductor layers may be sequentially disposed along a direction parallel to the upper surface of the first substrate SUB. However, the disclosure is not limited thereto, and when the light emitting element ED has another structure, the plurality of semiconductor layers may also be disposed in a direction perpendicular to the first substrate SUB.

The light emitting elements ED disposed in each sub-pixel SPXn may emit light of different wavelength bands depending on materials of the semiconductor layers. However, the disclosure is not limited thereto, and the light emitting elements ED disposed in each sub-pixel SPXn may include semiconductor layers made of the same material to emit light of the same color.

The light emitting elements ED may be in contact with the connection electrodes CNE to be electrically connected to the electrodes RME and the conductive layers below the via layer VIA and may receive electrical signals applied thereto to emit light of a specific wavelength band.

The second insulating layer PAS2 may be disposed on the plurality of light emitting elements ED, the first insulating layer PAS1, and the bank layer BNL. The second insulating layer PAS2 includes a pattern part extending in the first direction DR1 between the partition walls BP1, BP2, and BP3 and disposed on the plurality of light emitting elements ED. The pattern part may be disposed to partially surround outer surfaces of the light emitting elements ED and may not cover (or may expose) both sides and/or both ends of the light emitting elements ED. The pattern part may form a linear or island-shaped pattern in each sub-pixel SPXn in a plan view. The pattern part of the second insulating layer PAS2 may fix the light emitting elements ED in the processes of manufacturing the display device 10 while protecting the light emitting elements ED. In addition, the second insulating layer PAS2 may be disposed to fill the spaces between the light emitting elements ED and the first insulating layer PAS1 below the light emitting elements ED. A portion of the second insulating layer PAS2 may be disposed on the bank layer BNL and in the sub-areas SA.

According to an embodiment, the second insulating layer PAS2 may include a plurality of openings OP1, OP2, OP3, and OP4 and a plurality of contact holes (e.g., contact openings) CT1, CT2, CT3, and CT4. The second insulating layer PAS2 may include a plurality of separation openings formed to correspond to the separation parts ROP of the sub-areas SA and a plurality of openings OP1, OP2, OP3, and OP4 disposed to partially overlap the electrodes RME in the emission area EMA. The second insulating layer PAS2 may be entirely disposed on the first insulating layer PAS1 but may partially expose lower layers in portions in which the plurality of openings are formed.

In the separation openings in the second insulating layer PAS2 formed to correspond to the separation parts ROP of the sub-areas SA, a process of separating the electrodes RME disposed below the separation openings from each other may be performed. Similar to the first insulating layer PAS1, the second insulating layer PAS2 may also include the separation openings exposing the upper surface of the via layer VIA in the separation part ROP in which the process of separating the electrodes RME from each other is performed.

The second insulating layer PAS2 may include a plurality of first openings OP1, second openings OP2, and third openings OP3 disposed on the electrodes RME, overlapping the electrodes RME, and exposing one end of the light emitting elements ED, and a plurality of fourth openings OP4 that overlap the electrodes RME but do not overlap the light emitting elements ED. The plurality of first to fourth openings OP1, OP2, OP3, and OP4 may have a shape in which they extend in the first direction DR1 and may be spaced apart from and face each other in the first direction DR1 or the second direction DR2. The openings OP1, OP2, OP3, and OP4 may partially overlap sides of the electrodes RME and the partition walls BP1, BP2, and BP3 extending in the first direction DR1, and the first openings OP1, the second openings OP2, and the third openings OP3 may also partially overlap the light emitting element ED disposed on the electrodes RME that are spaced apart from each other in the second direction DR2.

The first openings OP1 may be disposed to overlap the second electrode RME2 and the third electrode RME3 on the third partition wall BP3. Different first openings OP1 may be spaced apart from each other in the first direction DR1, and any one of the first openings OP1 may overlap the second light emitting elements ED2 while the other of the first openings OP1 may overlap the third light emitting elements ED3. The first opening OP1 disposed on the upper side of the emission area EMA may partially overlap the third light emitting elements ED3, and the first opening OP1 disposed on the lower side of the emission area EMA may partially overlap the second light emitting elements ED2.

The second openings OP2 may face the first opening OP1 and the third opening OP3 in the second direction DR2, respectively. The second openings OP2 disposed on the lower side of the emission area EMA from among the plurality of second openings OP2 may be disposed to overlap the third electrode RME3 and the fourth electrode RME4, respectively, and may partially overlap the first light emitting elements ED1 and the second light emitting elements ED2, respectively. The second openings OP2 disposed on the upper side of the emission area EMA from among the plurality of second openings OP2 may be disposed to overlap the first electrode RME1 and the second electrode RME2, respectively, and may partially overlap the third light emitting elements ED3 and the fourth light emitting elements ED4, respectively. The second openings OP2 overlapping the first electrode RME1 and the fourth electrode RME4 may be spaced apart from and face the first openings OP1 in the second direction DR2, respectively. The second openings OP2 overlapping the second electrode RME2 and the third electrode RME3 may be spaced apart from and face third openings OP3, to be described later, in the second direction DR2, respectively. The first opening OP1 may be disposed between the second openings OP2 spaced apart from each other in the second direction DR2. Each of the second openings OP2 may overlap any one of the first partition wall BP1, the second partition wall BP2, and the third partition wall BP3.

The third openings OP3 may face the second openings OP2 in the second direction DR2. The third opening OP3 disposed on the lower side of the emission area EMA, of the third openings OP3 disposed to overlap the first electrode RME1, may partially overlap the first light emitting elements ED1. The third opening OP3 disposed on the upper side of the emission area EMA, of the third openings OP3 disposed to overlap the fourth electrode RME4, may partially overlap the fourth light emitting elements ED4. The second openings OP2 overlapping the first electrode RME1 and the fourth electrode RME4 may be spaced apart from and face the first openings OP1 in the second direction DR2, respectively. Each of the third openings OP3 may overlap any one of the first partition wall BP1 and the second partition wall BP2.

The fourth openings OP4 may be spaced apart from the second openings OP2 in the second direction DR2. The fourth openings OP4 may be disposed to overlap the same electrodes RME as the electrodes RME that the second openings OP2 overlap, respectively, but in which the light emitting elements ED are not disposed, and may partially overlap areas between the partition walls BP1, BP2, and BP3 and the bank layer BNL. For example, the fourth opening OP4 disposed on the lower side of the emission area EMA may overlap the fourth electrode RME4, and the fourth opening OP4 disposed on the upper side of the emission area EMA may overlap the first electrode RME1. Each of the fourth openings OP4 may overlap any one of the first partition wall BP1 and the second partition wall BP2.

In an embodiment, a maximum width of the first opening OP1 measured in the second direction DR2 may be greater than those of the second opening OP2, the third opening OP3, and the fourth opening OP4. A maximum width of the third opening OP3 measured in the second direction DR2 may also be greater than those of the second opening OP2 and the fourth opening OP4, and maximum widths of the second opening OP2 and the fourth opening OP4 measured in the second direction DR2 may be the same as each other. The widths of the respective openings OP1, OP2, OP3, and OP4 may be different from each other according to the positions of the respective openings OP1, OP2, OP3, and OP4. In an embodiment, the first opening OP1 may be disposed to overlap the different electrodes RME and, thus, may have the greatest maximum width.

The first openings OP1, the second openings OP2, and the third openings OP3 may partially overlap the light emitting elements ED to expose one end of the light emitting elements ED. The first openings OP1, the second openings OP2, and the third openings OP3 may be disposed to overlap the connection electrodes CNE, and the connection electrodes CNE may be in contact with the light emitting elements ED exposed by the first openings OP1, the second openings OP2, and the third openings OP3.

On the other hand, the fourth openings OP4 may not overlap the light emitting elements ED and may not overlap the connection electrodes CNE. Other openings may partially overlap areas between the partition walls BP1, BP2, and BP3, while the fourth openings OP4 may overlap areas between the first partition wall BP1 and the second partition wall BP2 disposed on the outer side from among the partition walls BP1, BP2, and BP3 and the bank layer BNL. The first openings OP1, the second openings OP2, and the third openings OP3 may be openings formed to allow connection between the light emitting elements ED and the connection electrodes CNE, and the fourth openings OP4 may be openings forming emission paths of the light emitted from the light emitting elements ED.

Some of the plurality of openings OP1, OP2, OP3, and OP4 may be openings penetrating through only the second insulating layer PAS2, and the others of the plurality of openings OP1, OP2, OP3, and OP4 may be openings penetrating through the second insulating layer PAS2 and the third insulating layer PAS3. A detailed description thereof will be provided later.

The second insulating layer PAS2 may include the first contact hole CT1 disposed in the sub-area SA and disposed to overlap the first electrode RME1, the second contact hole CT2 disposed in the sub-area SA and disposed to overlap the second electrode RME2, the third contact hole CT3 disposed in the sub-area SA and disposed to overlap the third electrode RME3, and the fourth contact hole CT4 disposed in the sub-area SA and disposed to overlap the fourth electrode RME4. The contact holes CT1, CT2, CT3, and CT4 may penetrate through the second insulating layer PAS2 in addition to the first insulating layer PAS1. The contact holes CT1, CT2, CT3, and CT4 may expose portions of upper surfaces of the electrodes RME disposed therebelow, respectively.

The connection electrodes CNE may be disposed on the electrodes RME and the partition walls BP1, BP2, and BP3. The connection electrodes CNE may be divided into connection electrodes of a first connection electrode layer disposed between the second insulating layer PAS2 and the third insulating layer PAS3 and connection electrodes of a second connection electrode layer disposed on the third insulating layer PAS3. The third connection electrode CNE3 and the fourth connection electrode CNE4 may be connection electrodes of the first connection electrode layer, and the first connection electrode CNE1, the second connection electrode CNE2, and the fifth connection electrode CNE5 may be the connection electrodes of the second connection electrode layer.

The first connection electrode CNE1 may be disposed on the first electrode RME1 and the first partition wall BP1. The second connection electrode CNE2 may be disposed on the second electrode RME2 and the third partition wall BP3. The third connection electrode CNE3 may be disposed on the first electrode RME1 and the third electrode RME3. The fourth connection electrode CNE4 may be disposed on the second electrode RME2 and the fourth electrode RME4. The fifth connection electrode CNE5 may be disposed on the third electrode RME3 and the fourth electrode RME4. A description of arrangements of the respective connection electrodes CNE in a plan view is the same as that described above with reference to FIGS. 5 and 6.

The first connection electrode CNE1 and the second connection electrode CNE2 may be disposed across the emission area EMA and the sub-area SA and may be in direct contact with the electrodes RME through the contact holes CT1 and CT2 formed in the sub-area SA, respectively. The third connection electrode CNE3 and the fourth connection electrode CNE4 may be disposed across the emission area EMA and the sub-area SA and may be in direct contact with the electrodes RME through the contact holes CT3 and CT4 formed in the sub-area SA, respectively.

The first connection electrode CNE1 may be in contact with the first electrode RME1 through the first contact hole CT1 penetrating through the first insulating layer PAS1, the second insulating layer PAS2, and the third insulating layer PAS3 in the sub-area SA. The second connection electrode CNE2 may be in contact with the second electrode RME2 through the second contact hole CT2 penetrating through the first insulating layer PAS1, the second insulating layer PAS2, and the third insulating layer PAS3 in the sub-area SA. The third connection electrode CNE3 may be in contact with the third electrode RME3 through the third contact hole CT3 penetrating through the first insulating layer PAS1 and the second insulating layer PAS2 in the sub-area SA. The fourth connection electrode CNE4 may be in contact with the fourth electrode RME4 through the fourth contact hole CT4 penetrating through the first insulating layer PAS1 and the second insulating layer PAS2 in the sub-area SA.

The first connection electrode CNE1 may be electrically connected to the first transistor T1 through the first electrode RME1 to receive the first source voltage transferred thereto, and the second connection electrode CNE2 may be electrically connected to the second voltage line VL2 through the second electrode RME2 to receive the second source voltage applied thereto. The light emitting elements ED may emit the light by the source voltages transferred through the first connection electrode CNE1 and the second connection electrode CNE2.

The first connection electrode CNE1 and the second connection electrode CNE2 may be the first-type connection electrodes connected to the electrodes RME1 and RME2 that are directly connected to the third conductive layer, respectively, the third connection electrode CNE3 and the fourth connection electrode CNE4 may be the second-type connection electrodes connected to the electrodes RME3 and RME4 that are not connected to the third conductive layer, and the fifth connection electrode CNE5 may be the third-type connection electrode that is not connected to the electrode RME. The fifth connection electrode CNE5 is not connected to the electrode RME, may be in contact with the light emitting elements ED, and may constitute an electrical connection circuit of the light emitting elements ED together with the other connection electrodes CNE.

However, the disclosure is not limited thereto. In some embodiments, in the display device 10, some of the connection electrodes CNE may be directly connected to the third conductive layer. For example, each of the first connection electrode CNE1 and the second connection electrode CNE2, which are the first-type connection electrodes, may be directly connected to the third conductive layer and may not be electrically connected to the electrode RME. The second-type connection electrode and the third-type connection electrode may also not be electrically connected to the electrode RME and may be connected only to the light emitting elements ED.

The connection electrodes CNE may include a conductive material. For example, the connection electrodes CNE may include ITO, IZO, ITZO, aluminum (Al), or the like. As an example, the connection electrodes CNE may include a transparent conductive material, and the light emitted from the light emitting elements ED may be transmitted through the connection electrodes CNE and then emitted.

The third insulating layer PAS3 is disposed on the connection electrodes of the second connection electrode layer and the second insulating layer PAS2. The third insulating layer PAS3 may be entirely disposed on the second insulating layer PAS2 to cover the third connection electrode CNE3 and the fourth connection electrode CNE4, and the first connection electrode CNE1, the second connection electrode CNE2, and the fifth connection electrode CNE5 may be disposed on the third insulating layer PAS3. The third insulating layer PAS3 may be entirely disposed on the via layer VIA except for areas in which the third connection electrode CNE3 and the fourth connection electrode CNE4 are disposed. The third insulating layer PAS3 may insulate the connection electrodes of the first connection electrode layer and the connection electrodes of the second connection electrode layer from each other so that the connection electrodes of the first connection electrode layer and the connection electrodes of the second connection electrode layer are not in direct contact with each other.

According to an embodiment, the third insulating layer PAS3 may include a plurality of openings OP1, OP2, and OP4 and a plurality of contact holes (e.g., contact openings) CT1 and CT2. The third insulating layer PAS3 may include the plurality of openings OP1, OP3, and OP4 disposed to partially overlap the electrodes RME in the emission area EMA. The third insulating layer PAS3 may be entirely disposed on the second insulating layer PAS2 but may partially expose lower layers in portions at where the plurality of openings are formed.

The third insulating layer PAS3 may include a plurality of first openings OP1 and third openings OP3 overlapping the electrodes RME and exposing one end of the light emitting elements ED and a plurality of fourth openings OP4 that overlap the electrodes RME but do not overlap the light emitting elements ED. The plurality of first openings OP1, third openings OP3, and fourth openings OP4 may extend in the first direction DR1 and may be spaced apart from and face each other in the first direction DR1 and/or the second direction DR2. The openings OP1, OP3, and OP4 may partially overlap sides of the electrodes RME and the partition walls BP1, BP2, and BP3 extending in the first direction DR1, and the first openings OP1 and the third openings OP3 may also partially overlap the light emitting element ED disposed on the electrodes RME that are spaced apart from each other in the second direction DR2.

A description of shapes of the first openings OP1, the third openings OP3, and the fourth openings OP4 in the third insulating layer PAS3 in a plan view is the same as that of the openings in the second insulating layer PAS2 described above. In the display device 10, some of the openings OP1, OP2, OP3, and OP4 disposed in each sub-pixel SPXn may be openings penetrating through only the second insulating layer PAS2, and the others of the openings OP1, OP2, OP3, and OP4 may be openings penetrating through the second insulating layer PAS2 and the third insulating layer PAS3. For example, the first openings OP1, the third openings OP3, and the fourth openings OP4 may penetrate through the second insulating layer PAS2 and the third insulating layer PAS3, and the second openings OP2 may penetrate through only the second insulating layer PAS2. The third insulating layer PAS3 may cover the second openings OP2.

The third insulating layer PAS3 may include the first contact hole CT1 disposed in the sub-area SA and disposed to overlap the first electrode RME1 and the second contact hole CT2 disposed in the sub-area SA and disposed to overlap the second electrode RME2. The first contact hole CT1 and the second contact hole CT2 may penetrate through the third insulating layer PAS3 in addition to the first insulating layer PAS1 and the second insulating layer PAS2. The contact holes CT1 and CT2 may expose portions of upper surfaces of the electrodes RME disposed therebelow, respectively.

Another insulating layer may be further disposed on the third insulating layer PAS3. Such an insulating layer may protect members disposed on the first substrate SUB from an external environment.

Each of the first insulating layer PAS1, the second insulating layer PAS2, and the third insulating layer PAS3 described above may include an inorganic insulating material or an organic insulating material. As an example, each of the first insulating layer PAS1, the second insulating layer PAS2, and the third insulating layer PAS3 may include an inorganic insulating material, or the first insulating layer PAS1 and the third insulating layer PAS3 may include an inorganic insulating material while the second insulating layer PAS2 may include an organic insulating material. Each or at least one of the first insulating layer PAS1, the second insulating layer PAS2, and the third insulating layer PAS3 may have a structure in which a plurality of insulating layers are alternately or repeatedly stacked. In an embodiment, each of the first insulating layer PAS1, the second insulating layer PAS2, and the third insulating layer PAS3 may be made of any one of silicon oxide ($SiO_x$), silicon nitride ($SiN_x$), and silicon oxynitride ($SiO_xN_y$). All of the first insulating layer PAS1, the second insulating layer PAS2, and the third insulating layer PAS3 may be made of the same material, some of the first insulating layer PAS1, the second insulating layer PAS2, and the third insulating layer PAS3 may be made of the same material and the others thereof may be made of a different material, or all of the first insulating layer PAS1, the second insulating layer PAS2, and the third insulating layer PAS3 may be made of different materials.

The plurality of connection electrodes CNE may partially overlap the first to third openings OP1, OP2, and OP3 formed in the second insulating layer PAS2 and the third insulating layer PAS3 and may be in contact with the light emitting elements ED. For example, the first connection electrode CNE1 may be disposed to overlap the third opening OP3 disposed on the first electrode RME1, and the second connection electrode CNE2 may be disposed to overlap the first opening OP1 disposed on the second electrode RME2. The first extension part CN_E1 of the third connection electrode CNE3 may overlap the second opening OP2 disposed on the third electrode RME3 and the second extension part CN_E2 may overlap the second opening OP2 disposed on the first electrode RME1. The third extension part CN_E3 of the fourth connection electrode CNE4 may overlap the second opening OP2 disposed on the fourth electrode RME4 and the fourth extension part CN_E4 may overlap the second opening OP2 disposed on the second electrode RME2. The fifth extension part CN_E5 of the fifth connection electrode CNE5 may overlap the first opening OP1 disposed on the third electrode RME3 and the sixth extension part CN_E6 may overlap the third opening OP3 disposed on the fourth electrode RME4.

Each of the connection electrodes CNE is not disposed to correspond to each of the first to third openings OP1, OP2, and OP3, but portions of the connection electrodes CNE may overlap the first to third openings OP1, OP2, and OP3 and the other portions of the connection electrodes CNE may be disposed on the second insulating layer PAS2 or the third insulating layer PAS3. The connection electrodes CNE may extend in one direction while having a substantially constant width and may be disposed along steps of edges of the openings OP1, OP2, and OP3 at portions thereof overlapping the openings OP1, OP2, and OP3. The first to third openings OP1, OP2, and OP3 may be disposed to overlap some of the light emitting elements ED or to overlap the electrodes RME and edges of the partition walls BP1, BP2 and BP3. Accordingly, the edges of the openings OP1, OP2, and OP3 may have relatively great steps formed by arrangements of the electrodes RME and the light emitting elements ED, and portions of the connection electrodes CNE overlapping the edges of the openings OP1, OP2, and OP3 of the insulating layers PAS2 and PAS3 may be disconnected due to the steps, which is problematic.

For example, some of the connection electrodes CNE may be disposed from the emission area EMA across the bank layer BNL beyond both ends of the openings OP1, OP2, and OP3 in a direction in which the openings OP1, OP2, and OP3 extend. The connection electrodes CNE, of which portions are disposed on the bank layer BNL, may be connection electrodes CNE electrically connecting the light emitting elements ED to each other or electrically connecting the light emitting elements ED and the electrodes RME, and when portions of the corresponding connection electrodes CNE are disconnected, electrical signals may not be transferred to (e.g., may not reach) the light emitting elements ED of the sub-pixel SPXn.

According to an embodiment, in the display device 10, some of the openings OP1, OP2, and OP3 and some of the connection electrodes CNE may have a shape in which widths thereof are partially changed such that disconnection defects of the connection electrodes CNE that may occur at both ends of the openings OP1, OP2, and OP3 may be prevented or mitigated. The display device 10 may include openings (e.g., the first openings OP1) having a shape in which they extend in the first direction DR1 and having different widths at both ends (e.g., opposite ends) thereof in the first direction DR1. Connection electrodes CNE overlapping these openings from among the plurality of connection electrodes CNE may include a first portion P1 and a second portion P2 that have different widths.

Figure 14:
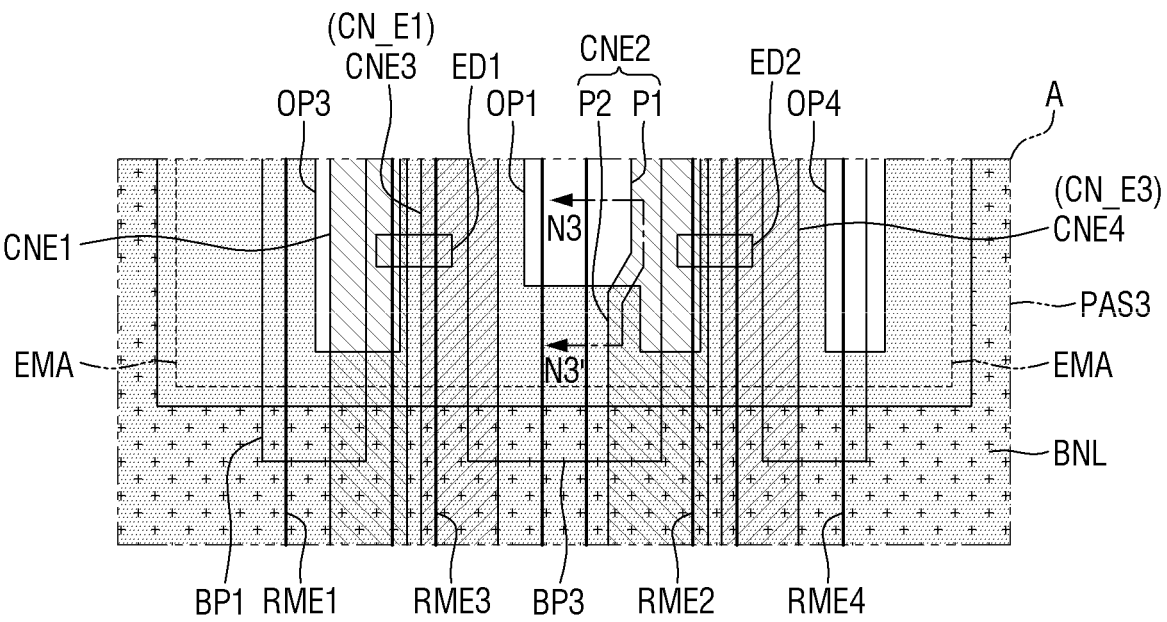
FIG. 14 is a plan view illustrating a third insulating layer and connection electrodes disposed in the portion A of FIG. 6.
Figure 15:
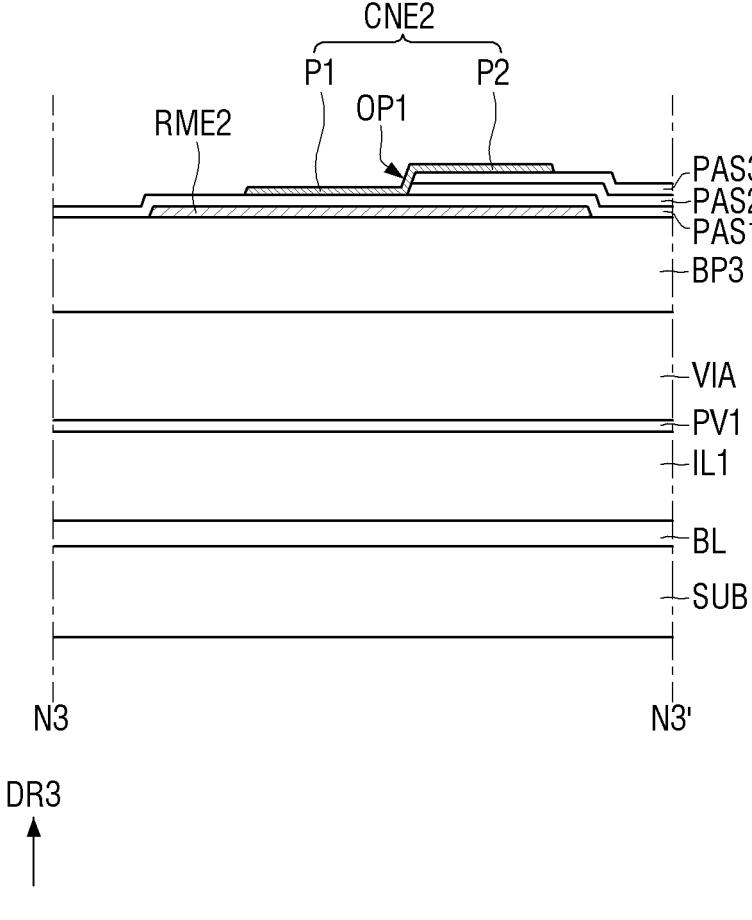
FIG. 15 is a cross-sectional view taken along the line N3-N3' of FIG. 14.

FIG. 14 is a plan view illustrating a third insulating layer and connection electrodes disposed in the portion A of FIG. 6, and FIG. 15 is a cross-sectional view taken along the line N3-N3' of FIG. 14.

FIG. 14 illustrates a relative arrangement of the first opening OP1 and the connection electrodes CNE at an edge of the emission area EMA of the sub-pixel SPXn according to an embodiment.

Referring to FIGS. 14 and 15 in conjunction with FIGS. 7 to 11, each of the first openings OP1 in the plurality of openings may have a first side portion adjacent to the bank layer BNL and a second side portion adjacent to the central portion of the emission area EMA as both ends (e.g., opposite ends) thereof in the first direction DR1. A width of the first side portion of the first opening OP1 measured in the second direction DR2 may be smaller than that of the second side portion. The first side portion of the first opening OP1 may have a smaller width than the second side portion thereof. The first side portion of the first opening OP1 may be positioned so that one side thereof is adjacent to the light emitting elements ED. For example, one side of each of the first side portion and the second side portion of the first opening OP1 adjacent to portions where the light emitting elements ED are disposed may be parallel to each other in the first direction DR1, while the other side of each of the first side portion and the second side portion of the first opening OP1 opposite to the one side may not be parallel to each other. The first opening OP1 may have a shape in which the other side of the first side portion is depressed inwardly from the other side of the second side portion and a side extending from the other side of the second side portion.

Similar to the connection electrode CNE overlapping the first openings OP1 from among the connection electrodes CNE, the second connection electrode CNE2 and the fifth extension part CN_E5 of the fifth connection electrode CNE5 may overlap at least one side portions of the first openings OP1 in the first direction DR1. The second connection electrode CNE2 and the fifth extension part CN_E5 of the fifth connection electrode CNE5 may be connection electrodes disposed across (e.g., extending across) the emission area EMA and the bank layer BNL and may be disposed to pass through the first side portions of the first openings OP1 having a decreasing (e.g., a relatively smaller) width. Each of the second connection electrode CNE2 and the fifth extension part CN_E5 of the fifth connection electrode CNE5 may have a first portion P1 and a second portion P2 having a greater width than the first portion P1. The first side portion having a relatively small width from among both side portions of the first opening OP1 may overlap the second portion P2 having a greater width in the connection electrode CNE. The connection electrode CNE may include the second portion P2 of which the width increases while passing through (or over) the first side portion having the small width in the first opening OP1. The second connection electrode CNE2 and the fifth extension part CN_E5 of the fifth connection electrode CNE5 may have a shape in which they substantially extend in the first direction DR1 and may have a shape in which widths thereof increase at portions thereof overlapping the first side portions of the first openings OP1.

Portions of the connection electrodes CNE of the display device 10 may be disposed to correspond to the openings OP1, OP2, and OP3 of the insulating layers PAS2 and PAS3. The portions of the connection electrodes CNE disposed to correspond to the openings OP1, OP2, and OP3 may be disposed along steps of lower layers exposed by the openings OP1, OP2, and OP3. Some of the connection electrodes CNE may include portions extending in the first direction DR1 while covering the steps formed due to the openings OP1, OP2, and OP3. The portions of the connection electrodes CNE extending in the first direction DR1 may overlap the openings OP1, OP2, and OP3 but may be disposed along steps formed due to the light emitting elements ED disposed in an agglomerated state, and portions of the connection electrodes CNE may be disconnected due to the steps.

In the display device 10 according to an embodiment, some connection electrodes CNE may have a shape in which they include the portions P1 and P2 having different widths, and disconnections of some connection electrodes CNE due to the steps formed at portions exposed by the openings OP1, OP2, and OP3 may be prevented or mitigated. For example, the first side portion having the small width in the first opening OP1 and the second portion P2 having the greater width in the connection electrode CNE are disposed to overlap each other, and thus, the portion of the connection electrode CNE having the greater width may pass through (or over) a step of the insulating layers PAS2 and PAS3 formed by the first opening OP1. A portion of the second portion P2 of the connection electrode CNE may not overlap the opening OP1 in a width direction and may be disposed on an insulating layer, for example, the third insulating layer PAS3, and the other portion of the second portion P2 of the connection electrode CNE in the width direction may overlap the first opening OP1. Thus, even though the connection electrode CNE extends in the first direction DR1 and a portion of the connection electrode CNE is disconnected at a step of the first side portion of the first opening OP1, the second portion P2 having the greater width in the connection electrode CNE may bypass a portion having a great step at the first side portion of the first opening OP1. Accordingly, a portion of the connection electrode CNE extending in the first direction DR1 may not be disconnected in the direction in which the connection electrode CNE extends.

For example, the second connection electrode CNE2 is disposed so that the second portion P2 overlaps the first side portion of the first opening OP1 disposed on the lower side of the emission area EMA, and thus, a disconnection defect of the second connection electrode CNE2 when the second connection electrode CNE2 is disposed to extend from the emission area EMA to the sub-area SA may be prevented. In addition, the fifth extension part CN_E5 of the fifth connection electrode CNE5 is also disposed so that the second portion P2 overlaps the first side portion of the first opening OP1 disposed on the upper side of the emission area EMA, and thus, a disconnection defect of the fifth connection electrode CNE5 when the fifth connection electrode CNE5 extends to a portion above the bank layer BNL may be prevented.

When the second connection electrode CNE2 and the fifth connection electrode CNE5 are partially disconnected, the corresponding sub-pixel SPXn may not emit light because the light emitting elements ED are not electrically connected to each other. In the display device 10, by adjusting widths of the openings OP1, OP2, and OP3 in the insulating layers PAS2 and PAS3 and widths of the connection electrodes CNE passing through these openings OP1, OP2, and OP3 in portions where the disconnections of the connection electrodes CNE may occur in each sub-pixel SPXn, the disconnection defects of the connection electrodes CNE may be prevented.

It has been illustrated in the drawings that each of the second connection electrode CNE2 and the fifth extension part CN_E5 of the fifth connection electrode CNE5 includes the first portion P1 and the second portion P2 that have the different widths and the other connection electrodes CNE and the openings OP2, OP3, and OP4 have relatively constant widths at portions thereof extending in the first direction DR1. However, the disclosure is not limited thereto, and the widths of the connection electrodes CNE may be adjusted to prevent the disconnection defects of the connection electrodes CNE as described above and all of the openings OP1, OP2, OP3, and OP4, and the connection electrodes CNE may have a shape in which widths thereof are changed regardless of their positions.

In an embodiment, the openings OP1, OP2, and OP3 and the connection electrodes CNE of which the widths are to be adjusted as described above may be openings OP1, OP2, and OP3 and connection electrodes CNE disposed relatively inside in the corresponding sub-pixel SPXn. As an example, the openings OP1, OP2, OP3, and OP4 and the connection electrodes CNE, of which the widths are to be adjusted, may overlap the third partition wall BP3 or any one of the second electrode RME2 and the third electrode RME3.

From among the openings OP1, OP2, OP3, and OP4 overlapping the third partition wall BP3, some of the first openings OP1 and the second openings OP2 may have a shape in which both side portions thereof in the first direction DR1 have different widths, as illustrated in FIG. 14. From among the connection electrodes CNE overlapping the third partition wall BP3, the second connection electrode CNE2, the first extension part CN_E1 of the third connection electrode CNE3, the fourth extension part CN_E4 of the fourth connection electrode CNE4, and the fifth extension part CN_E5 of the fifth connection electrode CNE5 may have a shape in which widths thereof are changed by including the first portions P1 and the second portions P2. As described later in connection with another embodiment, connection electrodes CNE disposed relatively outside may include bypass parts PE (see, e.g., FIG. 17) disposed on the bank layer BNL to ensure that the corresponding sub-pixel SPXn emits light even portions of the connection electrodes CNE are disconnected. On the other hand, it may be relatively difficult to form disconnection prevention structures as the bypass parts PE in the connection electrodes CNE disposed relatively inside, and thus, the connection electrodes CNE disposed relatively inside may have a shape in which widths thereof are changed. A detailed description thereof will be provided later with reference to another embodiment.

Figure 16:
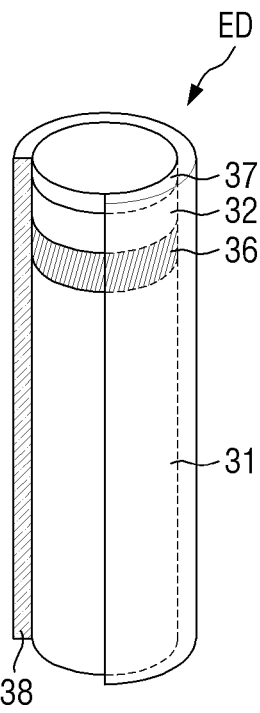
FIG. 16 is a schematic view of a light emitting element according to an embodiment.

FIG. 16 is a schematic view of a light emitting element according to an embodiment.

Referring to FIG. 16, the light emitting element ED may be a light emitting diode. For example, the light emitting element ED may be an inorganic light emitting diode having a size of a nanometer to a micrometer scale and made of an inorganic material. The light emitting element ED may be aligned between two electrodes in which polarities are formed when an electric field is formed in a specific direction between the two electrodes facing each other.

The light emitting element ED according to an embodiment may have a shape in which it extends in one direction. The light emitting element ED may have a cylindrical shape, a rod shape, a wire shape, or a tube shape. However, the light emitting element ED is not limited to having the shapes described above and may have various shapes. For example, the light emitting element ED may have a polygonal prismatic shape, such as a cubic shape, a rectangular parallelepiped shape, or a hexagonal prismatic shape, or may have a shape that extends in one direction but has partially inclined outer surfaces.

The light emitting element ED may include a semiconductor layer doped with any conductivity-type (e.g., p-type or n-type) dopant. The semiconductor layer may receive an electrical signal applied from an external power source to emit light of a specific wavelength band. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of $Al_x$-$Ga_yIn_{1-x-y}N$ ($0{\leq}x{\leq}1$, $0{\leq}y{\leq}1$, and $0{\leq}x+y{\leq}1$). For example, the semiconductor material of the first semiconductor layer 31 may be one or more of AlGaInN, GaN, AlGaN, InGaN, AlN, and InN doped with an n-type dopant. The n-type dopant doped in the first semiconductor layer 31 may be Si, Ge, Sn, Se, or the like.

The second semiconductor layer 32 is disposed on the first semiconductor layer 31 with the light emitting layer 36 interposed therebetween. The second semiconductor layer 32 may be a p-type semiconductor and may include a semiconductor material having a chemical formula of $Al_x$-$Ga_yIn_{1-x-y}N$ ($0{\leq}x{\leq}1$, $0{\leq}y{\leq}1$, and $0{\leq}x+y{\leq}1$). For example, the semiconductor material of the second semiconductor layer 32 may be one or more of AlGaInN, GaN, AlGaN, InGaN, AlN, and InN doped with a p-type dopant. The p-type dopant doped in the second semiconductor layer 32 may be Mg, Zn, Ca, Ba, or the like.

In FIG. 16, each of the first semiconductor layer 31 and the second semiconductor layer 32 is configured as one layer, but the disclosure is not limited thereto. Each of the first semiconductor layer 31 and the second semiconductor layer 32 may include a greater number of layers, for example, a clad layer or a tensile strain barrier reducing (TSBR) layer, depending on a material of the light emitting layer 36. For example, the light emitting element ED may further include another semiconductor layer disposed between the first semiconductor layer 31 and the light emitting layer 36 or between the second semiconductor layer 32 and the light emitting layer 36. The semiconductor layer disposed between the first semiconductor layer 31 and the light emitting layer 36 may be made of one or more of AlGaInN, GaN, AlGaN, InGaN, AlN, InN, and SLs doped with an n-type dopant, and the semiconductor layer disposed between the second semiconductor layer 32 and the light emitting layer 36 may be made of one or more of AlGaInN, GaN, AlGaN, InGaN, AlN, and InN doped with a p-type dopant.

The light emitting layer 36 may be disposed between the first semiconductor layer 31 and the second semiconductor layer 32. The light emitting layer 36 may include a material having a single or multiple quantum well structure. When the light emitting layer 36 includes the material having the multiple quantum well structure, the light emitting layer 36 may have a structure in which a plurality of quantum layers and well layers are alternately stacked. The light emitting layer 36 may emit light by combining electron-hole pairs according to electrical signals applied through the first semiconductor layer 31 and the second semiconductor layer 32. The light emitting layer 36 may include a material such as AlGaN, AlGaInN, or InGaN. For example, when the light emitting layer 36 has the multiple quantum well structure, that is, the structure in which the quantum layers and the well layers are alternately stacked, the quantum layers may include a material such as AlGaN or AlGaInN and the well layers may include a material such as GaN or AlInN.

The light emitting layer 36 may have a structure in which semiconductor materials having large band gap energy and semiconductor materials having small band gap energy are alternately stacked and may include other Group III to Group V semiconductor materials depending on a wavelength band of emitted light. The light emitted by the light emitting layer 36 is not limited to light of a blue wavelength band, and in some embodiments, the light emitting layer 36 may also emit light of red and green wavelength bands.

The electrode layer 37 may be an ohmic connection electrode. However, the disclosure is not limited thereto, and the electrode layer 37 may also be a Schottky connection electrode. The light emitting element ED may include at least one electrode layer 37. The light emitting element ED may include one or more electrode layers 37, but the disclosure is not limited thereto. In some embodiments, the electrode layers 37 may be omitted.

The electrode layer 37 may decrease resistance between the light emitting element ED and the electrode or the connection electrode when the light emitting element ED is electrically connected to the electrode or the connection electrode in the display device 10. The electrode layer 37 may include a conductive metal. The electrode layer 37 may include at least one of aluminum (Al), titanium (Ti), indium (In), gold (Au), silver (Ag), ITO, IZO, and ITZO.

The insulating film 38 is disposed to surround outer surfaces of the plurality of semiconductor layers and the electrode layer, described above. For example, the insulating film 38 may be disposed to surround at least an outer surface of the light emitting layer 36 but may expose both ends (e.g., opposite ends) of the light emitting element ED in a length direction. In addition, the insulating film 38 may be formed so that an upper surface thereof is rounded in a cross section in an area adjacent to at least one end of the light emitting element ED.

The insulating film 38 may include at least one insulating material, such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). In FIG. 16, the insulating film 38 is formed as a single layer, but the disclosure is not limited thereto and, in some embodiments, the insulating film 38 may be formed as a multilayer structure in which a plurality of layers are stacked.

The insulating film 38 may protect the semiconductor layers and the electrode layer of the light emitting element ED. The insulating film 38 may prevent an electrical short-circuit that may occur in the light emitting layer 36 when the light emitting layer 36 directly contacts an electrode through which an electrical signal is transferred to the light emitting element ED. In addition, the insulating film 38 may ensure (or maintain) luminous efficiency of the light emitting element ED.

In addition, an outer surface of the insulating film 38 may be surface-treated. The light emitting elements ED may be jetted (or deposited) onto and aligned on electrodes in a state in which they are dispersed in an ink (e.g., a predetermined ink). To maintain the light emitting elements ED in a state in which the light emitting elements ED are dispersed without being agglomerated with other adjacent light emitting elements ED in the ink, a surface of the insulating film 38 may undergo a hydrophobic or hydrophilic treatment.

Hereinafter, other embodiments of the display device 10 will be described with reference to other drawings.

Figure 17:
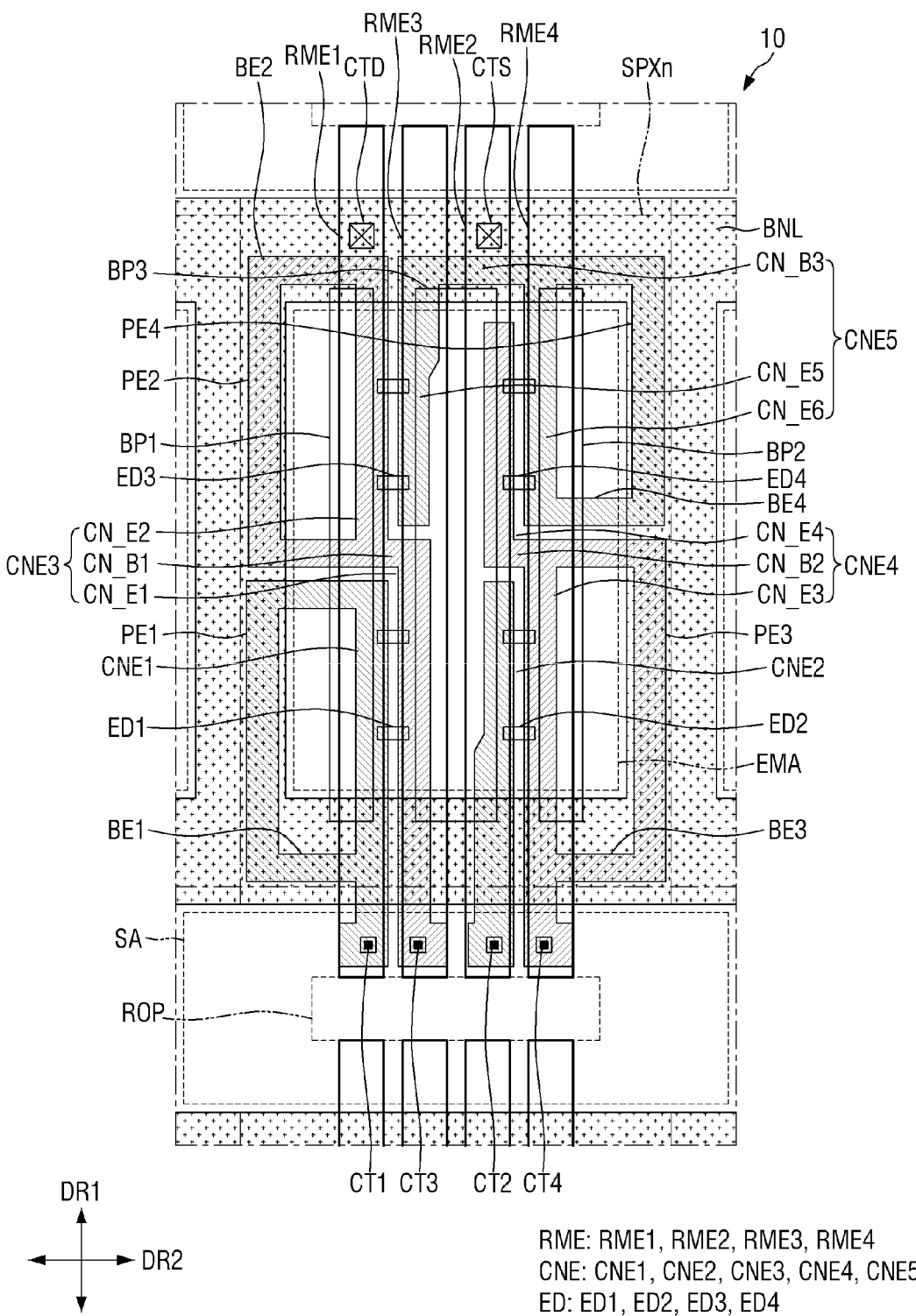
FIG. 17 is a plan view of one sub-pixel of a display device according to another embodiment.

FIG. 17 is a plan view of one sub-pixel of a display device according to another embodiment.

Referring to FIG. 17, in a display device 10 according to another embodiment, some of the connection electrodes CNE may further include bypass parts PE1, PE2, PE3, and PE4 and bridge parts BE1, BE2, BE3, and BE4 disposed on the bank layer BNL. The bypass parts PE1, PE2, PE3, and PE4 and the bridge parts BE1, BE2, BE3, and BE4 may be connected to parts of the connection electrodes CNE in contact with the light emitting elements ED or main parts of the connection electrodes CNE, may be disposed on the bank layer BNL, and may prevent electrical connection failures due to disconnections that may occur in the main parts. This embodiment is different from the embodiment shown in FIG. 6 in that some of the connection electrodes CNE further include the bypass parts PE1, PE2, PE3, and PE4 and the bridge parts BE1, BE2, BE3 and BE4. Hereinafter, an overlapping description will be omitted or simplified, and contents different from those described above will be primarily described.

The first connection electrode CNE1 may include a first bypass part PE1 and a first bridge part BE1 that are disposed on the bank layer BNL, in addition to a part disposed in the emission area EMA and in contact with the light emitting elements ED or a main part. The first bypass part PE1 may be disposed to be spaced apart from the main part of the first connection electrode CNE1 in the second direction DR2 and to extend in the first direction DR1 on the bank layer BNL. The first bridge part BE1 may extend in the second direction DR2 to connect the main part and the first bypass part PE1 of the first connection electrode CNE1 to each other. The main part, the first bypass part PE1, and the first bridge part BE1 of the first connection electrode CNE1 may be integrally formed with each other.

Similarly, the third connection electrode CNE3, the fourth connection electrode CNE4, and the fifth connection electrode CNE5 may include bypass parts PE2, PE3, and PE4 and bridge parts BE2, BE3, and BE4, respectively. The third connection electrode CNE3 may include a second bypass part PE2 spaced apart from the second extension part CN_E2 in the second direction DR2 and a second bridge part BE2 connecting the second extension part CN_E2 and the second bypass part PE2 to each other. The fourth connection electrode CNE4 may include a third bypass part PE3 spaced apart from the third extension part CN_E3 in the second direction DR2 and a third bridge part BE3 connecting the third extension part CN_E3 and the third bypass part PE3 to each other. The fifth connection electrode CNE5 may include a fourth bypass part PE4 spaced apart from the sixth extension part CN_E6 in the second direction DR2 and a fourth bridge part BE4 connecting the sixth extension part CN_E6 and the fourth bypass part PE4 to each other.

In the display device 10, the light emitting elements ED may be aligned in the emission area EMA, and the connection electrodes CNE may be then formed to electrically connect the light emitting elements ED to the electrodes RME or lower circuit layers. When some light emitting elements ED are disposed between the partition walls BP1, BP2, and BP3 in a state in which they are partially agglomerated, the main parts of the connection electrodes CNE disposed on some light emitting elements ED may be partially disconnected. In this case, electrical signals may not be transferred to portions that are not electrically connected to the electrodes RME through the contact holes CT1, CT2, CT3, and CT4 at where the main parts are disconnected and light emitting elements ED disposed in these portions may not emit light. To prevent such a problem, the connection electrodes CNE may include the bypass parts PE1, PE2, PE3, and PE4 and the bridge parts BE1, BE2, BE3, and BE4 that are connected to the main parts. Therefore, even though portions of the main parts are disconnected, electrical signals may be transferred to the main parts except for the disconnected portions. Different from the main parts, the bypass parts PE1, PE2, PE3, and PE4 and the bridge parts BE1, BE2, BE3, and BE4 may be disposed on an area in which the light emitting elements ED are not disposed, for example, the bank layer BNL, and thus, disconnections of the bypass parts PE1, PE2, PE3, and PE4 and the bridge parts BE1, BE2, BE3, and BE4 due to the light emitting elements ED may not occur.

In the display device 10, some of the connection electrodes CNE and the openings OP1, OP2, and OP3 may have a shape in which widths thereof are varied, and some of the connection electrodes CNE may include the bypass parts PE1, PE2, PE3, and PE4 and the bridge parts BE1, BE2, BE3, and BE4, and thus, disconnection defects of the connection electrodes CNE due to the light emitting elements ED may be prevented or mitigated. In addition, in the display device 10, the occurrence of dark spots in the sub-pixels SPXn and defects in amounts of emitted light may be prevented.

Figure 18:
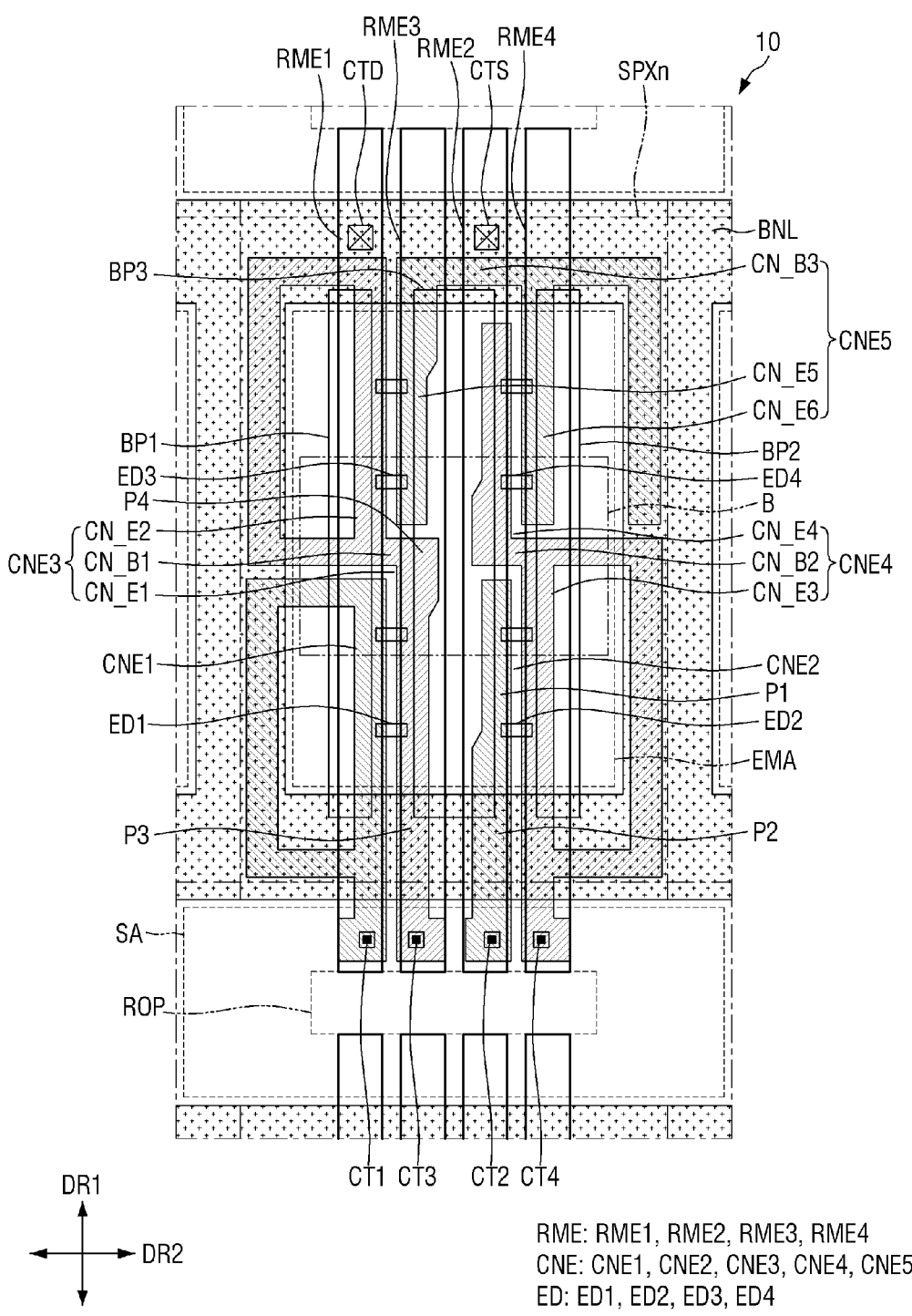
FIG. 18 is a plan view of one sub-pixel of a display device according to another embodiment.
Figure 19:
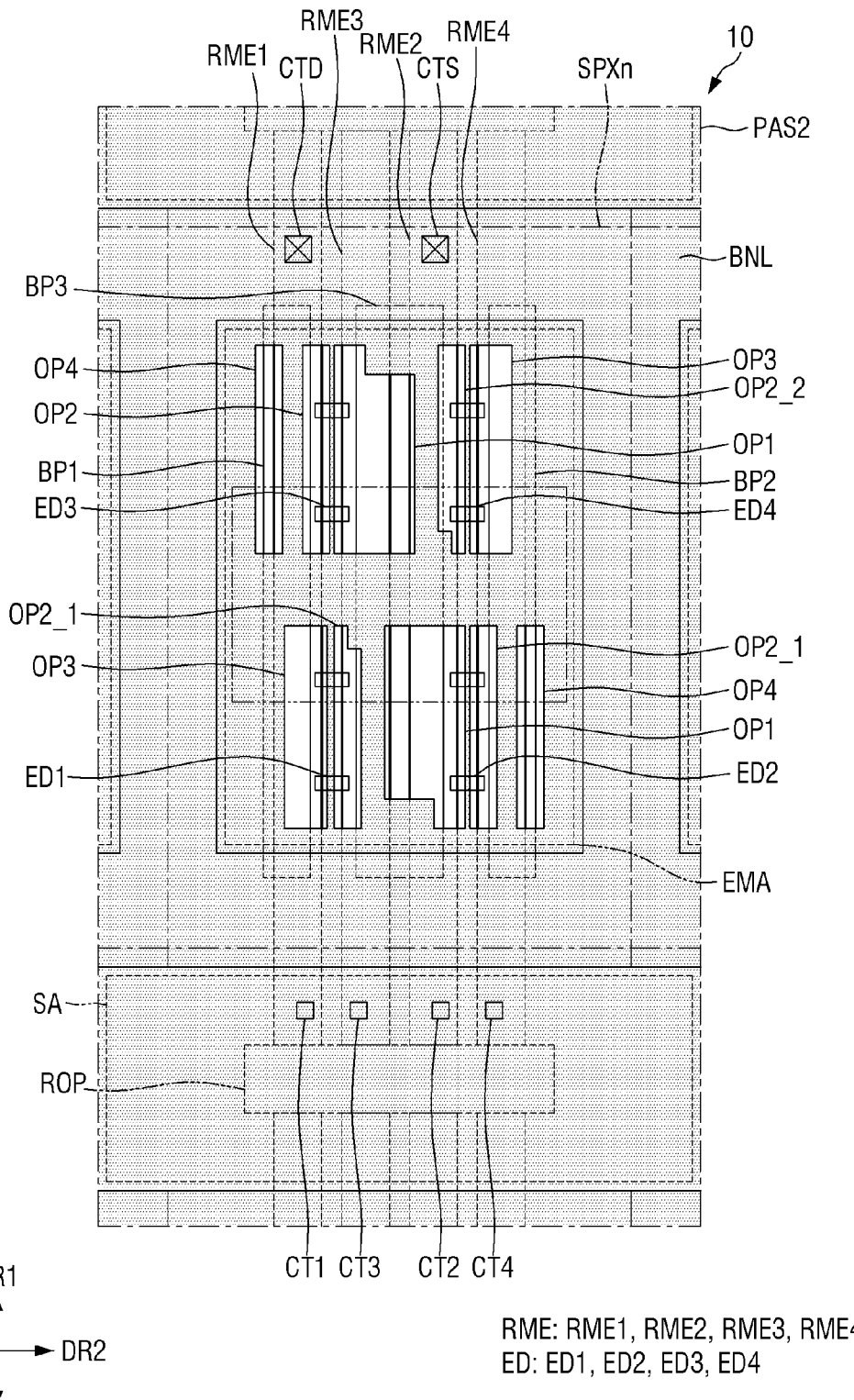
FIG. 19 is a plan view illustrating a second insulating layer disposed in one sub-pixel shown in FIG. 18.
Figure 20:
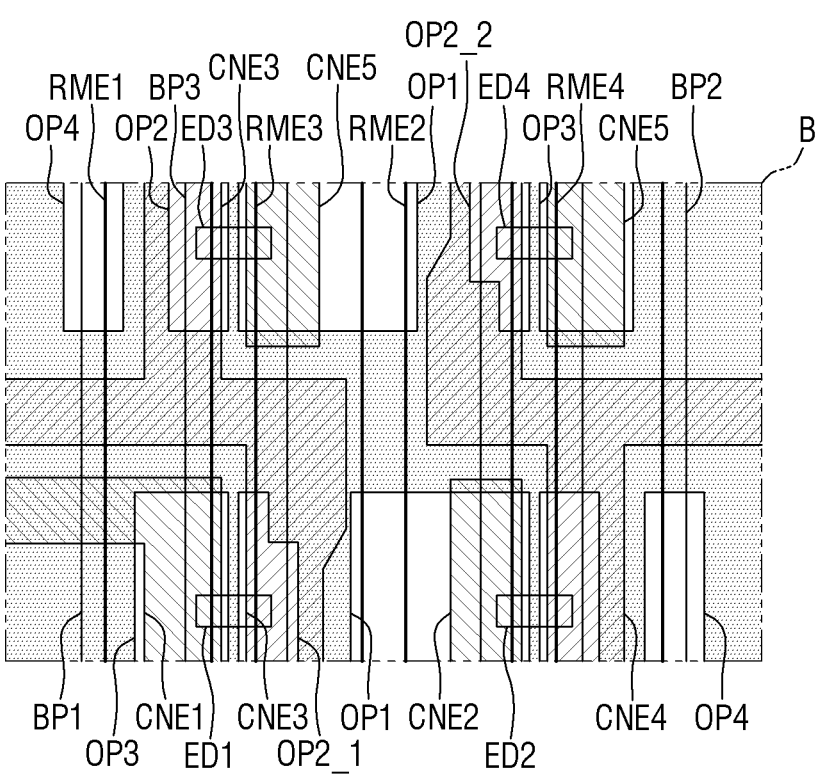
FIG. 20 is a plan view illustrating a second insulating layer and connection electrodes disposed in the portion B of FIG. 18.

FIG. 18 is a plan view of one sub-pixel of a display device according to another embodiment, and FIG. 19 is a plan view illustrating a second insulating layer disposed in one sub-pixel shown in FIG. 18, and FIG. 20 is a plan view illustrating a second insulating layer and connection electrodes disposed in the portion B of FIG. 18.

Referring to FIGS. 18 to 20, in a display device 10 according to another embodiment, some of second openings OP2_1 and the other connection electrodes CNE may also have shapes in which widths thereof are partially different from each other. As compared with an embodiment shown in FIG. 14, in the embodiment, a second opening OP2_1 overlapping the third electrode RME3 and a second opening OP2_2 overlapping the second electrode RME2 may have different widths at both side portions thereof in the first direction DR1. Similar to connection electrodes CNE overlapping the second openings OP2_1 and OP2_2, each of the first extension part CN_E1 of the third connection electrode CNE3 and the fourth extension part CN_E4 of the fourth connection electrode CNE4 may also include a first portion P1 and a second portion P2 having different widths.

The second openings OP2_1 and OP2_2 overlapping the third partition wall BP3 from among the second openings OP2 may also have different widths at a first side portion and a second side portion, which are both side portions (e.g., opposite side portions) thereof in the first direction DR1. However, different from the first openings OP1, the second openings OP2_1 and OP2_2 may have a shape in which the first side portion adjacent to the bank layer BNL has a greater width than the second side portion adjacent to the center of the emission area EMA. For example, positions of side portions having a small width in the second openings OP2_1 and OP2_2 may be opposite to those in the first openings OP1.

The first extension part CN_E1 of the third connection electrode CNE3 and the fourth extension part CN_E4 of the fourth connection electrode CNE4 that overlap the second openings OP2_1 and OP2_2, respectively, may not be disposed on the bank layer BNL. The first extension part CN_E1 of the third connection electrode CNE3 may be disposed on the lower side of the emission area EMA and may be integrated with the second extension part CN_E2 through the first connection part CN_B1. When a portion of the first extension part CN_E1 is disconnected due to a step formed by the second opening OP2_1, an electrical connection between the first light emitting elements ED1 and the third light emitting elements ED3 may be cut off. To prevent such a problem, the second opening OP2_1 disposed on the lower side of the emission area EMA, of the second openings OP2 overlapping the third electrode RME3, may have a shape in which a width of one side portion thereof is small, and the first extension part CN_E1 may have a shape in which a width thereof is changed.

Similarly, the fourth extension part CN_E4 of the fourth connection electrode CNE4 may be disposed on the upper side of the emission area EMA and may be integrated with the third extension part CN_E3 through the second connection part CN_B2. When a portion of the fourth extension part CN_E4 is disconnected due to a step formed by the second opening OP2_2, an electrical connection between the fourth light emitting elements ED4 and the second light emitting elements ED2 may be cut off. To prevent such a problem, the second opening OP2_2 disposed on the upper side of the emission area EMA, of the second openings OP2 overlapping the second electrode RME2, may have a shape in which a width of one side portion thereof is small, and the fourth extension part CN_E4 may have a shape in which a width thereof is changed.

In the display device 10 described above, four electrodes RME1, RME2, RME3, and RME4 may be disposed for each sub-pixel SPXn. However, the disclosure is not limited thereto, and an arrangement of the electrodes RME of the display device 10 and arrangements of the openings OP1, OP2, OP3, and OP4 and the light emitting elements ED may be variously modified. However, even though the arrangements of the electrodes RME and the openings OP1, OP2, OP3, and OP4 are modified, the connection electrodes CNE may have a shape in which widths thereof are changed in order to prevent disconnections thereof.

Figure 21:
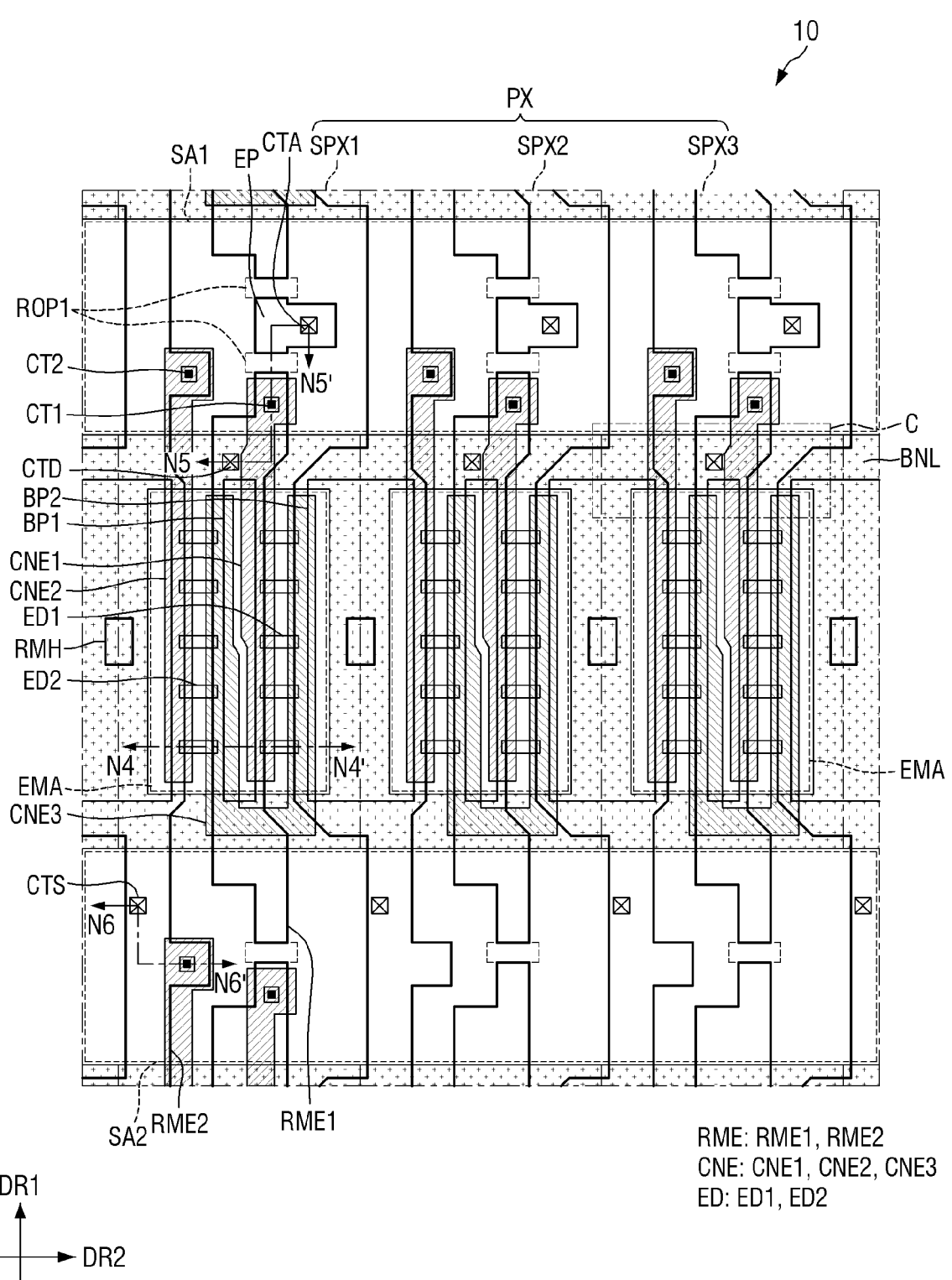
FIG. 21 is a plan view of one pixel of a display device according to an embodiment.

FIG. 21 is a plan view of one pixel of a display device according to another embodiment.

FIG. 21 illustrates a layout, in a plan view, of electrodes RME1 and RME2, partition walls BP1 and BP2, a bank layer BNL, light emitting elements ED1 and ED2, and connection electrodes CNE1, CNE2, and CNE3 disposed in one pixel PX of a display device 10.

Referring to FIG. 21, the display device 10 may be different from the display devices according to the above-described embodiments in structures of the electrodes RME, the connection electrodes CNE, and the partition walls BP1 and BP2. Hereinafter, a description of contents overlapping those of the above-described embodiments will be omitted or simplified, and contents different from those of the above-described embodiments will be primarily described.

Figure 22:
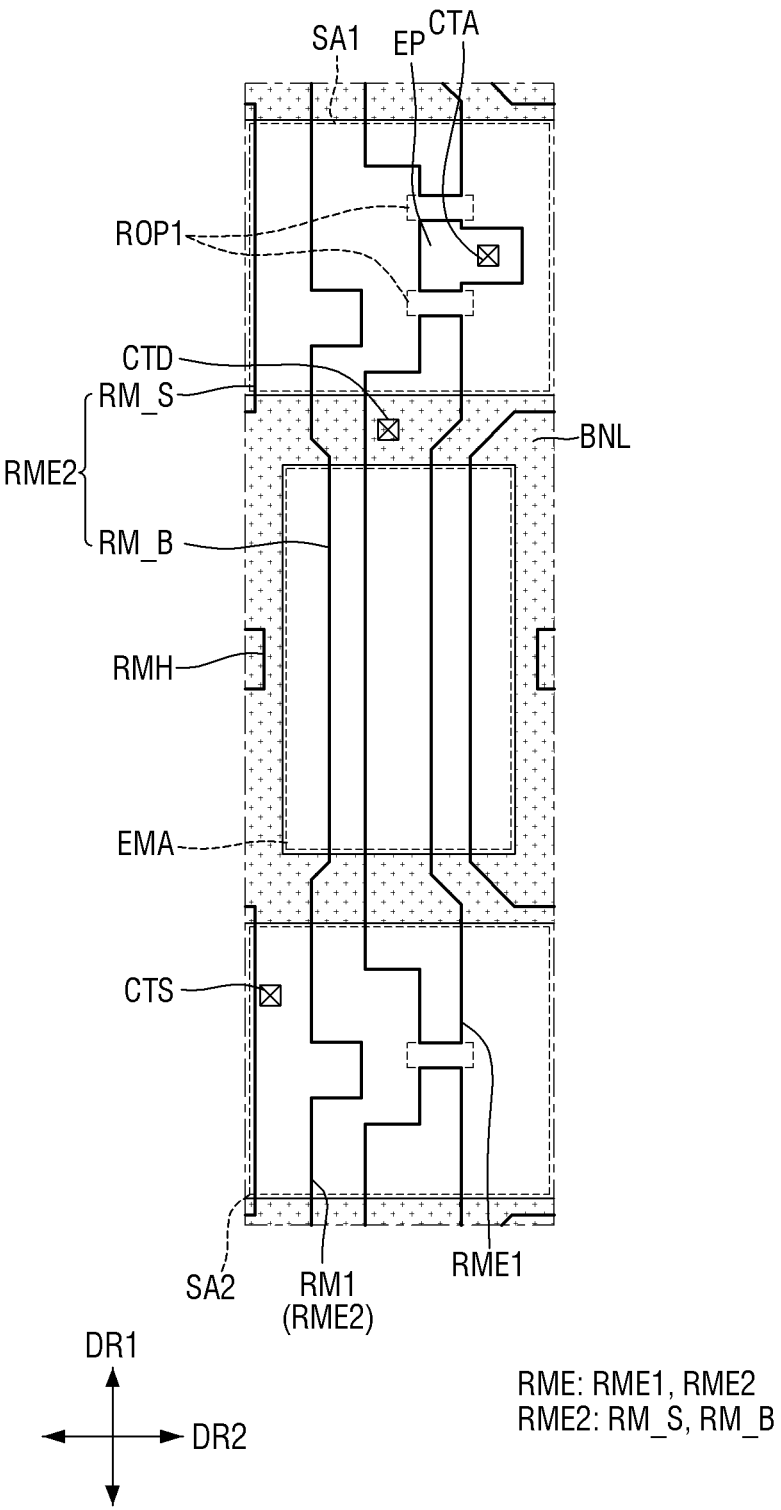
FIG. 22 is a plan view illustrating electrodes and a bank layer disposed in one pixel shown in FIG. 21.
Figure 23:
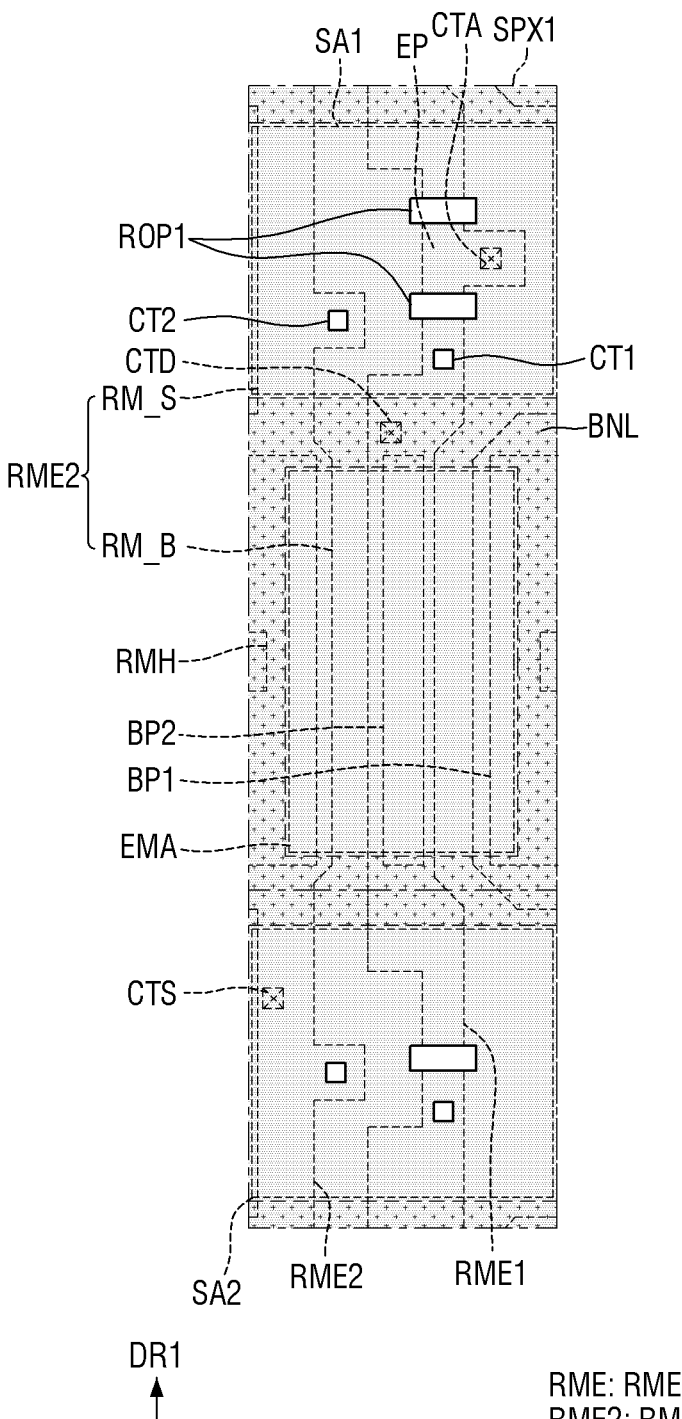
FIG. 23 is a plan view illustrating a first insulating layer disposed in one pixel shown in FIG. 21.
Figure 24:
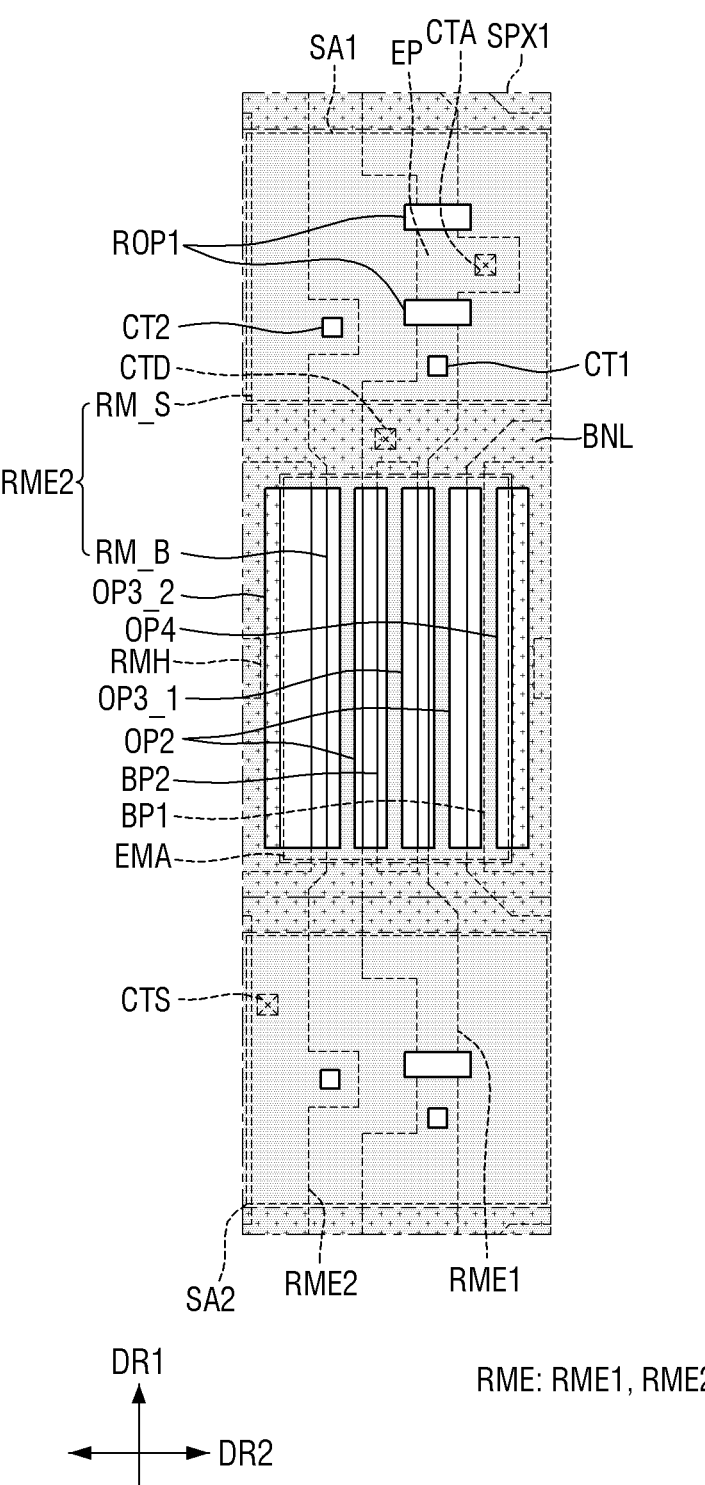
FIG. 24 is a plan view illustrating a second insulating layer disposed in one pixel shown in FIG. 21.
Figure 25:
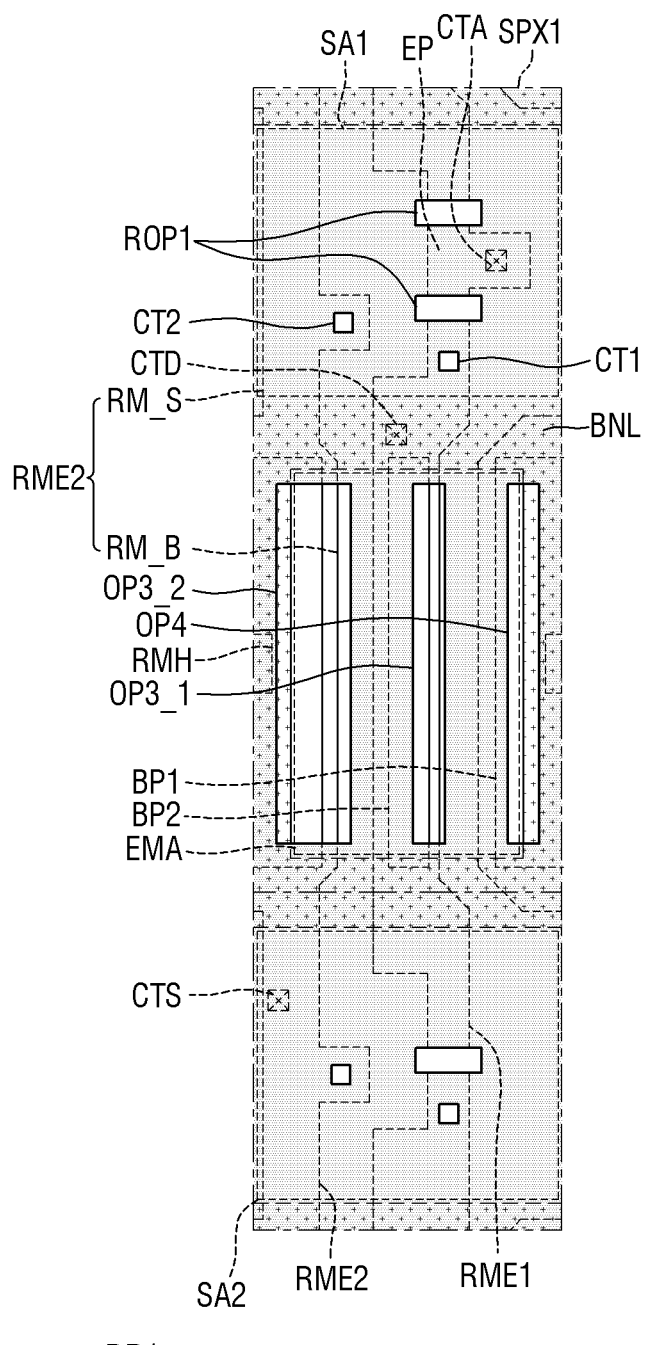
FIG. 25 is a plan view illustrating a third insulating layer disposed in one pixel shown in FIG. 21.
Figure 25:
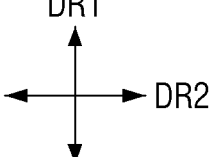
Figure 26:
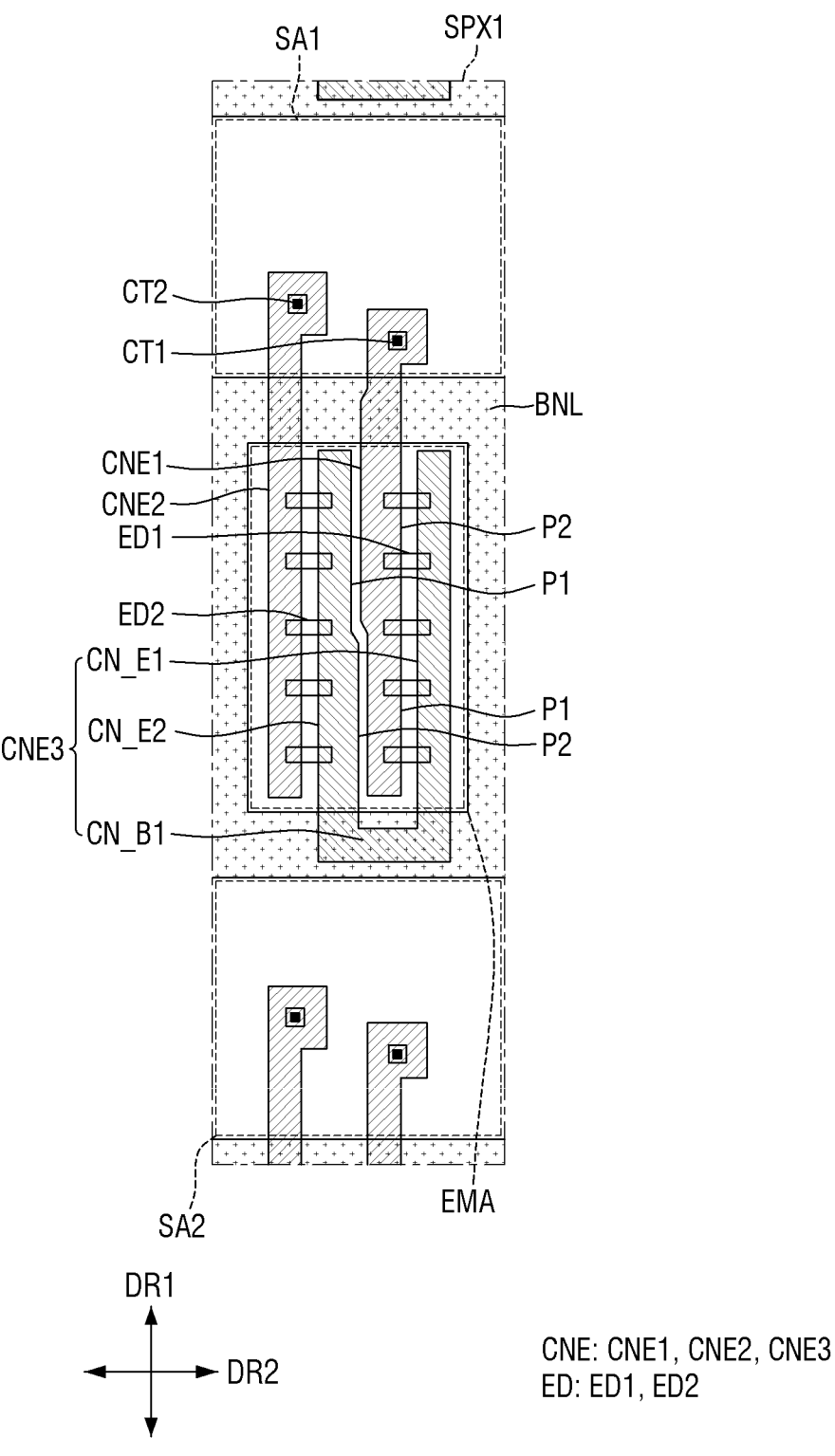
FIG. 26 is a plan view illustrating connection electrodes disposed in one pixel shown in FIG. 21.
Figure 27:
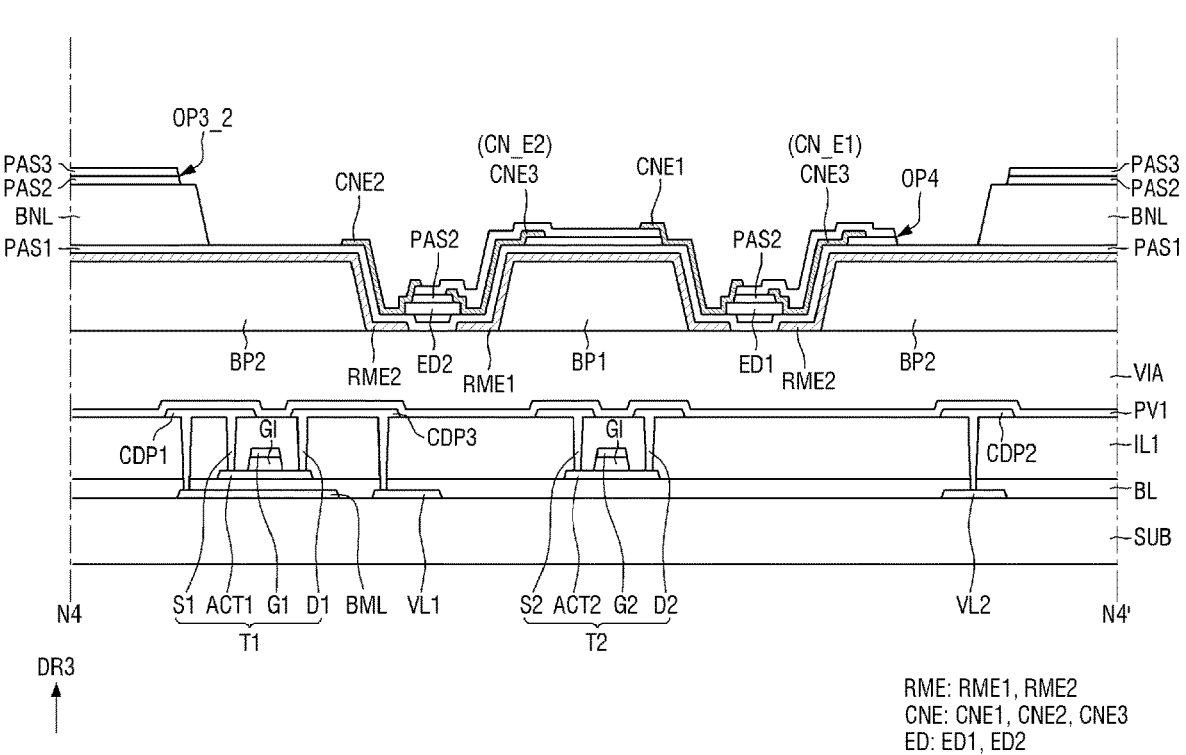
FIG. 27 is a cross-sectional view taken along the line N4-N4' of FIG. 21.
Figure 28:
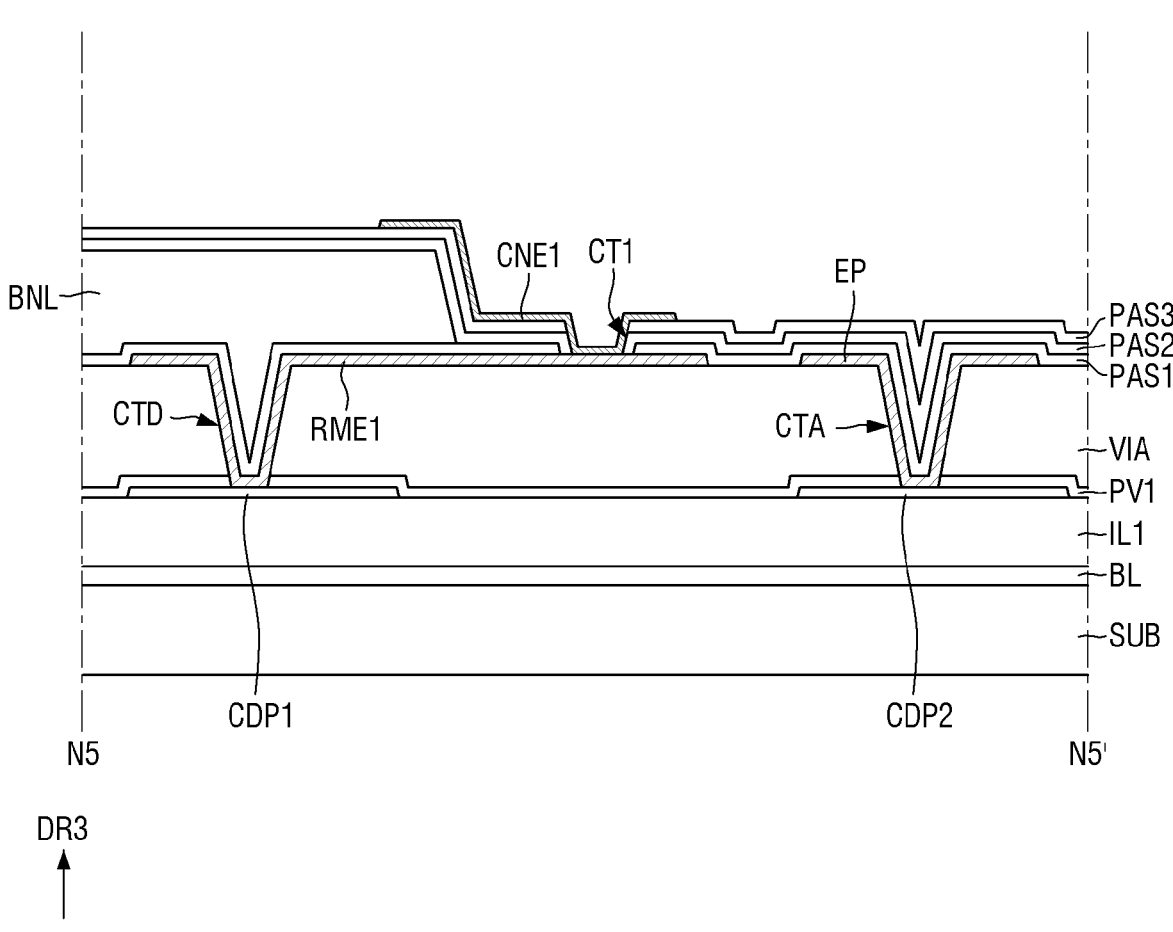
FIG. 28 is a cross-sectional view taken along the line N5-N5' of FIG. 21.
Figure 29:
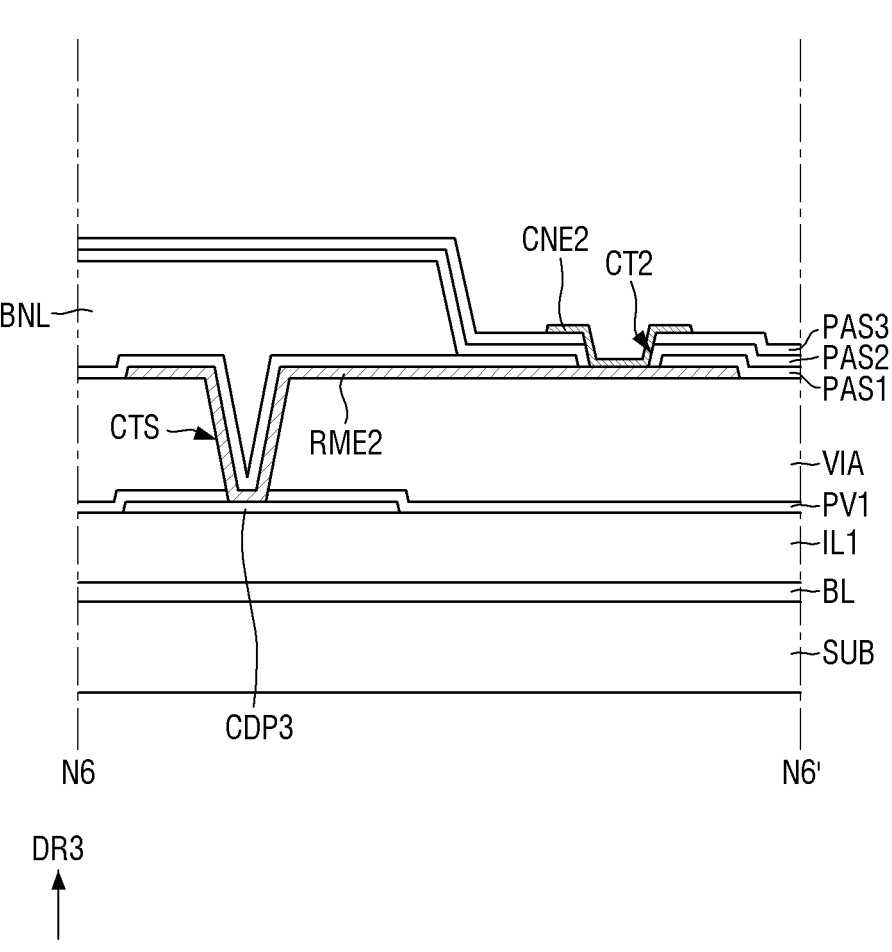
FIG. 29 is a cross-sectional view taken along the line N6-N6' of FIG. 21.

FIG. 22 is a plan view illustrating electrodes and a bank layer disposed in one pixel shown in FIG. 21, FIG. 23 is a plan view illustrating a first insulating layer disposed in one pixel shown in FIG. 21, FIG. 24 is a plan view illustrating a second insulating layer disposed in one pixel shown in FIG. 21, FIG. 25 is a plan view illustrating a third insulating layer disposed in one pixel shown in FIG. 21, FIG. 26 is a plan view illustrating connection electrodes disposed in one pixel shown in FIG. 21, FIG. 27 is a cross-sectional view taken along the line N4-N4' of FIG. 21, FIG. 28 is a cross-sectional view taken along the line N5-N5' of FIG. 21, and FIG. 29 is a cross-sectional view taken along the line N6-N6' of FIG. 21.

Referring to FIGS. 22 to 29 in addition to FIG. 21, the partition walls BP1 and BP2 may have a shape in which they extend in the first direction DR1 but may have different widths measured in the second direction DR2. Any one of the partition walls BP1 and BP2 may be disposed across sub-pixels SPXn neighboring each other in the second direction DR2. For example, the partition walls BP1 and BP2 may include a first partition wall BP1 disposed in each sub-pixel SPXn and second partition walls BP2 disposed across different sub-pixels SPXn.

The first partition wall BP1 is disposed at a central portion of the emission area EMA, and the second partition walls BP2 are disposed to be spaced apart from the first partition wall BP1 with the first partition wall BP1 therebetween. The first partition walls BP1 and the second partition walls BP2 may be alternately disposed along the second direction DR2. The light emitting elements ED may be disposed between the first partition wall BP1 and the second partition walls BP2 that are spaced apart from each other.

The first partition wall BP1 and the second partition wall BP2 may have the same length in the first direction DR1 but may have different widths measured in the second direction DR2. Portions of the bank layer BNL extending in the first direction DR1 may overlap the second partition walls BP2 in the thickness direction. The first partition wall BP1 may be disposed to overlap a first electrode RME1, and the second partition walls BP2 may be disposed to overlap electrode extension parts RM_B of a second electrode RME2 and the bank layer BNL.

The first partition wall BP1 and the second partition wall BP2 may have the same length in the first direction DR1 but may have different widths measured in the second direction DR2. Portions of the bank layer BNL extending in the first direction DR1 may overlap the second partition walls BP2 in the thickness direction. The partition walls BP1 and BP2 may be disposed in an island-shaped pattern in the entirety of the display area DPA.

The electrodes RME include a first electrode RME1 disposed at a central portion of each sub-pixel SPXn and a second electrode RME2 disposed across the different sub-pixels SPXn. The first electrode RME1 and the second electrode RME2 may have a shape in which they substantially extend in the first direction DR1, but portions of the first electrode RME1 and the second electrode RME2 disposed in the emission area EMA may have different shapes.

The first electrode RME1 may be disposed at the center of the sub-pixel SPXn, and a portion of the first electrode RME1 disposed in the emission area EMA may be disposed on the first partition wall BP1. The first electrode RME1 may extend in the first direction DR1 from a first sub-area SA1 at the upper side of the emission area EMA and may extend to a second sub-area SA2 at the lower side of the emission area EMA. The first electrode RME1 may have a shape in which a width thereof measured in the second direction DR2 varies depending on its position, and at least a portion of the first electrode RME1 overlapping the first partition wall BP1 in the emission area EMA may have a greater width than the first partition wall BP1.

The second electrode RME2 may include a portion extending in the first direction DR1 and a portion having a width that increases in the vicinity of the emission area EMA. According to an embodiment, the second electrode RME2 may include an electrode stem part RM_S extending in the first direction DR1 and an electrode extension part RM_B connected to and extending from the electrode stem part RM_S and having a greater width than the electrode stem part RM_S in the second direction DR2.

The electrode stem parts RM_S may be disposed to overlap portions of the bank layer BNL extending in the first direction DR1, and may be disposed on one sides of the sub-areas SA1 and SA2 in the second direction DR2. The electrode stem parts RM_S of the second electrode RME2 may be disposed between the first sub-areas SA1 and between the second sub-areas SA2 of the sub-pixels SPXn adjacent to each other in the second direction DR2. The electrode stem parts RM_S may be disposed between the sub-areas SA1 and SA2 adjacent to each other in the second direction DR2, and portions thereof may protrude to the sub-areas SA1 and SA2.

The electrode extension parts RM_B may be disposed on both sides of the center of the sub-pixel SPXn in the second direction DR2 and may be disposed on the second partition walls BP2. The second electrode RME2 may have a shape in which a width thereof in the second direction DR increases at a portion where a portion of the bank layer BNL extending in the first direction DR1 and a portion of the bank layer BNL extending in the second direction DR2 cross each other. The electrode extension part RM_B may be disposed across the emission areas EMA of the sub-pixels SPXn adjacent to each other in the second direction DR2 and may be disposed to overlap an area between the sub-pixels SPXn. The electrode extension part RM_B may overlap a portion disposed between the adjacent sub-pixels SPXn, in the portion of the bank layer BNL extending in the first direction DR1.

A width of the first electrode RME1 measured in the second direction DR2 may be greater than a width of the electrode stem part RM_S of the second electrode RME2 but may be smaller than a width of the electrode extension part RM_B of the second electrode RME2. The first electrode RME1 may have a greater width than the first partition wall BP1 and may overlap both sides of the first partition wall BP1. The electrode stem parts RM_S of the second electrode RME2 may have a relatively small width to be disposed between the sub-areas SA1 and SA2, while the electrode extension part RM_B of the second electrode RME2 may have a greater width than the first electrode RME1. The first electrode RME1 and the second electrode RME2 may be disposed to cover both sides of the first and second partition walls BP1 and BP2 in the second direction DR2, respectively. An interval between the first and second partition walls BP1 and BP2 may be greater than an interval between the first and second electrodes RME1 and RME2. According to an embodiment, a maximum width of the electrode extension part RM_B may be greater than a width of the second partition wall BP2 and may be greater than a width of the portion of the bank layer BNL extending in the first direction DR1.

The electrode extension part RM_B of the second electrode RME2 may be disposed to cover the second partition wall BP2 and may be disposed across the different sub-pixels SPXn like the second partition wall BP2. The first electrode RME1 may be disposed to correspond to any one sub-pixel SPXn, while the electrode extension part RM_B of the second electrode RME2 may be disposed across adjacent sub-pixels SPXn. The sub-pixels SPXn adjacent to each other in the second direction DR2 may share the electrode extension part RM_B of the second electrode RME2 with each other.

The electrode extension part RM_B of the second electrode RME2 may be disposed to cover a portion between the emission areas EMA of the adjacent sub-pixels SPXn. According to an embodiment, the second electrode RME2 may have an electrode hole (e.g., an electrode opening) RMH formed in the electrode extension part RM_B. The electrode extension part RM_B is disposed to cover the second partition wall BP2, and thus, a discharge path for a gas discharged by layers disposed below the second electrode RME2 is formed in processes of manufacturing the display device 10.

The first electrode RME1 may be in contact with a first conductive pattern CDP1 of a third conductive layer through a first electrode contact hole CTD at a portion thereof overlapping a portion of the bank layer BNL extending in the second direction DR2. The second electrode RME2 may be in contact with a second conductive pattern CDP2 of the third conductive layer through a second electrode contact hole CTS at the electrode stem part RM_S. The first electrode RME1 may be disposed to overlap a first contact hole CT1 at a portion thereof disposed in the first sub-area SA1, and the second electrode RME2 may include a portion protruding from the electrode stem part RM_S in the second direction DR2 to be disposed in the first sub-area SA1 and may overlap a second contact hole CT2 at the protruding portion.

The first electrode RME1 may be disposed up to separation parts ROP1 and ROP2 of the sub-areas SA1 and SA2, while the second electrode RME2 may not be separated at the sub-areas SA1 and SA2. One second electrode RME2 may extend in the first direction DR1 and may have a shape in which a width thereof increases in the vicinity of the emission area EMA of each sub-pixel SPXn.

According to an embodiment, the display device 10 may include a line connection electrode EP disposed in the first sub-area SA1 and disposed between the first electrodes RME1 of the different sub-pixels SPXn. The line connection electrode EP is not disposed in the second sub-area SA2, and the first electrodes RME1 of the different sub-pixels SPXn adjacent to each other in the first direction DR1 may be spaced apart from each other at the second sub-area SA2. In a sub-pixel SPXn illustrated in FIG. 22 from among the sub-pixels SPXn, the first sub-area SA1 in which the line connection electrode EP is disposed may be disposed at the upper side of the emission area EMA and the second sub-area SA2 may be disposed at the lower side of the emission area EMA. On the other hand, in a sub-pixel SPXn adjacent to the sub-pixel SPXn illustrated in FIG. 22 in the first direction DR1, the first sub-area SA1 in which the line connection electrode EP is disposed may be disposed on the lower side of the emission area EMA and the second sub-area SA2 may be disposed on the upper side of the emission area EMA.

The first electrode RME1 may be spaced apart from the line connection electrode EP with a first separation part ROP1 interposed therebetween in the first sub-area SA1. Two first separation parts ROP1 may be disposed in the first sub-area SA1, and the line connection electrode EP may be spaced apart from the first electrode RME1 with the first separation part ROP1 interposed therebetween. In the second sub-area SA2, one second separation part ROP2 may be disposed, and different first electrodes RME1 may be spaced apart from each other in the first direction DR1.

The line connection electrode EP may be connected to a third conductive pattern CDP3 of the third conductive layer through a third electrode contact hole CTA penetrating through the via layer VIA. The first electrode RME1 may be formed in a state in which it is connected to the line connection electrode EP, and an electrical signal may be applied from the first voltage line VL1 to the first electrode RME1 through the line connection electrode EP to align the light emitting elements ED. In a process of aligning the light emitting elements ED, signals may be applied to the first voltage line VL1 and the second voltage line VL2 and transferred to the first electrode RME1 and the second electrode RME2, respectively.

The second electrode contact hole CTS may have a relative arrangement different from that of a third electrode contact hole CTA, to be described later. The second electrode contact hole CTS may be disposed in the second sub-area SA2, and the third electrode contact hole CTA may be disposed in the first sub-area SA1. The second electrode contact hole CTS and the third electrode contact hole CTA expose upper surfaces of different conductive patterns CDP2 and CDP3, respectively, and positions of the second electrode contact hole CTS and the third electrode contact hole CTA may be determined accordingly.

The bank layer BNL may surround, in a plan view, the emission area EMA and a plurality of sub-areas SA1 and SA2, similar to the above-described embodiment.

The light emitting elements ED may be disposed on different electrodes RME between different partition walls BP1 and BP2. The light emitting elements ED may include first light emitting elements ED1 having ends disposed on the first electrode RME1 and the electrode extension part RM_B of the second electrode RME2, respectively, and second light emitting elements ED2 having ends disposed on the first electrode RME1 and an electrode extension part RM_B of the other second electrode RME2, respectively. The first light emitting elements ED1 may be disposed on the right side with respect to the first electrode RME1, and the second light emitting elements ED2 may be disposed on the left side with respect to the first electrode RME1.

The connection electrodes CNE: CNE1, CNE2, and CNE3 may include a first connection electrode CNE1, a second connection electrode CNE2, and a third connection electrode CNE3.

The first connection electrode CNE1 may extend in the first direction DR1 and may be disposed on the first electrode RME1. A portion of the first connection electrode CNE1 disposed on the first partition wall BP1 may overlap the first electrode RME1, and the first connection electrode CNE1 may extend from such a portion in the first direction DR1 to be disposed up to the first sub-area SA1 beyond the bank layer BNL. The first connection electrode CNE1 may be in contact with the first electrode RME1 through the first contact hole CT1 in the first sub-area SA1.

The second connection electrode CNE2 may extend in the first direction DR1 and may be disposed on the second electrode RME2. A portion of the second connection electrode CNE2 disposed on the second partition wall BP2 may overlap the electrode extension part RM_B of the second electrode RME2, and the second connection electrode CNE2 may extend from such a portion in the first direction DR1 to be disposed up to the first sub-area SA1 beyond the bank layer BNL. The second connection electrode CNE2 may be in contact with the second electrode RME2 through the second contact hole CT2 in the first sub-area SA1.

The third connection electrode CNE3 may include a first extension part CN_E1, a second extension part CN_E2, and a first connection part CN_B1. The first extension part CN_E1 is disposed on the second electrode extension part RM_B of the second electrode RME2 while facing the first connection electrode CNE1 in the emission area EMA, and the second extension part CN_E2 is disposed on the first electrode RME1 while facing the second connection electrode CNE2 in the emission area EMA.

The first insulating layer PAS1 may be disposed in the entirety of the display area DPA and may be disposed on the via layer VIA and the plurality of electrodes RME.

According to an embodiment, the first insulating layer PAS1 may include a plurality of separation openings and a plurality of contact holes CT1 and CT2. The first insulating layer PAS1 may include the plurality of separation openings formed to correspond to the separation parts ROP1 and ROP2 of the sub-areas SA1 and SA2 and the plurality of contacts holes CT1 and CT2 formed in portions at where the connection electrodes CNE and the electrodes RME are connected to each other. A description of these components is substantially the same as that of the above-described embodiments. However, in the display device 10 according to this embodiment, the first insulating layer PAS1 may include two separation openings disposed in the first sub-area SA1 and one separation opening disposed in the second sub-area SA2 to correspond to two first separation parts ROP1 disposed in the first sub-area SA1 and one second separation part ROP2 disposed in the second sub-area SA2, respectively.

The second insulating layer PAS2 may be disposed on the plurality of light emitting elements ED, the first insulating layer PAS1, and the bank layer BNL. According to an embodiment, the second insulating layer PAS2 may have a plurality of openings OP2, OP3_1, OP3_2, and OP4 and a plurality of contact holes CT1 and CT2.

The second insulating layer PAS2 may include second openings OP2 and third openings OP3_1 and OP3_2 disposed on the electrodes RME, overlapping the electrodes RME, and exposing one end of the light emitting elements ED, and fourth openings OP4 that overlap the electrodes RME but do not overlap the light emitting elements ED. The openings OP2, OP3_1, OP3_2, and OP4 in the second insulating layer PAS2 may extend in the first direction DR1 and may be spaced apart from and face each other in the first direction DR1 or the second direction DR2. The openings OP2, OP3_1, OP3_2, and OP4 may partially overlap sides of the electrodes RME and the partition walls BP1 and BP2 extending in the first direction DR1, and the second openings OP2 and the third openings OP3_1 and OP3_2 may also partially overlap the light emitting element ED disposed on the electrodes RME spaced apart from each other in the second direction DR2.

The second openings OP2 may be disposed to overlap the first electrode RME1 or the electrode extension part RM_B of any one of the second electrodes RME2, respectively. The second openings OP2 may be disposed to overlap the extension parts CN_E1 and CN_E2 of the third connection electrode CNE3, and may be positioned to correspond to an arrangement of the extension parts CN_E1 and CN_E2. One of the second openings OP2 may overlap the first partition wall BP1 and a left side of the first electrode RME1, and the other of the second openings OP2 may overlap the second partition wall BP2 and a left side of the second electrode RME2.

The third openings OP3_1 and OP3_2 may include a first sub-opening OP3_1 and a second sub-opening OP3_2. The first sub-opening OP3_1 is disposed between the second openings OP2, and the second sub-opening OP3_2 may face the second opening OP2 overlapping the first electrode RME1 in the second direction DR2. The first sub-opening OP3_1 may overlap the first partition wall BP1 and a right side of the first electrode RME1, and the second sub-opening OP3_2 may overlap the second partition wall BP2 and a right side of the second electrode RME2. In an embodiment, the second sub-opening OP3_2 may have a greater width than the first sub-opening OP3_1 in the second direction DR2 and may partially overlap the bank layer BNL. The second sub-opening OP3_2 may be an area in which light emitted from the light emitting elements ED is emitted, similar to the fourth opening OP4.

The fourth opening OP4 may be spaced apart from the second opening OP2 overlapping the second electrode RME2 in the second direction DR2 from among the second openings OP2. The fourth opening OP4 may be disposed to overlap the same electrode RME as the second opening OP2 overlaps, but in which the light emitting elements ED are not disposed, and may partially overlap the bank layer BNL.

The second openings OP2 and the third openings OP3_1 and OP3_2 may partially overlap the light emitting elements ED and expose ends of the light emitting elements ED, respectively. The second openings OP2 and the third openings OP3_1 and OP3_2 may be disposed to overlap the connection electrodes CNE, and the connection electrodes CNE may be in contact with the light emitting elements ED exposed by the second openings OP2 and the third openings OP3_1 and OP3_2.

For example, the second opening OP2 disposed on the first electrode RME1 may be disposed to overlap first ends of the second light emitting elements ED2, and the second opening OP2 disposed on the second electrode RME2 may be disposed to overlap second ends of the first light emitting elements ED1. The third connection electrode CNE3 may be in contact with any one ends of the first light emitting elements ED1 and the second light emitting elements ED2 overlapping the second openings OP2.

The first sub-opening OP3_1 may overlap first ends of the first light emitting elements ED1, and the first connection electrode CNE1 may be in contact with the first ends of the first light emitting elements ED1. The second sub-opening OP3_2 may overlap second ends of the second light emitting elements ED2, and the second connection electrode CNE2 may be in contact with the second ends of the second light emitting elements ED2.

The second insulating layer PAS2 may have the first contact hole CT1 disposed in the first sub-area SA1 and disposed to overlap the first electrode RME1 and the second contact hole CT2 disposed in the first sub-area SA1 and disposed to overlap the second electrode RME2. The contact holes CT1 and CT2 may penetrate through the second insulating layer PAS2 in addition to the first insulating layer PAS1. The contact holes CT1 and CT2 may expose portions of upper surfaces of the electrodes RME disposed therebelow, respectively.

The third insulating layer PAS3 is disposed on the connection electrodes of the second connection electrode layer and the second insulating layer PAS2. The third insulating layer PAS3 may be entirely disposed on the second insulating layer PAS2 to cover the third connection electrode CNE3, and the first connection electrode CNE1 and the second connection electrode CNE2 may be disposed on the third insulating layer PAS3.

According to an embodiment, the third insulating layer PAS3 may have a plurality of openings OP3_1, OP3_2, and OP4 and a plurality of contact holes CT1 and CT2. The third insulating layer PAS3 may include a first sub-opening OP3_1 and a second sub-opening OP3_2 overlapping the electrodes RME and exposing one end of the light emitting elements ED and a plurality of fourth openings OP4 that overlap the electrodes RME but do not overlap the light emitting elements ED. A description of these openings is the same as that described above.

Figure 30:
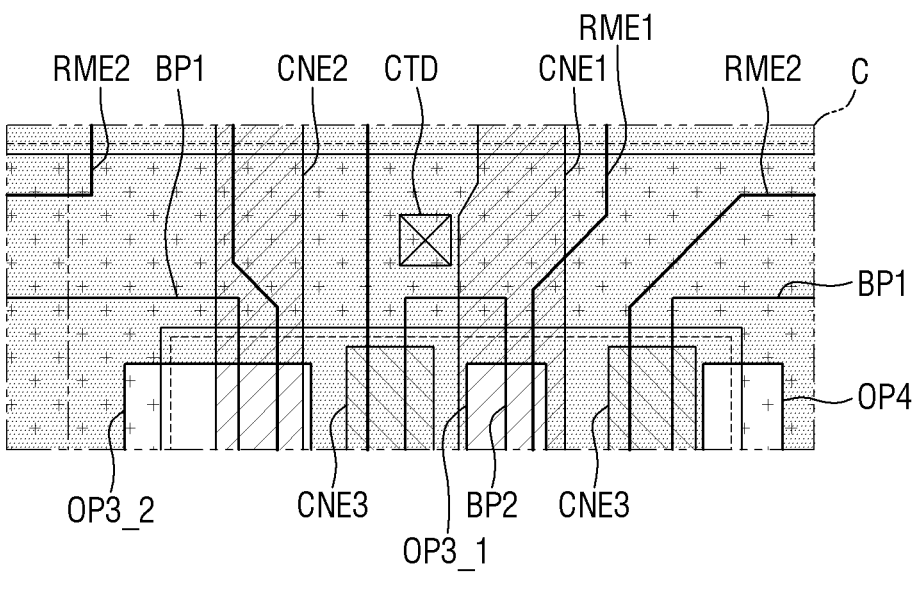
FIG. 30 is a plan view illustrating a third insulating layer and connection electrodes disposed in the portion C of FIG. 21.
Figure 30:
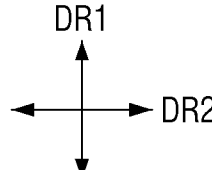

FIG. 30 is a plan view illustrating a third insulating layer and connection electrodes disposed in the portion C of FIG. 21. Referring to FIG. 30, similar to the above-described embodiments, some connection electrodes CNE in the sub-pixel SPXn may have a shape in which widths thereof are varied. For example, in the display device 10, the first connection electrode CNE1 and the second extension part CN_E2 of the third connection electrode CNE3, which are connection electrodes CNE disposed relatively inside in the sub-pixel SPXn, may have a shape in which widths thereof are partially varied. The first connection electrode CNE1 may include a first portion P1 having a relatively small width at the lower side of the emission area EMA and a second portion P2 having a greater width than the first portion P1 at the upper side of the emission area EMA. The second portion P2 of the first connection electrode CNE1 may be disposed beyond the bank layer BNL and, thus, may have the greater width than the first portion P1 as described above.

The second extension part CN_E2 of the third connection electrode CNE3 may include a first portion P1 having a relatively small width at the upper side of the emission area EMA and a second portion P2 having a greater width than the first portion P1 at the lower side of the emission area EMA. The second portion P2 of the second extension part CN_E2 of the third connection electrode CNE3 may be disposed beyond the bank layer BNL and, thus, may have the greater width than the first portion P1 as described above.

In an embodiment, portions of the first connection electrode CNE1 and the second extension part CN_E2 of the third connection electrode CNE3 of which the widths are changed may have a symmetrical structure. For example, one side facing different connection electrodes of both sides of the first portions P1 and the second portions P2 of the first connection electrode CNE1 and the second extension part CN_E2 of the third connection electrode CNE3 may be parallel to each other. On the other hand, the other side of the first connection electrode CNE1 and the second extension part CN_E2 of the third connection electrode CNE3 facing each other may not extend in the first direction DR1 and may have a shape in which they are partially bent. The first portion P1 of the first connection electrode CNE1 may be adjacent to the second portion P2 of the second extension part CN_E2 of the third connection electrode CNE3 in the second direction DR2, and the second portion P2 of the connection electrode CNE1 may be adjacent to the first portion P1 of the second extension part CN_E2 of the third connection electrode CNE3 in the second direction DR2.

In an embodiment, widths of both side portions, in the first direction DR1, of the openings OP2, OP3_1, and OP3_2 overlapping the connection electrodes CNE may be constant, but some of the connection electrodes CNE may have a shape in which widths thereof are varied. In the display device 10, even though the widths of the openings OP2, OP3_1, and OP3_2 are not necessarily varied, the widths of the connection electrodes CNE may be varied according to positions of the connection electrodes CNE and, thus, disconnections of the connection electrodes CNE due to steps formed by the openings OP2, OP3_1, and OP3_2 may be prevented or mitigated.

Figure 31:
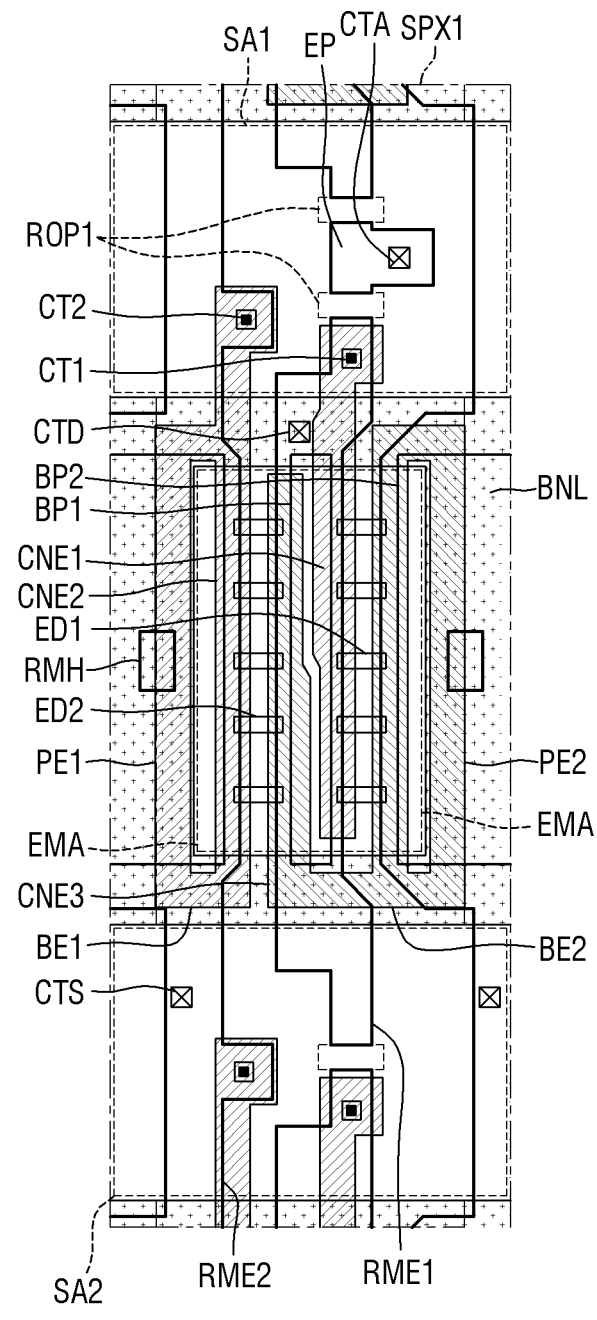
FIG. 31 is a plan view of one sub-pixel of a display device according to another embodiment.
Figure 31:
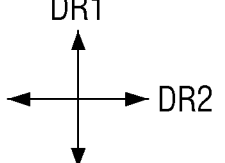

FIG. 31 is a plan view of one sub-pixel of a display device according to another embodiment.

Referring to FIG. 31, in a display device 10, some of the connection electrodes CNE may further include bypass parts PE1 and PE2 and bridge part BE1 and BE2 disposed on the bank layer BNL. The embodiment is different from an embodiment shown in FIG. 22 in that the second connection electrode CNE2 and the third connection electrode CNE3 further include the bypass parts PE1 and PE2 and the bridge parts BE1 and BE2, respectively, similar to the embodiment shown in FIG. 17. Hereinafter, an overlapping description will be omitted or simplified, and contents different from those described above will be primarily described.

The first connection electrode CNE1 and the second extension part CN_E2 of the third connection electrode CNE3 may have a shape in which widths thereof are varied, similar to the embodiment shown in FIG. 26, and may have structures for preventing disconnection defects of the connection electrodes CNE. In some embodiments, the second connection electrode CNE2 and the first extension part CN_E1 of the third connection electrode CNE3 may include the bypass parts PE1 and PE2 and the bridge parts BE1 and BE2 disposed on the bank layer BNL to prevent disconnection defects.

For example, the second connection electrode CNE2 may include a first bypass part PE1 and a first bridge part BE1 that are disposed on the bank layer BNL, in addition to a part disposed in the emission area EMA and in contact with the light emitting elements ED or a main part. The first bypass part PE1 may be disposed to be spaced apart from the main part of the second connection electrode CNE2 in the second direction DR2 and to extend in the first direction DR1 on the bank layer BNL. The first bridge part BE1 may extend in the second direction DR2 to connect the main part and the first bypass part PE1 of the second connection electrode CNE2 to each other. The main part, the first bypass part PE1, and the first bridge part BE1 of the second connection electrode CNE2 may be integrally formed with each other. Similarly, the third connection electrode CNE3 may include a second bypass part PE2 spaced apart from the first extension part CN_E1 in the second direction DR2 and a second bridge part BE2 connecting the first extension part CN_E1 and the second bypass part PE2 to each other.

Figure 32:
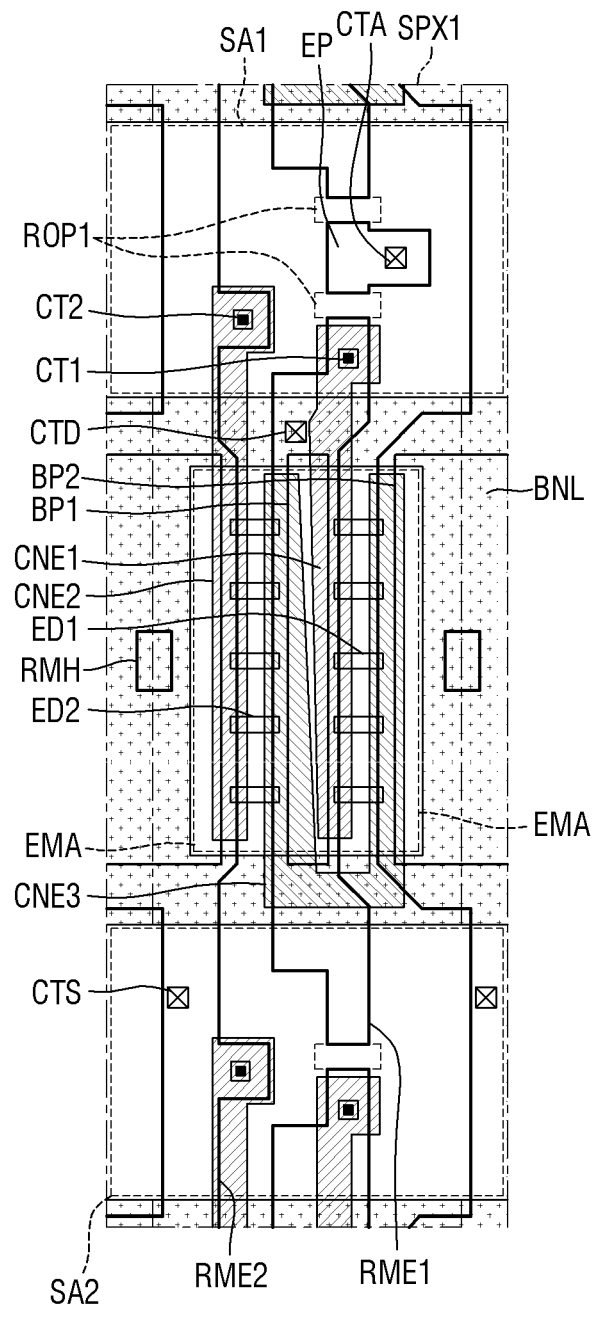
FIG. 32 is a plan view of one sub-pixel of a display device according to another embodiment.
Figure 32:
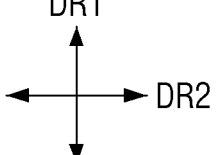

FIG. 32 is a plan view of one sub-pixel of a display device according to another embodiment.

Referring to FIG. 32, in a display device 10, widths of the first connection electrode CNE1 and the second extension part CN_E2 of the third connection electrode CNE3 may be gradually varied. In the above-described embodiments, the connection electrodes including the first portions P1 and the second portions P2 from among the connection electrodes CNE may have a shape in which sides thereof are bent at portions where the first portions P1 and the second portions P2 are in contact with each other. The connection electrode CNE including the first portion P1 and the second portion P2 may have a substantially constant width in the first portion P1 and the second portion P2.

However, a shape of the connection electrode CNE is not limited thereto. In another embodiment, shown in FIG. 32, the first connection electrode CNE1 and the second extension part CN_E2 of the third connection electrode CNE3 may have widths that are gradually varied while including first portions P1 having a relatively small width and second portions P2 having a relatively great width.

Figure 33:
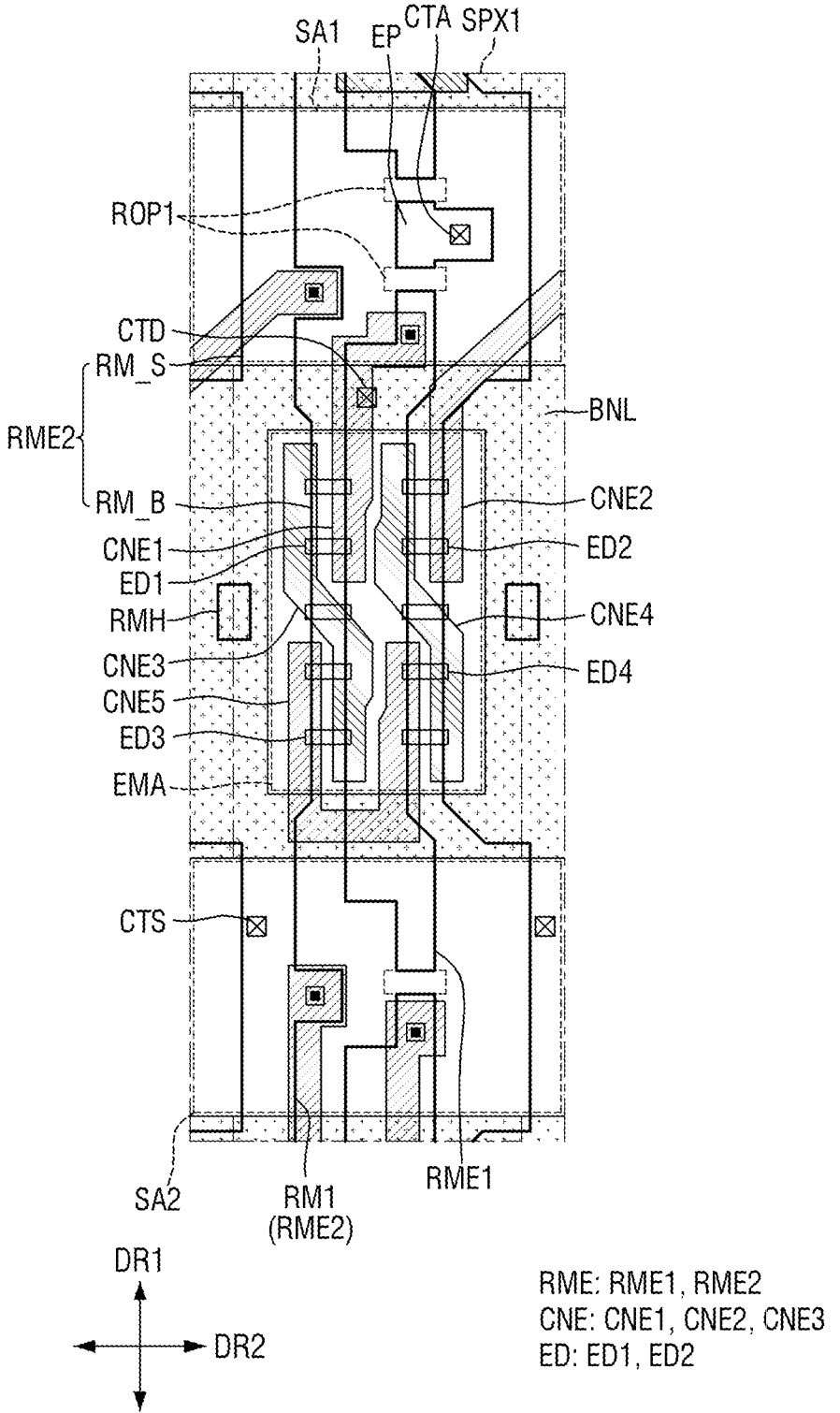
FIG. 33 is a plan view of one sub-pixel of a display device according to another embodiment.

FIG. 33 is a plan view of one sub-pixel of a display device according to another embodiment.

Referring to FIG. 33, in a display device 10 according to another embodiment, electrodes RME may have a structure similar to that of the embodiment shown in FIG. 21, but the connection electrodes CNE may have a structure similar to that of the embodiment shown in FIG. 6. The display device 10 may include a third connection electrode CNE3 disposed across a left electrode of the second electrodes RME2 and the first electrode RME1, a fourth connection electrode CNE4 disposed across the first electrode RME1 and a right electrode of the second electrodes RME2, and a fifth connection electrode CNE5 disposed across the first electrode RME1 and the left electrode of the second electrodes RME2, in addition to a first connection electrode CNE1 disposed on the first electrode RME1 and a second connection electrode CNE2 disposed on the right electrode of the second electrodes RME2.

The first connection electrode CNE1 and the second connection electrode CNE2 may be disposed at the upper side of the emission area EMA and be disposed across the emission area EMA and the first sub-area SA1. The first connection electrode CNE1 may extend in the first direction DR1 and may be in contact with the first electrode RME1, and the second connection electrode CNE2 may extend in the first direction DR1 and be bent in a diagonal direction and contact the second electrode RME2 at a protrusion part (e.g., a protrusion or protruding part) of the electrode stem part RM_S of the second electrode RME2.

The third connection electrode CNE3 and the fourth connection electrode CNE4 may have a shape in which they substantially extend in the first direction DR1 but may have a shape in which they are partially bent. Similar to the embodiment shown in FIG. 6, the third connection electrode CNE3 may include a first extension part facing the first connection electrode CNE1 in the second direction DR2 and a second extension part spaced apart from the first connection electrode CNE1 in the first direction DR1. The fourth connection electrode CNE4 may include a third extension part facing the second connection electrode CNE2 in the second direction DR2 and a fourth extension part spaced apart from second connection electrode CNE2 in the first direction DR1.

The fifth connection electrode CNE5 may have a shape in which it surrounds, in a plan view, the second extension part of the third connection electrode CNE3. Similar to the embodiment shown in FIG. 6, the fifth connection electrode CNE5 may include a fifth extension part spaced apart from the first extension part of the third connection electrode CNE3 in the first direction DR1 and a sixth extension part disposed between the third connection electrode CNE3 and the fourth connection electrode CNE4.

The light emitting elements ED may include first light emitting elements ED1 disposed on the first electrode RME1 and the left second electrode RME2 and in contact with the first connection electrode CNE1 and the third connection electrode CNE3 and second light emitting elements ED2 disposed on the first electrode RME1 and the right second electrode RME2 and in contact with the second connection electrode CNE2 and the fourth connection electrode CNE4. The light emitting elements ED may further include third light emitting elements ED3 disposed on the first electrode RME1 and the left second electrode RME2 and in contact with the third connection electrode CNE3 and the fifth connection electrode CNE5 and fourth light emitting elements ED4 disposed on the first electrode RME1 and the right second electrode RME2 and in contact with the fourth connection electrode CNE4 and the fifth connection electrode CNE5.

A plurality of connection electrodes CNE may have a shape in which widths thereof are partially varied. For example, each of the first connection electrode CNE1 and the sixth extension part of the fifth connection electrode CNE5 may include a first portion and a second portion having a greater width than the first portion. The first portion of each of the first connection electrode CNE1 and the sixth extension part of the fifth connection electrode CNE5 may be disposed at a center portion of the emission area EMA, and the second portion of each of the first connection electrode CNE1 and the sixth extension part of the fifth connection electrode CNE5 may be disposed across the emission area EMA and the bank layer BNL. An arrangement of the first portion and the second portion of each of the first connection electrode CNE1 and the sixth extension part of the fifth connection electrode CNE5 may be similar to that of the second connection electrode CNE2 and the fifth extension part CN_E5 of the fifth connection electrode CNE5 in the embodiment shown in FIG. 6.

Each of the second extension part of the third connection electrode CNE3 and the third extension part of the fourth connection electrode CNE4 may also include a first portion and a second portion having a greater width than the first portion. The first portion of each of the second extension part of the third connection electrode CNE3 and the third extension part of the fourth connection electrode CNE4 may be disposed adjacent to the bank layer BNL, and the second portion of each of the second extension part of the third connection electrode CNE3 and the third extension part of the fourth connection electrode CNE4 may be more adjacent to the center of the emission area EMA. An arrangement of the first portion and the second portion of each of the second extension part of the third connection electrode CNE3 and the third extension part of the fourth connection electrode CNE4 may be similar to that of the first extension part CN_E1 of the third connection electrode CNE3 and the fourth extension part CN_E4 of the fourth connection electrode CNE4 in the embodiment shown in FIG. 18.

The display device 10 may include a greater number of connection electrodes CNE to connect the light emitting elements ED1, ED2, ED3, and ED4 to each other in series. In addition, some of the connection electrodes CNE may have a shape in which widths are varied to mitigate or prevent disconnection defects of the connection electrodes CNE.

Figure 34:
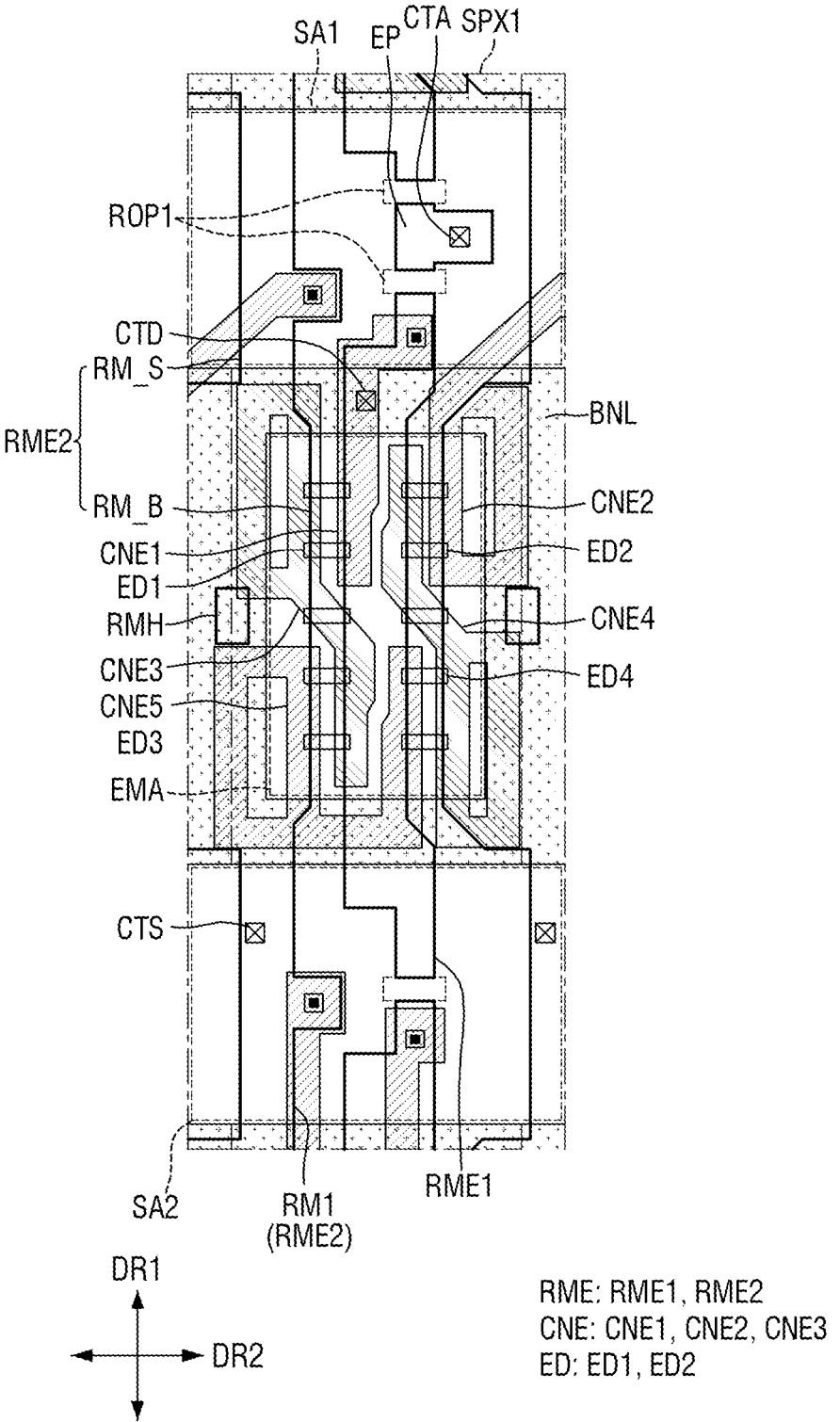
FIG. 34 is a plan view of one sub-pixel of a display device according to another embodiment.

FIG. 34 is a plan view of one sub-pixel of a display device according to another embodiment.

Referring to FIG. 34, in a display device 10, some of the connection electrodes CNE may further include bypass parts disposed on the bank layer BNL. The embodiment shown in FIG. 34 may combine features of the embodiment shown in FIG. 33 and the embodiment shown in FIG. 17. Thus, a detailed description thereof will be omitted.

In concluding the detailed description, those skilled in the art will appreciate that many variations and modifications can be made to the embodiments described herein without substantially departing from the teachings of the disclosure. Therefore, the embodiments of the disclosure described herein are to be used and understood in a generic and descriptive sense and not for purposes of limitation.

What is claimed is:

1. A display device comprising:
a plurality of electrodes extending in a first direction and spaced apart from each other in a second direction;
a first insulating layer on the plurality of electrodes;
a plurality of light emitting elements on the plurality of electrodes in an emission area;
a bank layer extending around a periphery of the emission area;
a second insulating layer on the first insulating layer and the light emitting elements and having a plurality of openings partially overlapping the plurality of electrodes and the light emitting elements in the emission area; and
a plurality of connection electrodes on at least some of the plurality of electrodes, contacting the light emitting elements, and partially overlapping the openings,
wherein a first opening from among the openings extends in the first direction and has a first side portion in the first direction and a second side portion on an opposite side to the first side portion, the second side portion having a greater width than the first side portion,
wherein a first connection electrode overlapping the first opening from among the plurality of connection electrodes has:
a first portion overlapping the first opening; and
a second portion having a greater width than the first portion, and
wherein a portion of the second portion of the first connection electrode does not overlap the first opening.

2. The display device of claim 1, wherein the second portion of the first connection electrode partially overlaps the first side portion of the first opening.

3. The display device of claim 2, wherein one sides of the first side portion and the second side portion of the first opening in the second direction are parallel to each other, and
wherein the other sides of the first side portion and the second side portion opposite to the one sides are not parallel to each other.

4. The display device of claim 2, wherein the first side portion of the first opening is nearer to the bank layer than the second side portion is, and wherein the second portion of the first connection electrode is partially on the bank layer.

5. The display device of claim 2, wherein a second opening from among the openings extends in the first direction and has a first side portion in the first direction and a second side portion on an opposite side to the first side portion and having a smaller width than the first side portion, wherein a second connection electrode overlapping the second opening from among the plurality of connection electrodes has:

a first portion overlapping the second opening; and a second portion having a greater width than the first portion, and wherein a portion of the second portion of the second connection electrode does not overlap the second opening.

6. The display device of claim 5, wherein the first side portion of the second opening is nearer to the bank layer than the second side portion is, and wherein the second portion of the second connection electrode is not partially on the bank layer.

7. The display device of claim 5, further comprising a third insulating layer on the second insulating layer and some of the connection electrodes, wherein the third insulating layer has the first opening and extends over the second opening.

8. The display device of claim 5, wherein the plurality of electrodes comprise a first electrode, a second electrode spaced apart from the first electrode in the second direction, a third electrode between the first electrode and the second electrode, and a fourth electrode spaced apart from the second electrode in the second direction, wherein a third opening from among the openings overlaps the first electrode and the light emitting elements and is spaced apart from the first opening in the second direction, wherein a fourth opening from among the openings overlaps the first electrode and is spaced apart from the first opening in the second direction, and wherein the fourth opening does not overlap the light emitting elements.

9. The display device of claim 1, wherein the plurality of electrodes comprise a first electrode, a second electrode spaced apart from the first electrode in the second direction, a third electrode between the first electrode and the second electrode, and a fourth electrode spaced apart from the second electrode in the second direction, and wherein the first opening partially overlaps each of the second electrode and the third electrode.

10. The display device of claim 9, wherein the light emitting elements comprise first light emitting elements on the first electrode and the third electrode and second light emitting elements on the second electrode and the fourth electrode, and wherein the first opening overlaps one end of the second light emitting elements.

11. The display device of claim 10, wherein the first connection electrode contacts the second light emitting elements.

12. The display device of claim 9, wherein a second connection electrode from among the connection electrodes is on the second electrode, a third connection electrode from among the connection electrodes is on the third electrode, a fourth connection electrode from among the connection electrodes is on the fourth electrode, and a fifth connection electrode from among the connection electrodes extends across the third electrode and the fourth electrode, and wherein the second connection electrode has the first portion and the second portion and overlaps the first opening.

13. The display device of claim 12, wherein the first connection electrode has a main part contacting the light emitting elements, a first bypass part spaced apart from the main part in the second direction, and a first bridge part connecting the main part and the first bypass part to each other.

14. The display device of claim 13, wherein each of the first bypass part and the first bridge part is on the bank layer.

* * * * *